United States Patent
Nakai et al.

(10) Patent No.: US 9,923,182 B2
(45) Date of Patent: Mar. 20, 2018

(54) SECONDARY CELL, SOLAR SECONDARY CELL, AND METHODS OF MAKING THOSE CELLS

(71) Applicant: Panasonic Corporation, Osaka (JP)

(72) Inventors: Miyuki Nakai, Osaka (JP); Satoshi Shibata, Osaka (JP); Emiko Igaki, Hyogo (JP); Hirofumi Fujita, Ehime (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 764 days.

(21) Appl. No.: 14/000,963

(22) PCT Filed: Feb. 15, 2013

(86) PCT No.: PCT/JP2013/000840
§ 371 (c)(1),
(2) Date: Aug. 22, 2013

(87) PCT Pub. No.: WO2014/013637
PCT Pub. Date: Jan. 23, 2014

(65) Prior Publication Data
US 2014/0113180 A1    Apr. 24, 2014

(30) Foreign Application Priority Data

Jul. 18, 2012 (JP) ................................ 2012-159223

(51) Int. Cl.
*H01M 10/052* (2010.01)
*H01M 10/0562* (2010.01)
(Continued)

(52) U.S. Cl.
CPC .... *H01M 2/202* (2013.01); *H01L 31/022433* (2013.01); *H01L 31/0504* (2013.01);
(Continued)

(58) Field of Classification Search
CPC .......... H01M 10/052; H01M 10/0562; H01M 10/0585; H01M 10/465; H01M 14/005; H01M 2/202
See application file for complete search history.

(56) References Cited

U.S. PATENT DOCUMENTS 5,707,756 A * 1/1998 Inoue .................. H01M 2/1235
429/57
2008/0179082 A1* 7/2008 Kinoshita ......... H01M 10/4257
174/255

FOREIGN PATENT DOCUMENTS

JP       08-330616 A       12/1996
JP      2005-174617   *    6/2005 ............ H01M 10/40
(Continued)

OTHER PUBLICATIONS

International Search Report for corresponding International Application No. PCT/JP2013/000840 dated May 21, 2013.
(Continued)

*Primary Examiner* — Barbara Gilliam
*Assistant Examiner* — Angela Martin
(74) *Attorney, Agent, or Firm* — Renner Otto Boisselle & Sklar, LLP

(57) ABSTRACT

An embodiment of the present disclosure provides a structure that contributes to increasing the capacity density. A secondary cell according to an embodiment of the present disclosure includes a plurality of periodic unit structures that are arranged on a first surface. Each of those periodic unit structures includes a positive electrode layer and a negative electrode layer, each of which projects away from the first surface, and a solid electrolyte interposed between the positive electrode and negative electrode layers.

18 Claims, 47 Drawing Sheets

(51) Int. Cl.
  *H01M 10/0585*  (2010.01)
  *H01M 2/20*  (2006.01)
  *H01M 10/46*  (2006.01)
  *H01M 14/00*  (2006.01)
  *H01L 31/0224*  (2006.01)
  *H01L 31/05*  (2014.01)

(52) U.S. Cl.
  CPC ..... *H01M 10/052* (2013.01); *H01M 10/0562* (2013.01); *H01M 10/0585* (2013.01); *H01M 10/465* (2013.01); *H01M 14/005* (2013.01); *Y02E 10/50* (2013.01); *Y02E 60/122* (2013.01); *Y02P 70/54* (2015.11)

(56) References Cited

FOREIGN PATENT DOCUMENTS

| | | | | |
|---|---|---|---|---|
| JP | 2005-174617 A | 6/2005 | | |
| JP | 2008-159399 A | 7/2008 | | |
| JP | 2010-205536 A | 9/2010 | | |
| JP | 2011-008976 A | 1/2011 | | |
| JP | 2012-069538 | * 4/2012 | ............ | H01L 31/04 |
| JP | 2012-069538 A | 4/2012 | | |
| WO | WO 2010/007579 A1 | 1/2010 | | |
| WO | WO 2012/081366 A1 | 6/2012 | | |

OTHER PUBLICATIONS

Form PCT/ISA/237 for corresponding International Application No. PCT/JP2013/000840 dated May 21, 2013 and partial English translation.

* cited by examiner

FIG.16
(a)
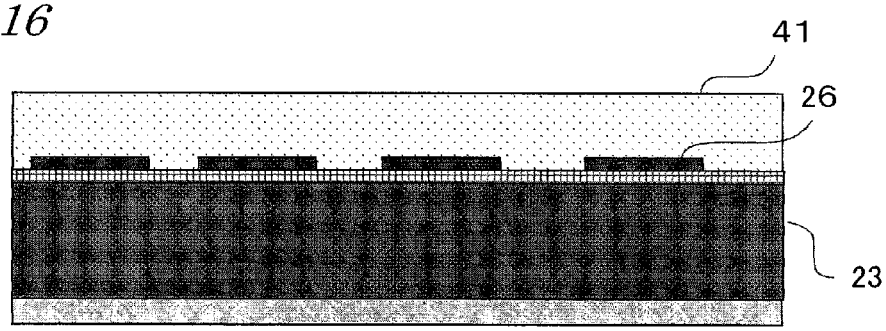
(b)
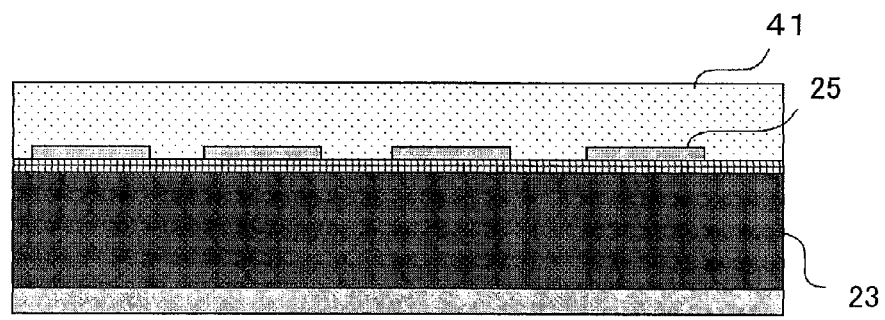
(c)
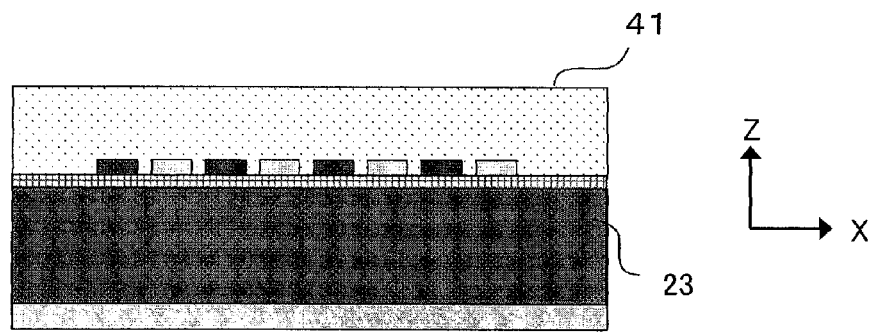

FIG.22
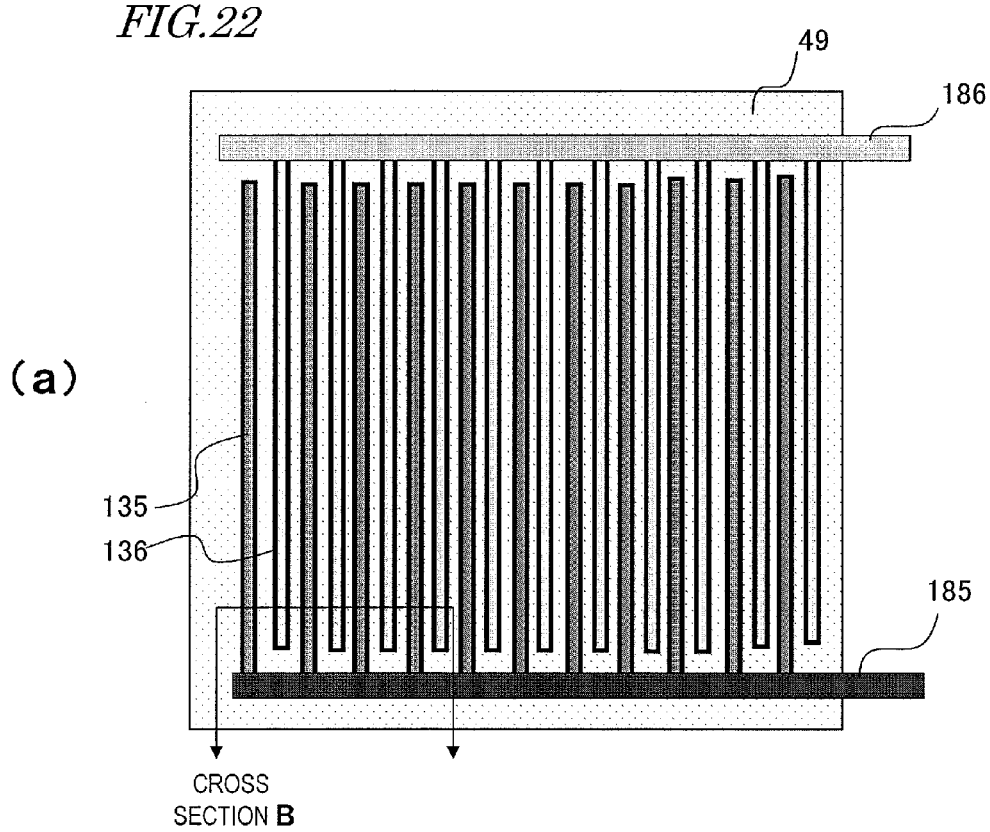
(a)
CROSS SECTION B
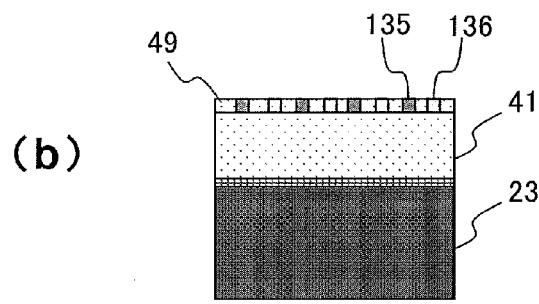
(b)

FIG.23
(a) 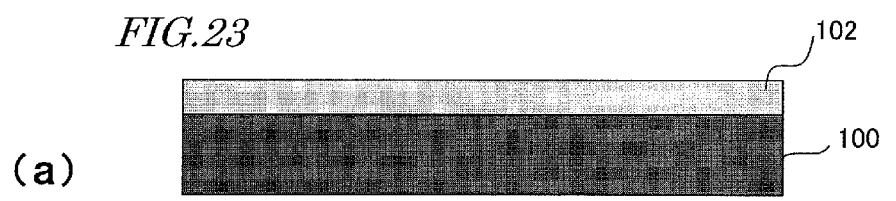
(b) 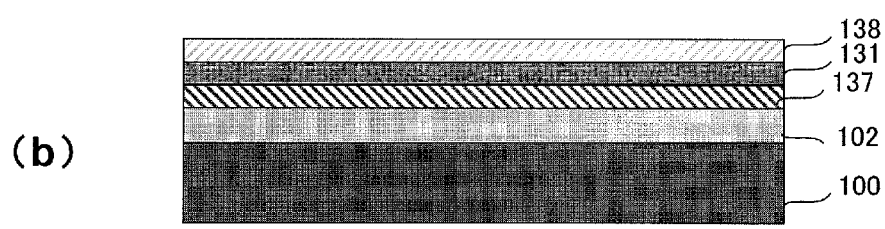
(c) 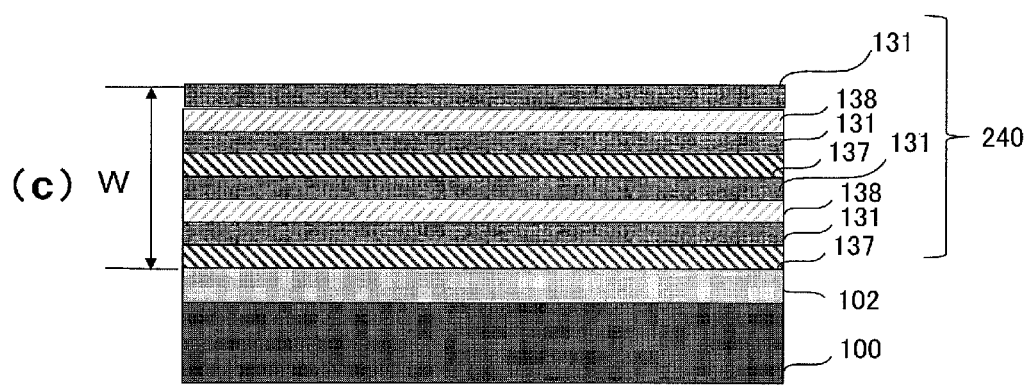
(d) 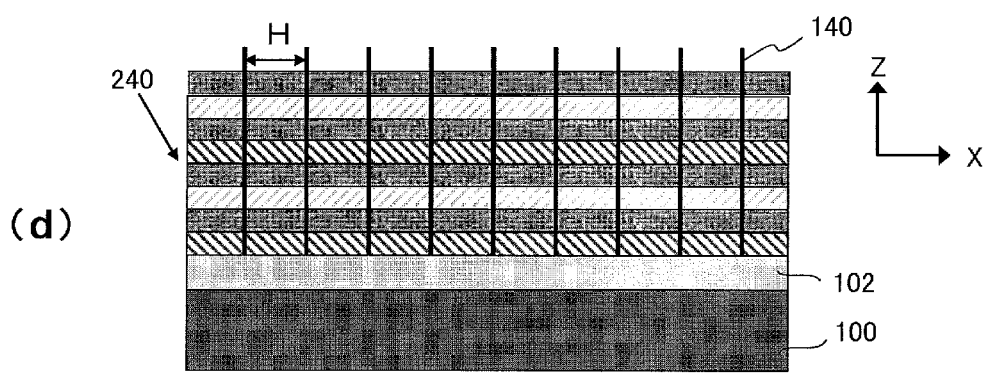

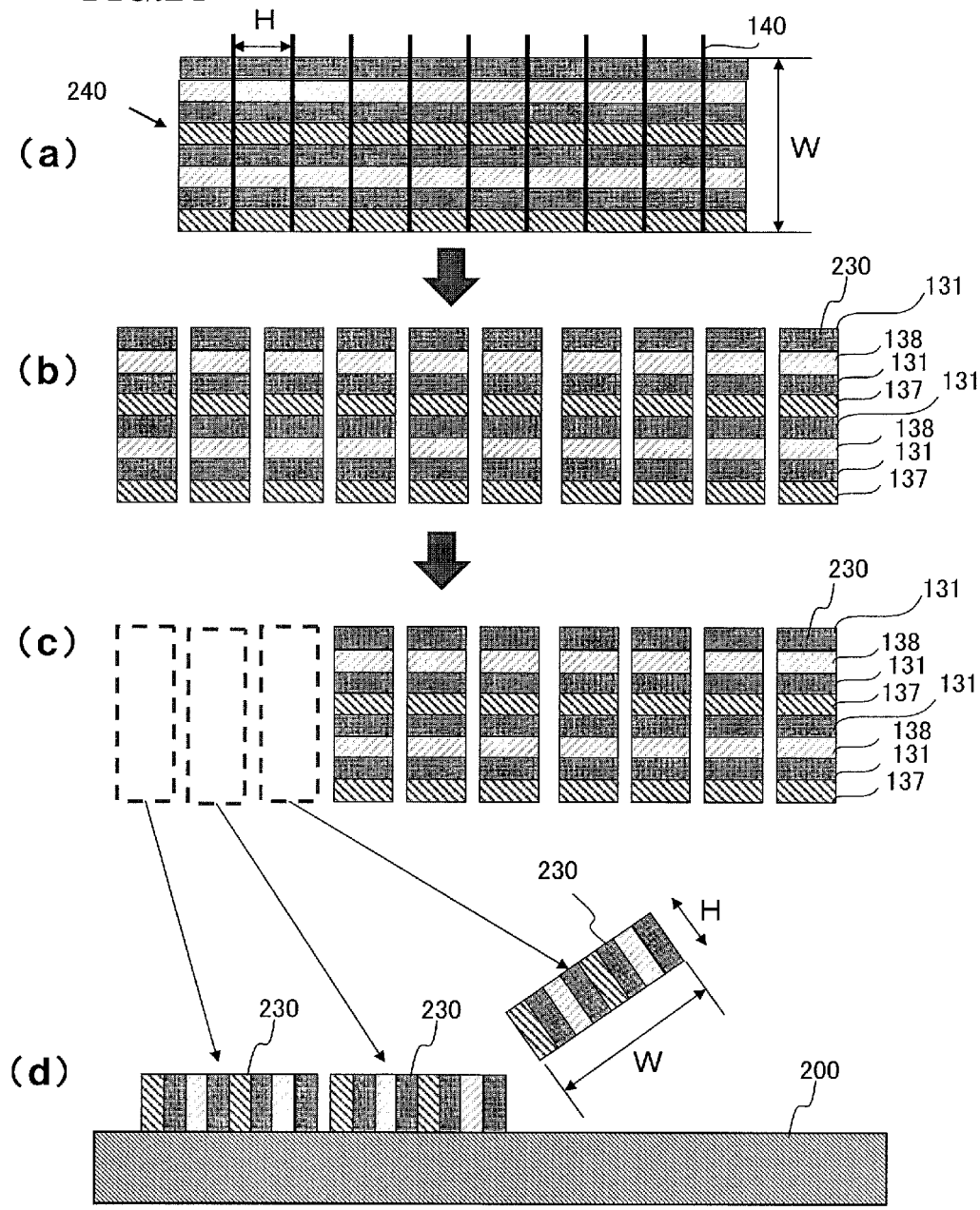

CROSS SECTION A

CROSS SECTION C

CROSS SECTION B

FIG.31
(a)
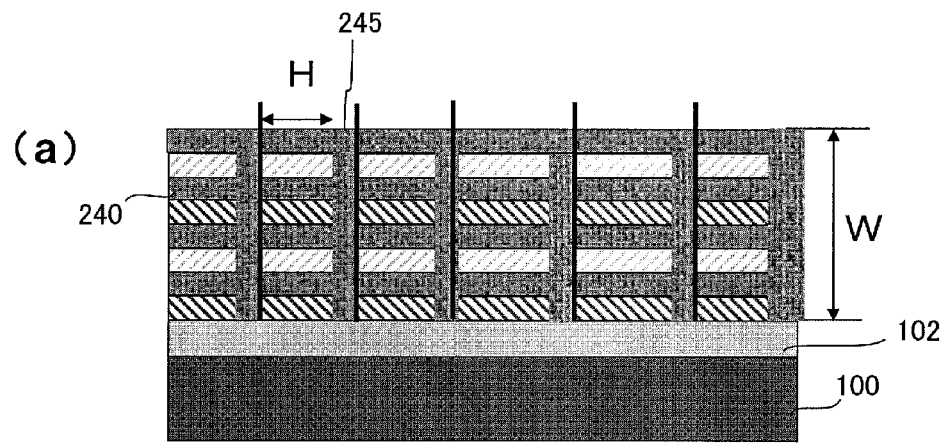
(b)
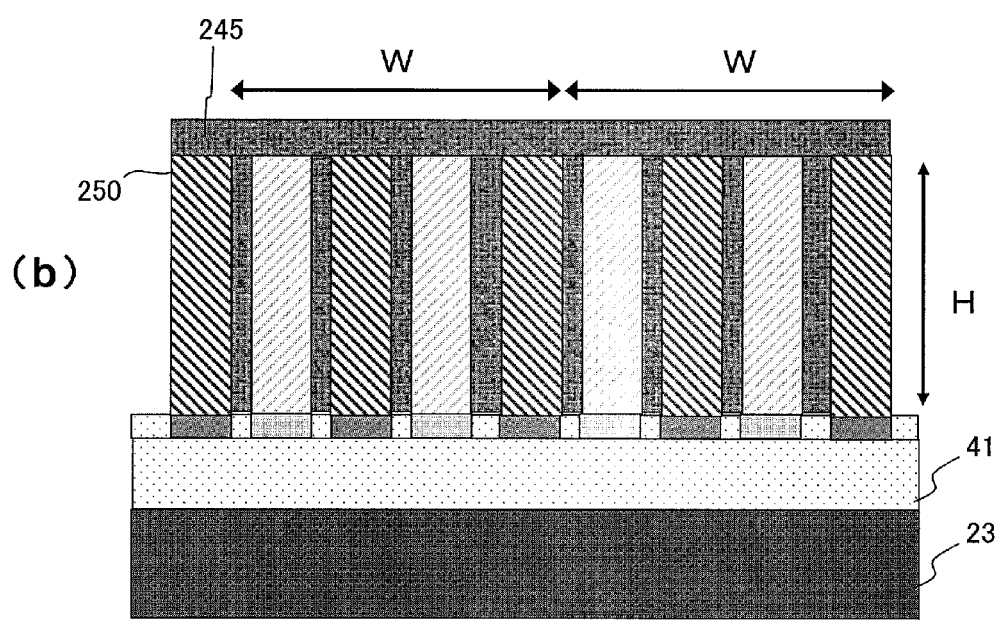

FIG.32
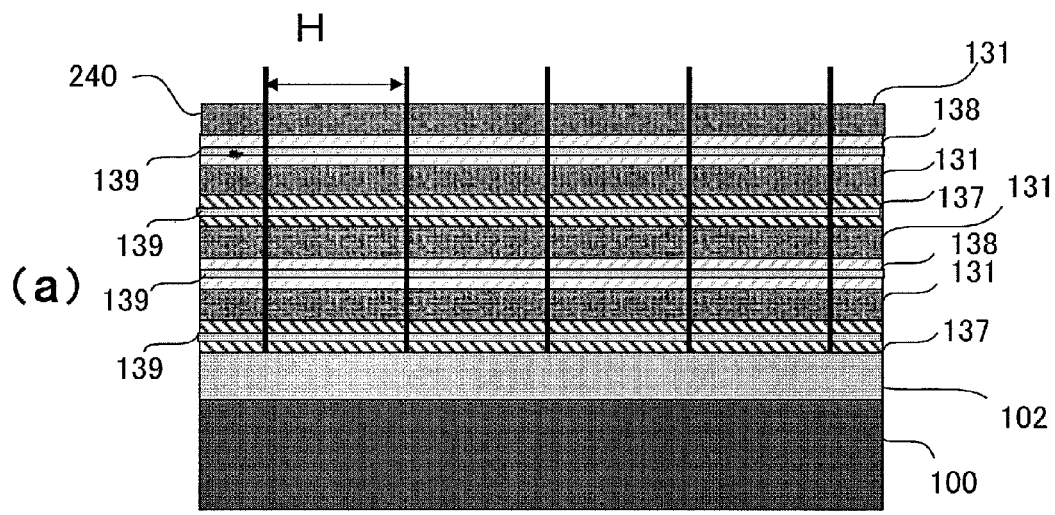
(a)
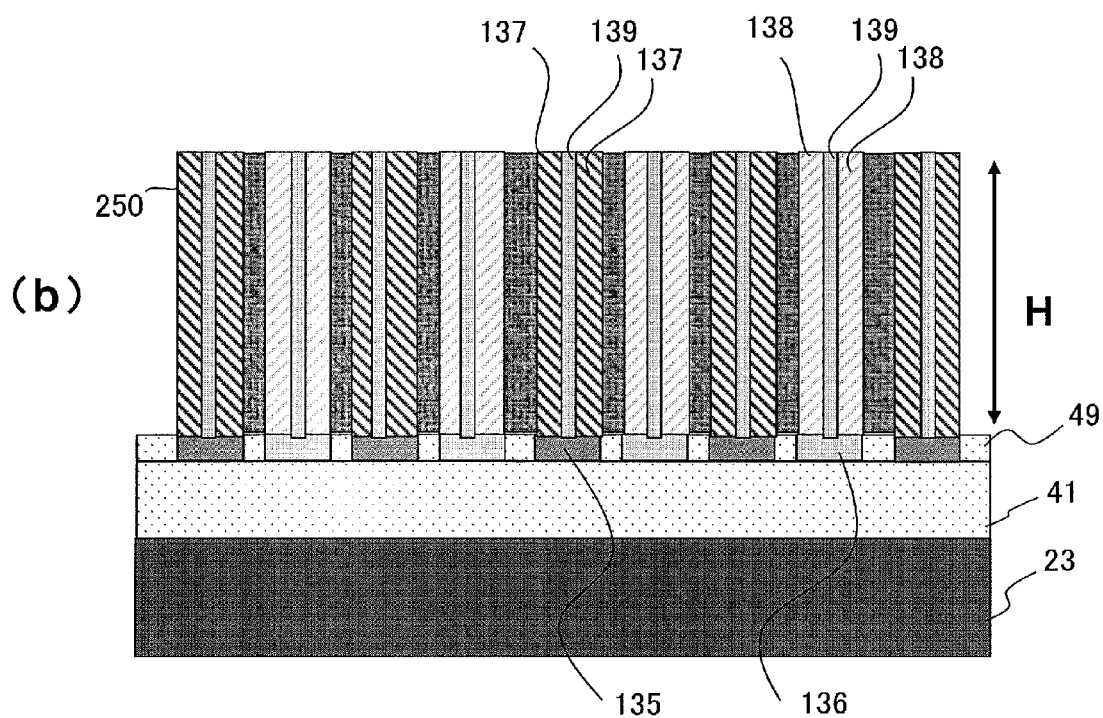
(b)

FIG.52
CROSS SECTION D1
(d1)
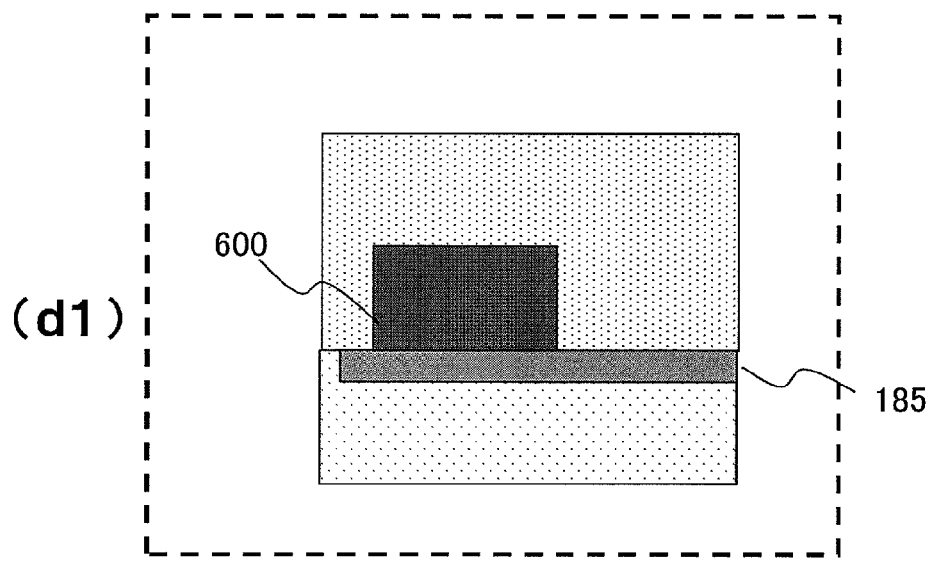
600
185
CROSS SECTION D2
(d2)
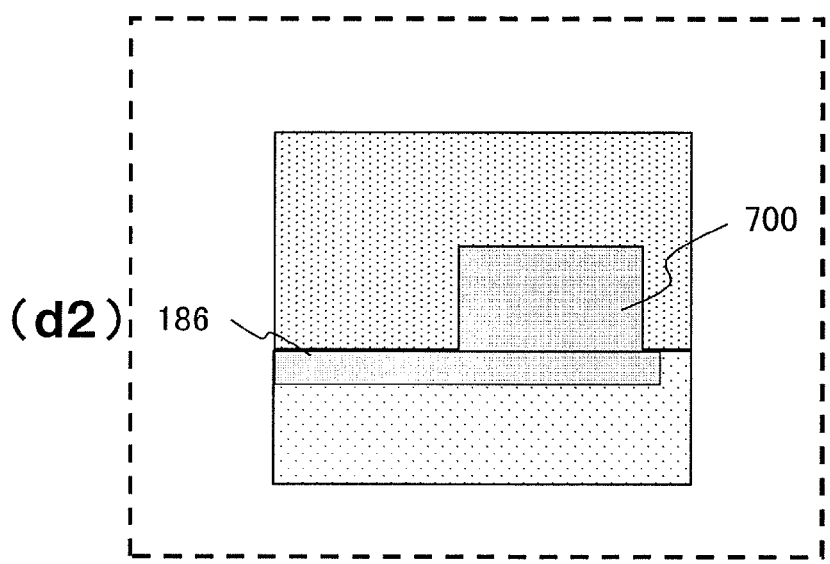
186
700

SECONDARY CELL, SOLAR SECONDARY CELL, AND METHODS OF MAKING THOSE CELLS

TECHNICAL FIELD

The present disclosure relates to a secondary cell (rechargeable battery), a solar secondary cell in which the secondary cell and a solar cell (photovoltaic cell) are combined together, and methods of making those cells.

BACKGROUND ART

Secondary cells which can be charged and discharged repeatedly are used extensively.

Meanwhile, solar cells which use the photovoltaic effect produced by a semiconductor substrate of silicon, for example, have been used very often as a photoelectric transducer that converts optical energy into electric power. Also well known are solar secondary cells in each of which a secondary cell that not only stores the output power of a solar cell but also releases the stored power and supplies it to various kinds of loads in order to use the output of the solar cell effectively and the solar cell are combined. Such a solar secondary cell is disclosed in Patent Document No. 1, for example.

To produce the photoelectric conversion as efficiently as possible, a solar cell is generally formed in the shape of a thin film. When a compact solar secondary cell is formed by combining such a solar cell and a secondary cell together, the secondary cell is arranged on the back surface opposite from the light incident side. As disclosed in Patent Document No. 1, the secondary cell is formed by stacking a positive electrode (cathode) layer, an electrolytic layer and a negative electrode (anode) layer in this order on the back surface of the solar cell.

Patent Document No. 2 discloses a solar cell.

CITATION LIST

Patent Literature

Patent Document No. 1: Japanese Laid-Open Patent Publication No. 2011-8976
Patent Document No. 2: Japanese Laid-Open Patent Publication No. 2012-69538

SUMMARY OF INVENTION

Technical Problem

There is a growing demand for secondary cells with increased capacity. A secondary cell with the configuration disclosed in Patent Document No. 1 can have its capacity increased by increasing the area of its positive electrode, electrolyte, and negative electrode layers. However, in the case of the secondary cell disclosed in Patent Document No. 1, even if the area of the positive electrode, electrolyte and negative electrode layers is increased, the capacity per unit area of the substrate (which will be referred to herein as "capacity density") does not rise. To raise the capacity density, the number of the positive electrode, electrolyte and negative electrode layers to be stacked on the substrate may be increased. However, it is difficult to increase the number significantly.

Embodiments of the present disclosure provide a configuration that contributes to increasing the capacity density.

Solution to Problem

A secondary cell according to an aspect of the present disclosure comprises: an electrical insulator with a first surface; first and second interconnect patterns which are arranged on the first surface of the electrical insulator; and a plurality of periodic unit structures which are arranged in a first direction along the first surface. Each of the plurality of periodic unit structures includes: a first electrode which projects away from the first surface and which is configured to either absorb or emit ions; a second electrode which projects away from the first surface and which is configured to either absorb or emit the ions; and a solid electrolyte which is interposed between the first and second electrodes and which conducts the ions. The secondary cell has a structure in which the first electrode, the solid electrolyte and the second electrode are stacked one upon the other in the first direction, and the first and second electrodes are electrically connected to the first and second interconnect patterns, respectively.

A method of making a secondary cell according to an aspect of the present disclosure includes: providing a substrate structure which includes first and second interconnect patterns on its surface; and forming a secondary cell body which is supported on the substrate structure. The secondary cell body includes a plurality of periodic unit structures which are arranged in a first direction along the first surface. Each of the plurality of periodic unit structures includes: a first electrode which projects away from the first surface and which is configured to either absorb or emit ions; a second electrode which projects away from the first surface and which is configured to either absorb or emit the ions; and a solid electrolyte which is interposed between the first and second electrodes and which conducts the ions. The secondary cell body has a structure in which the first electrode, the solid electrolyte and the second electrode are stacked one upon the other in the first direction, and the first and second electrodes are electrically connected to the first and second interconnect patterns, respectively.

A solar secondary cell according to an aspect of the present disclosure includes a solar cell and a secondary cell. The solar cell includes a first principal surface, a second principal surface, a semiconductor layer interposed between the first and second principal surfaces, and first and second electrode layers which are arranged on at least one of the first and second principal surfaces. The first principal surface functions as a light incident surface. The secondary cell has a plurality of periodic unit structures which are arranged along the second principal surface of the solar cell. Each of the plurality of periodic unit structures includes: a first electrode which projects away from the second principal surface and which is configured to either absorb or emit ions; a second electrode which projects away from the second principal surface and which is configured to either absorb or emit the ions; and a solid electrolyte which is interposed between the first and second electrodes and which conducts the ions. The secondary cell has a structure in which the first electrode, the solid electrolyte and the second electrode are stacked one upon the other in the first direction, and the first and second electrodes are respectively electrically connected to the first and second electrode layers of the solar cell.

A method of making a solar secondary cell according to an aspect of the present disclosure includes: providing a solar cell which includes a first principal surface, a second principal surface, a semiconductor layer interposed between the first and second principal surfaces, and first and second electrode layers which are arranged on at least one of the first and second principal surfaces, the first principal surface functioning as a light incident surface; and obtaining a secondary cell which is combined with the solar cell. The secondary cell includes a plurality of periodic unit structures which are arranged on a surface that is parallel to the second principal surface of the solar cell. Each of the plurality of periodic unit structures includes: a first electrode which is electrically connected to the first electrode layer of the solar cell and which projects away from the second principal surface of the solar cell; a second electrode which is electrically connected to the second electrode layer of the solar cell and which projects away from the second principal surface of the solar cell; and an electrolyte which is interposed between the first and second electrodes. The first and second electrodes face each other with a layer of the electrolyte interposed between themselves.

Advantageous Effects of Invention

Embodiments of the present disclosure provide a secondary cell which is configured to be configured to have an increased capacity density, a method of making such a secondary cell, a solar secondary cell in which such a secondary cell and a solar cell are combined, and a method of making such a solar secondary cell.

BRIEF DESCRIPTION OF DRAWINGS

FIGS. 16 (a), (b) and (c) are cross-sectional views as respectively viewed on the planes A, B and C shown in FIG. 13 to illustrate another step of the manufacturing process in progress.

FIG. 22 (a) is a plan view illustrating first current collectors 135 and second current collectors 136 which are arranged periodically on an insulating layer 49, and (b) is a cross-sectional view thereof as viewed on the plane B.

FIGS. 23 (a), (b), (c) and (d) are cross-sectional views illustrating respective process steps to fabricate a secondary cell according to the third embodiment.

FIGS. 24 (a), (b), (c) and (d) are cross-sectional views illustrating respective process steps to fabricate a secondary cell according to the third embodiment.

FIG. 31 (a) is a cross-sectional view illustrating another exemplary configuration for the multilayer structure 240 and (b) is a cross-sectional view illustrating a solar secondary cell including unit integrated bodies 250 that have been formed out of the multilayer structure 240.

FIG. 32 (a) is a cross-sectional view illustrating an exemplary configuration for a multilayer structure 240 according to a fourth embodiment of the present disclosure and (b) is a cross-sectional view illustrating a solar secondary cell including unit integrated bodies 250 that have been formed out of the multilayer structure 240.

FIGS. 52 (d1) and (d2) are cross-sectional views as respectively viewed on the planes D1 and D2 shown in FIG. 50.

DESCRIPTION OF EMBODIMENTS

Figure 1:
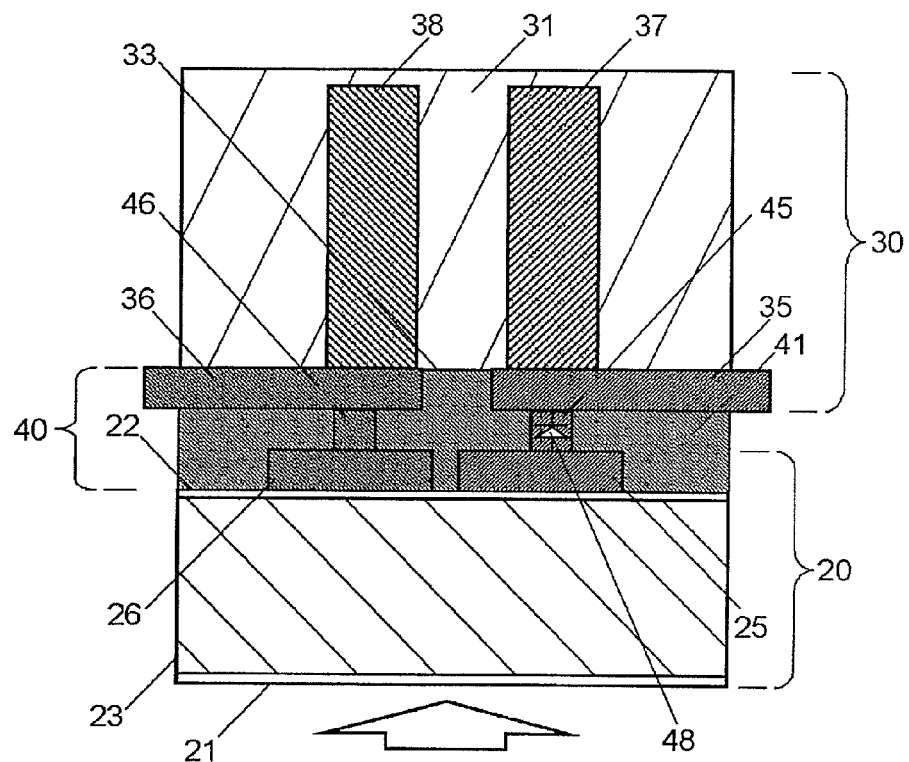
FIG. 1 A cross-sectional view of a solar secondary cell as a first embodiment of the present disclosure.

A secondary cell according to an exemplary embodiment of the present disclosure includes: an electrical insulator with a first surface; first and second interconnect patterns which are arranged on the first surface of the electrical insulator; and a plurality of periodic unit structures which are arranged in a first direction along the first surface. Each of the plurality of periodic unit structures includes a first electrode (positive electrode layer), a solid electrolyte, and a second electrode (negative electrode layer) which are stacked one upon the other in the first direction. The first electrode projects away from the first surface and is configured to either absorb or emit ions. The second electrode projects away from the first surface and is configured to either absorb or emit ions. The solid electrolyte is interposed between the first and second electrodes and conducts the ions. The first and second electrodes are electrically connected to the first and second interconnect patterns, respectively. By adopting such a configuration, the pair of electrodes included in each periodic unit structure can face each other in an increased area.

Such a secondary cell has a configuration that realizes a high capacity density, and can be used in a variety of forms.

Hereinafter, embodiments of a secondary cell according to the present disclosure will be described with reference to the accompanying drawings. In the following description, if there is any component having substantially the same function as its counterpart already mentioned earlier in the description of an embodiment, such a component will be identified by the same reference numeral as its counterpart's, and a detailed description thereof will be sometimes omitted herein. Also, the present disclosure is in no way limited to the specific embodiments to be described below.

To let the reader understand a secondary cell according to the present disclosure more fully, an example in which a secondary cell with a single "periodic unit structure" is combined with a solar cell will be described as a first embodiment. However, as can be seen easily from the description that follows, the number of the periodic unit structures just needs to be increased to raise the capacity. Also, a secondary cell according to the present disclosure does not always have to be used in combination with a solar cell.

Embodiment 1

FIG. 1 is a cross-sectional view of a solar secondary cell as a first embodiment of the present disclosure. Although not shown in FIG. 1, a sealing layer to seal this secondary cell 30 is provided outside of an electrolytic layer 31. This solar secondary cell includes a flat-plate solar cell 20 and a secondary cell 30. The solar cell 20 has a first principal surface 21 and a second principal surface 22, which is opposite from the first principal surface 21. A first positive electrode terminal 25 and a first negative electrode terminal 26 have been formed on the second principal surface 22, and respectively function as first and second electrode layers of the solar cell 20.

The secondary cell 30 has a counter surface 33 which faces the second principal surface 22 of the solar cell 20. The secondary cell 30 further includes a second positive electrode terminal 35, a second negative electrode terminal 36, a positive electrode layer 37, a negative electrode layer 38, and an electrolytic layer 31. The second positive electrode terminal 35 and second negative electrode terminal 36 have been formed on the counter surface 33. The positive electrode layer 37 is connected to the second positive electrode terminal 35 and the negative electrode layer 38 is connected to the second negative electrode terminal 36. The second positive electrode terminal 35 is electrically connected to the first positive electrode terminal 25. The second negative electrode terminal 36 is electrically connected to the first negative electrode terminal 26. The electrolytic layer 37 is interposed between the positive electrode layer 37 and the negative electrode layer 38. The stacking direction of the positive electrode layer 37 and the negative electrode layer 38 is parallel to the counter surface 33. Also, the electrolytic layer 31 may be exposed on the upper surface of the secondary cell 30 as shown in FIG. 1.

The positive electrode layer 37 projects away from the counter surface 33 and functions as a first electrode which can either absorb or emit ions. Likewise, the negative electrode layer 38 also projects away from the counter surface 33 and functions as a second electrode which can either absorb or emit ions. The electrolytic layer 31 is located between the positive electrode layer 37 and the negative electrode layer 38 and conducts the ions. The positive electrode layer 37, electrolytic layer 31 and negative electrode layer 38 have a structure in which those layers are stacked one upon the other parallel to the counter surface 33 (i.e., laterally in FIG. 1). Also, the positive electrode layer 37 and the negative electrode layer 38 are electrically connected to mutually different interconnect patterns. As will be described later, those interconnect patterns have such a configuration and function as to electrically connect the positive electrode layer 37 and negative electrode layer 38 of the secondary cell 30 to the first positive electrode terminal 25 and first negative electrode terminal 26, respectively, in the solar cell 20.

Next, the respective members will be described in detail. First of all, the solar cell 20 will be described with reference to FIG. 2, which is a plan view illustrating the first positive electrode terminal 25 and first negative electrode terminal 26 of the solar cell 20. In this embodiment, the solar cell 20 includes a flat-plate semiconductor substrate (or a semiconductor layer of silicon) 23, and the first positive electrode terminal 25 and the first negative electrode terminal 26 have both been formed on the second principal surface 22 of the semiconductor substrate 23. Although the first positive electrode terminal 25 and the first negative electrode terminal 26 have been formed on the same surface of the semiconductor substrate 23 in the solar cell 20 of this embodiment, the solar secondary cell according to the present disclosure does not have to have such a configuration. In other words, one of the first positive electrode terminal 25 and first negative electrode terminal 26 may be provided on the first principal surface 21 of the semiconductor substrate 23 and the other may be provided on the second principal surface 22 of the semiconductor substrate 23. If one of the first positive electrode terminal 25 and first negative electrode terminal 26 is provided on the first principal surface 21 of the semiconductor substrate 23, then a line which is electrically connected to that terminal may be provided on the second principal surface 22.

The semiconductor substrate 23 may be made of single crystalline Si, for example, and may have a thickness of several hundred µm. A silicon dioxide film has been deposited to a thickness of several ten nm on the first principal surface 21, and a silicon dioxide film has also been deposited to a thickness of 1 to 2 nm on the second principal surface 22. The silicon dioxide film on the second principal surface 22 suitably has a thickness of 1.5 nm or less. The reason is that if the silicon dioxide film were too thin, the material of the first positive electrode terminal 25 and first negative electrode terminal 26 would diffuse into the semiconductor substrate 23 to cause a decrease in the conversion efficiency of the solar cell 20. However, if the silicon dioxide film were too thick, then the resistance value would increase. The semiconductor that absorbs sunlight in this solar cell 20 does not have to be the semiconductor substrate 23, of which the rigidity and strength are high enough to make the substrate 23 stand by itself, but may also be a relatively thin semiconductor layer which is supported on another substrate.

In this embodiment, the first positive electrode terminal 25 and the first negative electrode terminal 26 are made of conductors with mutually different work functions. For example, the first positive electrode terminal 25 may be made of gold, nickel or any other suitable material, and the first negative electrode terminal 26 may be made of aluminum, titanium, vanadium or any other suitable material. Optionally, carbon, ITO or an alloy may also be used. It should be noted that these are just examples of materials for the first positive electrode terminal 25 and first negative electrode terminal 26 and any other materials may also be used as long as the conductor that makes the first positive electrode terminal 25 has a larger work function than the conductor that makes the first negative electrode terminal 26. Also, the bigger the difference in work function between the first positive electrode terminal 25 and the first negative electrode terminal 26, the greater the photovoltage of the solar cell 20 and the better. The first principal surface 21 serves as a light incident surface.

Figure 2:
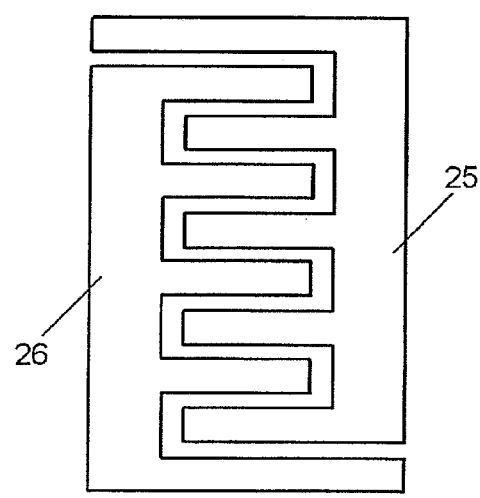
FIG. 2 A plan view illustrating the first positive electrode terminal and first negative electrode terminal of a solar cell in the solar secondary cell shown in FIG. 1.

As shown in FIG. 2, the first positive electrode terminal 25 and the first negative electrode terminal 26 each have a comb shape, and their comb tooth portions are fitted into each other. As a result, the first positive electrode terminal 25 and the first negative electrode terminal 26 face each other in an increased area. Also, the gap (i.e., the shortest distance) between the first positive electrode terminal 25 and the first negative electrode terminal 26 is set to be about 10 µm. In FIG. 2, each of the first positive electrode terminal 25 and the first negative electrode terminal 26 has five comb teeth. However, the number of their comb teeth is not particularly limited. The longer the portion in which the first positive electrode terminal 25 and the first negative electrode terminal 26 face each other, the larger the amount of current to flow and the better.

The first positive electrode terminal 25 and the first negative electrode terminal 26 are made of conductors with mutually different work functions. That is why when light enters this solar cell 20 through the first principal surface 21, photovoltage will be generated between the first positive electrode terminal 25 and the first negative electrode terminal 26. Such a basic configuration for a solar cell is disclosed in Patent Document No. 2, for example.

Next, the secondary cell 30 will be described. The positive electrode layer 37 includes a positive electrode active material, and may further include a conductive agent, a binding agent or an electrolytic component. The negative electrode layer 38 includes a negative electrode active material, and may further include a conductive agent, a binding agent or an electrolytic component. The electrolytic layer 31 may be a so-called "gel electrolyte" obtained by turning either an ionic conductive solid electrolyte or an electrolytic solution into gel with polymers.

As the positive electrode active material, a chalcogenide such as a metal oxide or a metal sulfide which is generally used in a secondary cell may be used. As the negative electrode active material, a chalcogenide such as a metal oxide or a metal sulfide which is charged and discharged at a lower potential than the positive electrode active material may be used. The negative electrode active material may be any material as long as the material has a lower operating potential than the positive electrode active material and may be lithium metal, a lithium alloy, or sodium metal, for example. If the negative electrode active material absorbs charge media such as lithium ions or sodium ions, a carbon material may also be used. An appropriate combination of a positive electrode active material and a negative electrode active material may be selected according to the photovoltage of the solar cell 20.

The positive electrode layer 37 and negative electrode layer 38 may have a height (i.e., length as measured vertically on the paper on which FIG. 1 is drawn) of several hundred μm, for example. The gap between the positive electrode layer 37 and the negative electrode layer 38 may be a few μm (e.g., 1 μm in this example). And the positive electrode layer 37 and negative electrode layer 38 may have a thickness (i.e., length as measured laterally on the paper on which FIG. 1 is drawn) of 100 nm to several ten μm (e.g., 1 μm in this example).

The positive electrode layer 37, the electrolytic layer 31 and the negative electrode layer 38 may be made by forming three sheets, each having a predetermined thickness, stacking those sheets one upon the other, and cutting the sheets into a predetermined size. In this manner, these power generating elements of the secondary cell can be obtained. Alternatively, the secondary cell 30 may also be made by forming the positive electrode layer 37, the electrolytic layer 31 and negative electrode layer 38 directly on an interconnecting portion 40 to be described later. A specific method of making this secondary cell 30 and other exemplary configurations will be described in detail later.

The materials (conductors) for the second positive electrode terminal 35 and the second negative electrode terminal 36 are not particularly limited unless the materials get corroded with the potentials of the positive electrode layer 37 and negative electrode layer 38 connected. The second positive electrode terminal 35 and second negative electrode terminal 36 may be formed by sputtering, for example, on the bottom of those functional elements of the secondary cell 30. Alternatively, after having been formed to form integral parts of the interconnecting portion 40, the second positive electrode terminal 35 and second negative electrode terminal 36 may also be bonded to those power generating elements as will be described later.

Next, the interconnecting portion 40 that connects the solar cell 20 and the secondary cell 30 together will be described. As shown in FIG. 1, the interconnecting portion 40 is interposed between the second principal surface 22 of the solar cell 20 and the counter surface 33 of the secondary cell 30.

The interconnecting portion 40 includes an interlayer dielectric film 41, a positive electrode connecting portion 45 and a negative electrode connecting portion 46. The interlayer dielectric film 41 bonds the first positive electrode terminal 25 and first negative electrode terminal 26 to the second positive electrode terminal 26 and second negative electrode terminal 36, respectively. The positive electrode connecting portion 45 connects the first and second positive electrode terminals 25 and 35 together. And the negative electrode connecting portion 46 connects the first and second negative electrode terminals 26 and 36 together. The positive electrode connecting portion 45 and the negative electrode connecting portion 46 are embedded in the interlayer dielectric film 41.

Respective parts that form the first positive electrode terminal 25, the first negative electrode terminal 26 and the interconnecting portion 40, and the second positive electrode terminal 35 and the second negative electrode terminal 36 may be made by sequentially depositing multiple layers by sputtering or a vapor phase process such as a CVD process.

As can be seen, the layer in which the first positive electrode terminal 25 and first negative electrode terminal 26 have been formed is different from the layer in which the second positive electrode terminal 35 and second negative electrode terminal 36 have been formed, and therefore, this electrode structure has multiple layers. In addition, according to this embodiment, the direction in which the positive electrode layer 37, the electrolytic layer 31 and the negative electrode layer 38 are stacked one upon the other is parallel to the counter surface 33. That is why the first and second positive electrode terminals 25 and 35 and the first and second negative electrode terminals 26 and 36 can be easily connected together without affecting other power generating elements of the solar cell 20 or secondary cell 30. As a result, the secondary cell 30 and the solar cell 20 can be connected together more easily. Consequently, the volume that should otherwise be left for connection can be used to increase the capacity of the cell. Also, if the positive electrode layer 37, the electrolytic layer 31 and the negative electrode layer 38 are extended either vertically on the paper on which FIG. 1 is drawn (i.e., perpendicularly to the counter surface 33) or in the direction going into the paper (in the depth direction), the capacity of the secondary cell 30 can be increased.

By connecting the solar cell 20 and the secondary cell 30 together via the interconnecting portion 40, these lines can be fixed and the solar cell 20 and the secondary cell 30 can be integrated together. However, the solar cell 20 and the secondary cell 30 can also be connected together by other means instead of the interconnecting portion 40. Even so, the first and second positive electrode terminals 25 and 35 and the first and second negative electrode terminals 26 and 36 can be easily connected together without affecting power generating and other functional elements including the solar cell 20 and the secondary cell 30.

It should be noted that unless light is incident, the solar cell 20 comes to have decreased photovoltage. That is why when the voltage of the secondary cell 30 exceeds the photovoltage of the solar cell 20, current flows from the secondary cell 30 into the solar cell 20. As a result, the power stored in the secondary cell 30 is consumed (i.e., discharged). That is why to prevent reverse current from flowing from the secondary cell 30 into the solar cell 20, a rectifying portion 48 may be formed in the positive electrode connecting portion 45 as shown in FIG. 1. The rectifying portion 48 can be formed either by changing the materials of the positive electrode connecting portion 45 while the positive electrode connecting portion 45 is being formed so as to produce a PN junction there or by producing a PN junction through doping. Alternatively, the rectifying portion may be provided for the negative electrode connecting portion 46 instead. Still alternatively, both of the positive electrode and negative electrode connecting portions 45 and 46 may be provided with the rectifying portion. That is to say, in order to prevent current from flowing from the secondary cell 30 into the solar cell 20, a first rectifying portion between the first and second positive electrode terminals 25 and/or a second rectifying portion between the first and second negative electrode terminals 26 and 36 may be provided.

Figure 3:
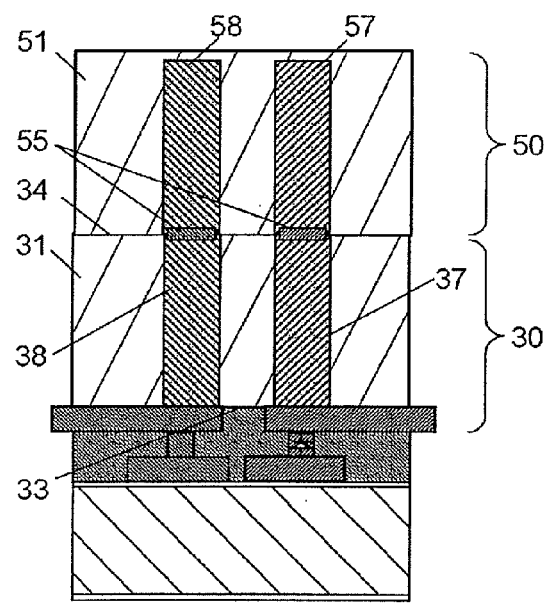
FIG. 3 A cross-sectional view illustrating another solar secondary cell according to the first embodiment of the present disclosure.

Next, a structure for increasing the capacity of the secondary cell will be described with reference to FIG. 3, which is a cross-sectional view illustrating another solar secondary cell according to this embodiment. In the configuration shown in FIG. 3, parallel connecting portions 55 which are connected to the positive electrode layer 37 and negative electrode layer 38 are exposed on an end face 34, which is opposite from the counter surface 33 in the secondary cell 30 of the solar secondary cell shown in FIG. 1, and another positive electrode layer 57 and another negative electrode layer 58 are connected to the parallel connecting portions 55. The positive electrode layer 57, the negative electrode layer 58 and an electrolytic layer 51 form a second secondary cell 50. The second secondary cell 50 is formed on the end face 34 of the secondary cell 30 which functions as a first secondary cell, and is connected in parallel to the secondary cell 30 on the end face 34. The direction in which the positive electrode layer 57, the negative electrode layer 58 and the electrolytic layer 51 are stacked one upon the other is also parallel to the counter surface 33. Since the direction in which the positive electrode layer 37, the negative electrode layer 38 and the electrolytic layer 31 are stacked one upon the other is parallel to the counter surface 33 as described above, the second secondary cell 50 can be easily connected in parallel on the end face 34 and the capacity can be increased.

Alternatively, by forming the electrolytic layer 51 between the secondary cell 30 and the second secondary cell 50, the secondary cell 30 and the second secondary cell 50 may also be connected in parallel in some area other than the end face 34 without using the parallel connecting portions 55. It should be noted that FIGS. 1 and 3 illustrate the structures of solar cells according to this embodiment just schematically and the ratio of the thicknesses or lengths of respective portions is not to scale and does not agree with the one shown in FIG. 2, either.

Embodiment 2

Figure 4:
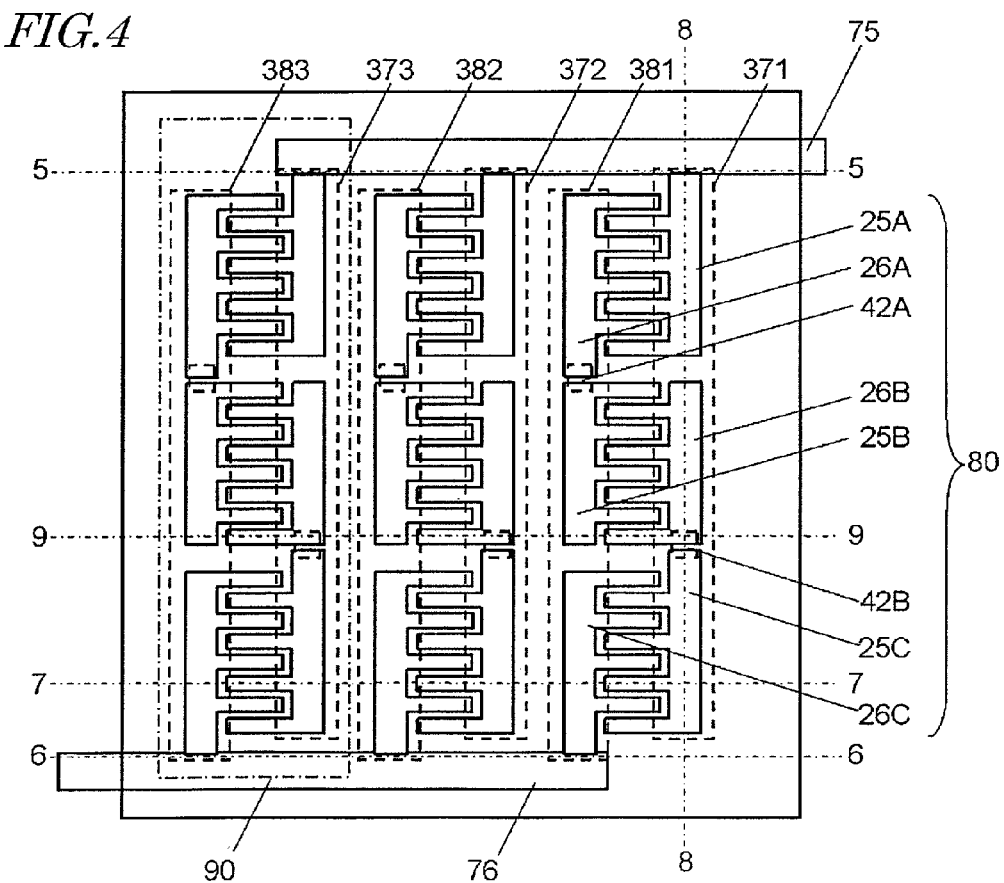
FIG. 4 A plan view illustrating a solar secondary cell according to a second embodiment of the present disclosure so that a portion of the solar secondary cell can be seen through from the second principal surface of the solar cell to the secondary cell.

Next, a structure in which a plurality of solar cells 20 according to the first embodiment are formed and connected together in series will be described as a second embodiment of the present disclosure. FIG. 4 is a plan view illustrating a solar secondary cell according to a second embodiment of the present disclosure so that a portion of the solar secondary cell can be seen through from the second principal surface of the solar cell to the secondary cell. FIGS. 5 through 9 are cross-sectional views of respective portions shown in FIG. 4. Specifically, FIGS. 5, 6, 7, 8 and 9 are cross-sectional views as respectively viewed on the planes 5-5, 6-6, 7-7, 8-8 and 9-9 shown in FIG. 4.

In general, a solar cell 20 usually has an photovoltage of 1 V or less, while an electronic device normally has a drive voltage of 1.2 V or more. That is why generally, a number of solar cells 20 are connected together in series and then connected to a secondary cell.

In the configuration shown in FIG. 4, a single solar cell is made up of a first positive electrode terminal 25A, a first negative electrode terminal 26A and the semiconductor substrate 23 shown in FIG. 1. Likewise, another solar cell is made up of a first positive electrode terminal 25B, a first negative electrode terminal 26B and the semiconductor substrate 23. And still another solar cell is made up of a first positive electrode terminal 25C, a first negative electrode terminal 26C and the semiconductor substrate 23. A series connecting portion 42A connects the first negative electrode terminal 26A and the first positive electrode terminal 25B together. A series connecting portion 42B connects the first negative electrode terminal 26B and the first positive electrode terminal 25C together. In this manner, three solar cells are connected together in series to form a series solar cell section 80. It should be noted that the number of cells to be connected together in series does not have to be three.

In this configuration, each of these three solar cells has a first principal surface and a second principal surface, which is opposite from the first principal surface and on which a first positive electrode terminal and a first negative electrode terminal have been formed, just like the solar cell 20 of the first embodiment. And those three solar cells are arranged so that their first principal surfaces are in the same plane, and are connected together in series, thereby forming a series solar cell section 80.

Figure 8:
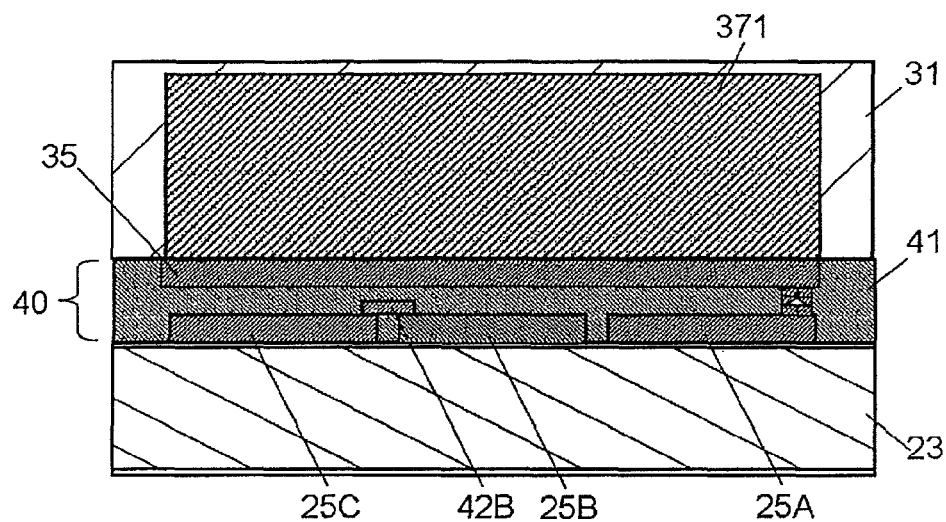
FIG. 8 A cross-sectional view of the solar secondary cell shown in FIG. 4 as viewed on the plane 8-8.

As in FIG. 1, the positive electrode layer 371, negative electrode layer 381, electrolytic layer 31, second positive electrode terminal 35 and second negative electrode terminal 36 form a secondary cell. And the secondary cell thus formed and the three solar cells are connected together, thereby forming a single solar secondary cell module 90. Specifically, only the first positive electrode terminal 25A of the positive electrode terminal solar cell which is located at the series end on the positive electrode side of the series solar cell section 80 is electrically connected to the second positive electrode terminal 35 as shown in FIG. 8. And although not shown, only the first negative electrode terminal 26C of the negative electrode terminal solar cell which is located at the series end on the negative electrode side of the series solar cell section 80 is electrically connected to the second negative electrode terminal 36. By adopting such a configuration, a secondary cell with a voltage corresponding to the drive voltage of a device and a series solar cell section 80 that can supply power to the secondary cell can be connected together.

As shown in FIGS. 5 through 9, an interconnecting portion 40 is suitably formed as in the first embodiment described above. The interconnecting portion 40 is interposed between the second principal surface of the three solar cells and the counter surface of the secondary cell. The interconnecting portion 40 includes an interlayer dielectric film 41, positive electrode connecting portions 45, negative electrode connecting portions 46 and series connecting portions 42A, 42B. The interlayer dielectric film 41 bonds the first positive electrode terminals 25A, 25B and 25C of the respective solar cells to second positive electrode terminal 35 and also bonds the first negative electrode terminals 26A, 26B and 26C to the second negative electrode terminal 36. The positive electrode connecting portion 45 connects the first positive electrode terminals 25A of the solar cell located at the series end on the positive electrode side of the series solar cell section 80 to the second positive electrode terminal 35 and is embedded in the interlayer dielectric film 41. The negative electrode connecting portion 46 connects the first negative electrode terminals 26C of the solar cell located at the series end on the negative electrode side of the series solar cell section 80 to the second negative electrode terminal 36 and is embedded in the interlayer dielectric film 41. The series connecting portion 42B connects the first negative electrode terminal 26B and the first positive electrode terminal 25C together and is embedded in the interlayer dielectric film 41 and spaced apart from the second principal surface of the three solar cells as shown in FIG. 8. Likewise, the series connecting portion 42A connects the first negative electrode terminal 26A and the first positive electrode terminal 25B together and is embedded in the interlayer dielectric film 41 and spaced apart from the second principal surface of the three solar cells.

Also, the three solar cells of the series solar cell section 80 suitably share the same semiconductor substrate 23 and the first positive electrode terminals 25A, 25B and 25C and the first negative electrode terminals 26A, 26B and 26C are suitably formed on the same surface of that semiconductor substrate 23. In that case, the first positive electrode terminals 25A, 25B and 25C are made of a conductor with one work function and the first negative electrode terminals 26A, 26B and 26C are made of a conductor with another work function. As a result, compared to connecting together in series multiple solar cells which have been formed on mutually different semiconductor substrates, the series solar cell section 80 can be formed more easily.

Figure 10:
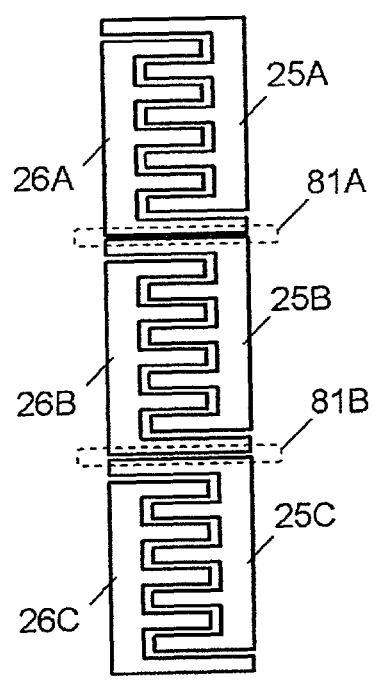
FIG. 10 A partial plan view illustrating the arrangement of respective solar cells in a series solar cell section of a solar secondary cell according to the second embodiment of the present disclosure.

Next, a more suitable structure will be described with reference to FIG. 10, which is a partial plan view illustrating the arrangement of respective solar cells in a series solar cell section of a solar secondary cell according to the second embodiment of the present disclosure. As shown in FIG. 10, the respective terminals are suitably arranged so that the gap between the first negative electrode terminal 26A and the first positive electrode terminal 25B and the gap between the first negative electrode terminal 26B and the first positive electrode terminal 25C are narrow enough to allow carriers to move. These gaps may be 100 μm or less. According to this configuration, no series connecting portions 42A, 42B are needed.

Figure 5:
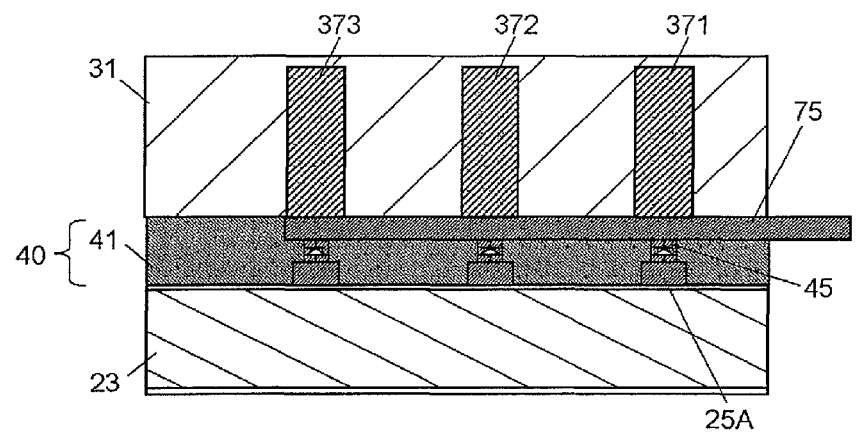
FIG. 5 A cross-sectional view of the solar secondary cell shown in FIG. 4 as viewed on the plane 5-5.
Figure 6:
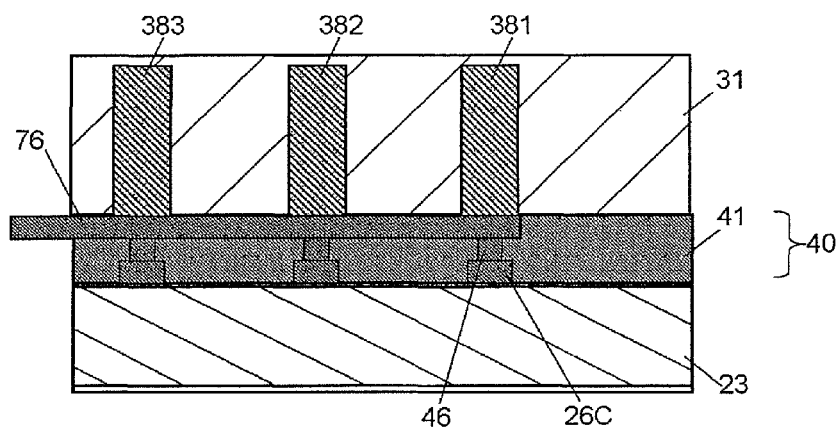
FIG. 6 A cross-sectional view of the solar secondary cell shown in FIG. 4 as viewed on the plane 6-6.

According to this configuration, unless light is incident on the solar cells, the first negative electrode terminal 26A and the first positive electrode terminal 25B are electrically insulated from each other, so are the first negative electrode terminal 26B and the first positive electrode terminal 25C. And when light is incident on the solar cells, these proximate portions 81A and 81B function as diodes, thus connecting those two pairs of terminals together in series. In FIGS. 5 and 8, a rectifying portion is provided for the positive electrode connecting portion 45. However, if the semiconductor substrate 23 has high resistance, electrically insulated state is substantially established while the solar cells are generating no power, and no current flows from the secondary cell. That is why the rectifying section does not have to be provided.

Although not shown, the capacity may be increased by stacking and connecting a second secondary cell in parallel as in the structure of the first embodiment that has already been described with reference to FIG. 3.

Optionally, multiple solar secondary cell modules 90 may be connected in parallel with each other via the positive electrode connecting portions 75 and the negative electrode connecting portions 76 as shown in FIG. 4. Then, a solar secondary cell with a large area can be formed.

Figure 7:
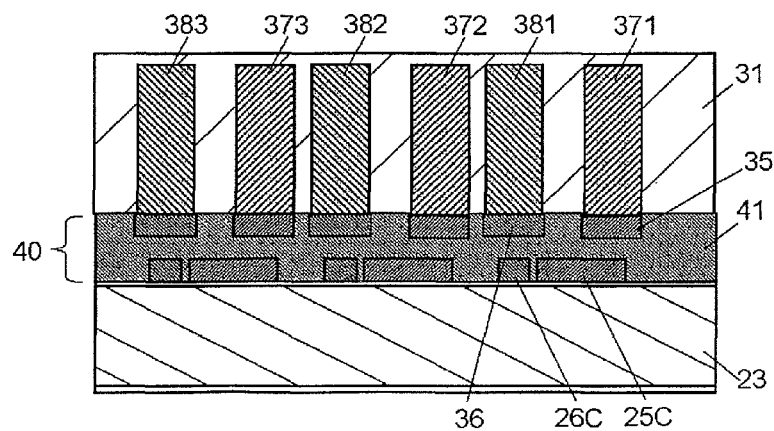
FIG. 7 A cross-sectional view of the solar secondary cell shown in FIG. 4 as viewed on the plane 7-7.
Figure 9:
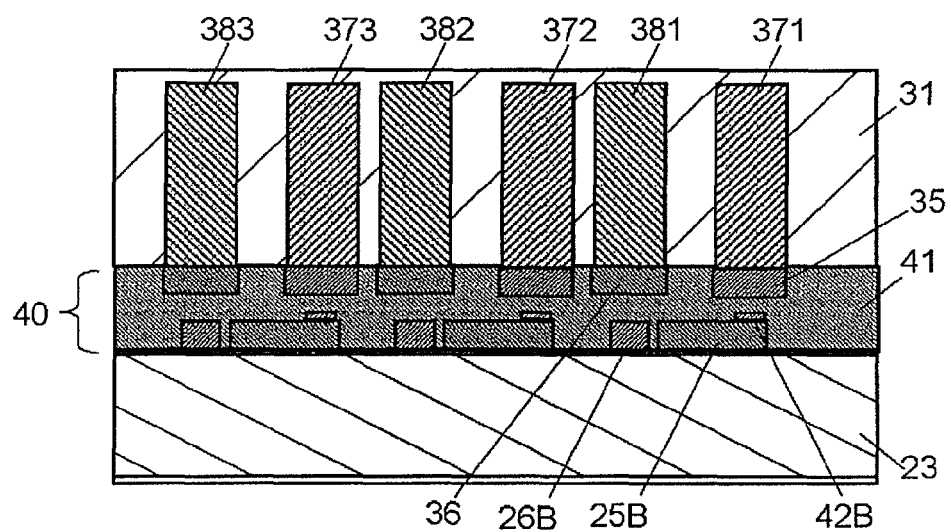
FIG. 9 A cross-sectional view of the solar secondary cell shown in FIG. 4 as viewed on the plane 9-9.

Also, multiple secondary cells of multiple solar secondary cell modules 90 have a structure in which a positive electrode layer, an electrolytic layer, a negative electrode layer and an electrolytic layer are stacked one upon the other in this order a number of times. That is why those secondary cells can be formed at a time as a single stack of multiple layers. Specifically, by stacking the positive electrode layer 371, electrolytic layer 31, negative electrode layer 381, electrolytic layer 31, positive electrode layer 372, electrolytic layer 31, negative electrode layer 382, electrolytic layer 31, positive electrode layer 373, electrolytic layer 31, and negative electrode layer 383 in this order as shown in FIGS. 7 and 9, the secondary cells of the respective solar secondary cell modules 90 can be formed as a single stack. As a result, the manufacturing process of the solar secondary cells can be simplified.

Also, as shown in FIG. 4, the direction in which those solar cells are arranged in each series solar cell section 80 is different from the direction in which those solar secondary cell modules 90 are arranged. FIG. 4 illustrates, as a typical example, a situation where those two arrangement directions intersect with each other substantially at right angles. According to such a configuration, by connecting together both terminal portions of multiple solar secondary cell modules 90, those solar secondary cell modules 90 can be easily connected in parallel with each other.

As described above, to raise the output voltage of a solar cell, a plurality of solar cells needs to be connected together in series. For that purpose, it is effective to reduce the size of each of those solar cells and integrate a large number of such smaller cells together. And by stacking the positive electrode layer, electrolytic layer and negative electrode layer of a secondary cell parallel to the surface of such a series solar cell section (i.e., parallel to the counter surface of the secondary cell), secondary cells can be connected in parallel with each other in a different direction from the direction in which those solar cells are arranged as shown in FIG. 4.

Even though a flat-plate solar cell is supposed to be used in the embodiments described above, a solar cell with a stepped shape may also be used as long as the cell can be connected to the counter surface of a secondary cell.

Also, the first positive electrode terminal 25 and the first negative electrode terminal 26 are supposed to have a comb shape in the embodiments described above but do not have to have such a comb shape, either. As long as those terminals are arranged with a predetermined gap left between themselves, those terminals may also have a meandering shape or a spiral shape, not just the comb shape.

Embodiment 3

Figure 11:
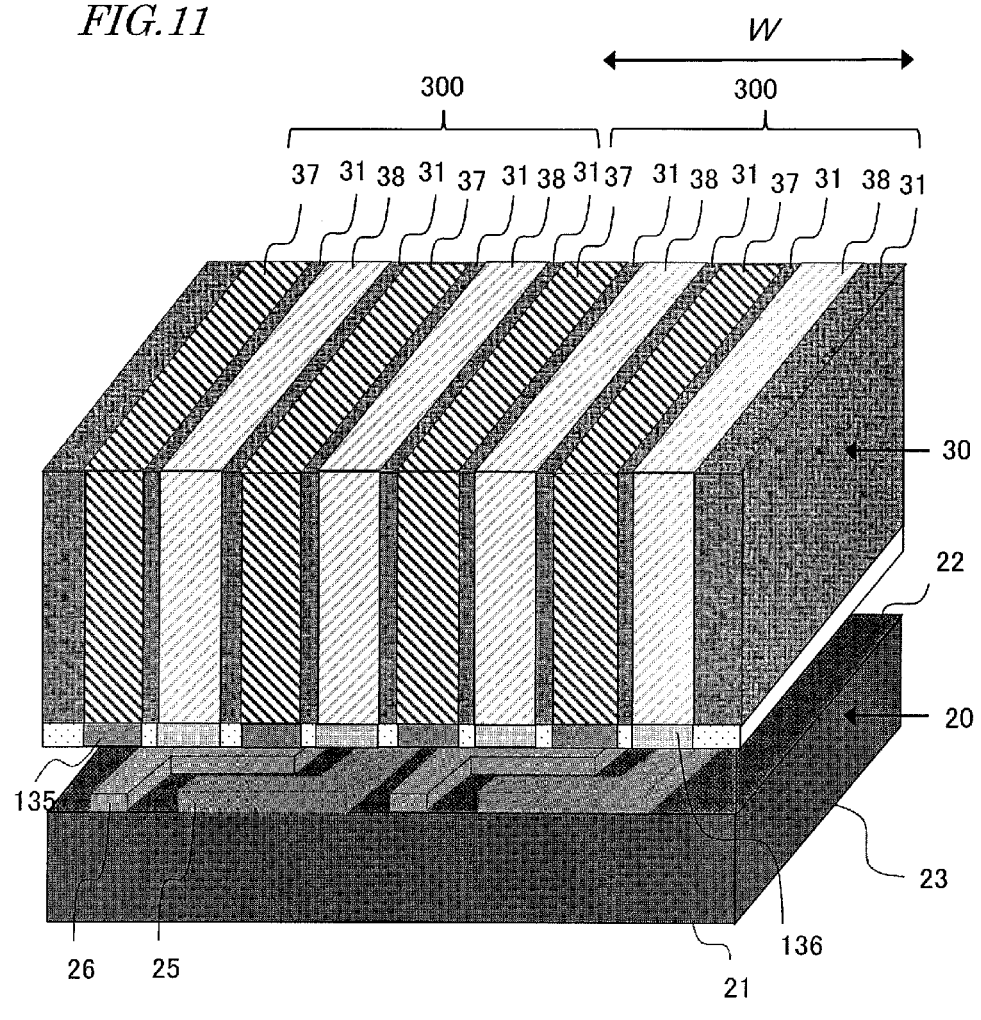
FIG. 11 A perspective view illustrating a third embodiment of a solar secondary cell according to the present disclosure.

FIG. 11 is a perspective view illustrating another embodiment of a solar secondary cell according to the present disclosure.

As in the embodiments described above, the solar secondary cell shown in FIG. 11 also includes a solar cell 20 and a secondary cell 30.

The solar cell 20 has a first principal surface 21, a second principal surface 22, a semiconductor substrate 23 (which may also be a semiconductor layer of silicon) located between the first and second principal surfaces 21 and 22, and first and second electrode layers 25 and 26 which are provided on at least one of the first and second principal surfaces 21 and 22. The first principal surface 21 functions as a light incident surface. In the example illustrated in FIG. 11, the first and second electrodes layers 25 and 26 are both arranged on the second principal surface 22 of the solar cell 20. However, this is just an example of a solar secondary cell according to the present disclosure.

The secondary cell 30 of this embodiment includes a plurality of periodic unit structures 300 which are arranged along the second principal surface 22 of the solar cell 20. Even though a large number of periodic unit structures 300 are arranged in this example in the X-axis direction shown in FIG. 11, only two periodic unit structures 300 are illustrated in FIG. 11 for the sake of simplicity. However, a lot more periodic unit structures 300 may be arranged actually. Each of those periodic unit structures 300 includes: a positive electrode layer (first electrode) 37 which projects away from the second principal surface 22 (i.e., in the Z-axis direction); a negative electrode layer (second electrode) 38 which projects away from the second principal surface 22 (i.e., in the Z-axis direction); and a solid electrolyte 31 which is interposed between the positive electrode layer 37 and the negative electrode layer 38 and which conducts ions. In other words, each periodic unit structure 300 has a structure in which the positive electrode layer 37, the solid electrolyte 31 and the negative electrode layer 38 are stacked one upon the other in the X-axis direction shown in FIG. 11, and the positive electrode layer 37 and the negative electrode layer 38 are respectively electrically connected to the first and second electrode layers 25 and 26 of the solar cell 20. By adopting such a configuration, the positive electrode, electrolyte and negative electrode can be integrated together more densely in the secondary cell 30, and the capacity density can be increased.

Although not shown in FIG. 11 for the sake of simplicity, an $SiO_2$ layer (a very thin passivation layer) with a thickness of 1.5 nm is provided between the solar cell 20 and the secondary cell 30 to cover the second principal surface 22 of the solar cell 20. On that passivation layer, arranged are an interconnect pattern which electrically connects the first electrode layer 25 of the solar cell 20 to the positive electrode layer 37 of the secondary cell 30 and an interconnect pattern which electrically connects the second electrode layer 26 of the solar cell 20 to the negative electrode layer 38 of the secondary cell 30.

Figure 12:
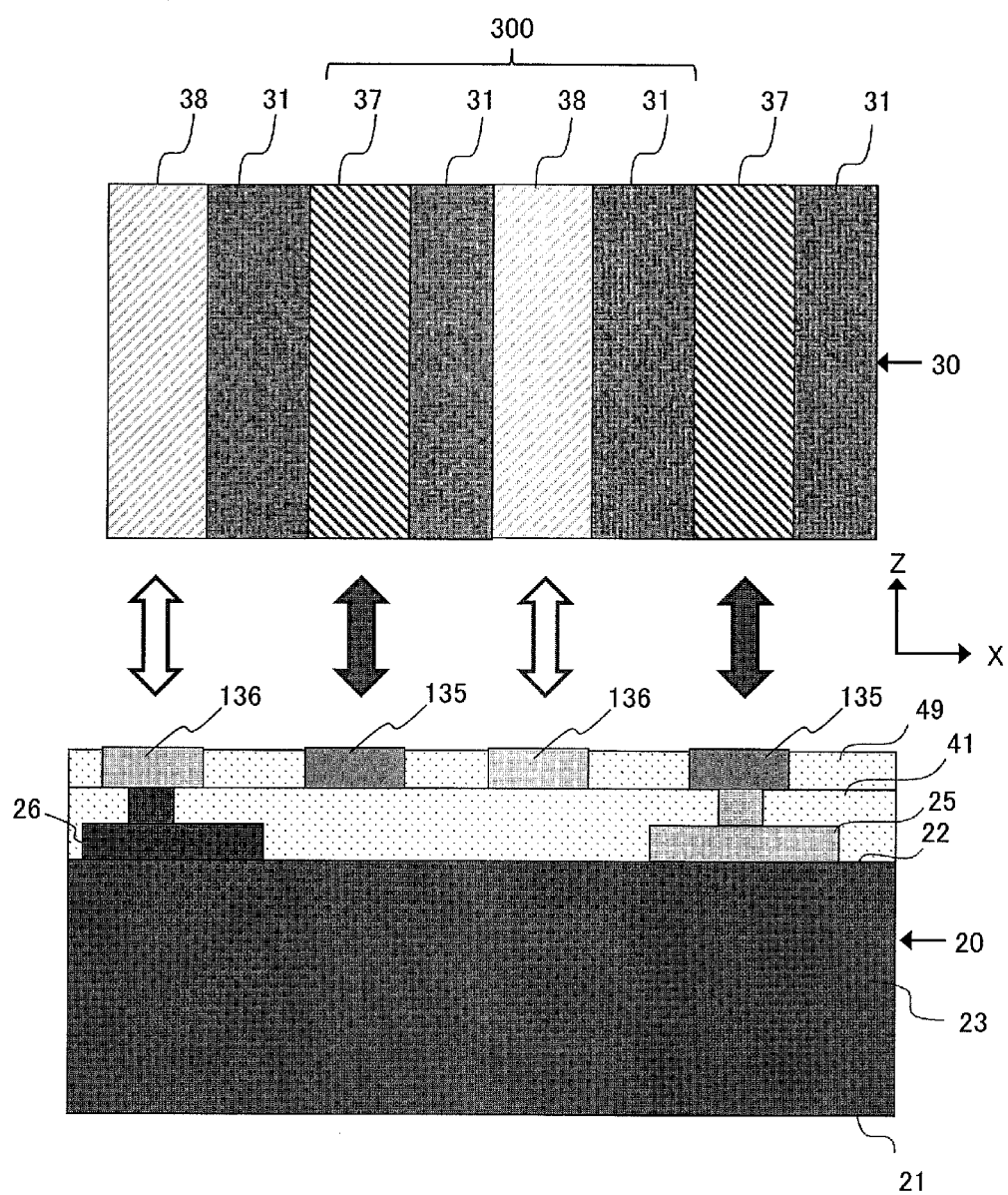
FIG. 12 A cross-sectional view illustrating the third embodiment of a solar secondary cell according to the present disclosure.

FIG. 12 schematically illustrates the cross-sectional structure of the solar cell 20 and secondary cell 30 according to this embodiment. In FIG. 12, the solar cell 20 and the secondary cell 30 are illustrated as being separate from each other, and an interlayer dielectric film (electrical insulator) 41 which covers the second principal surface 22 of the solar cell 20 is also illustrated. In this embodiment, arranged on the interlayer dielectric film 41 are a number of first current collectors 135, each of which electrically connects the first electrode layer 25 to a positive electrode layer 37 of the secondary cell 30, and a number of second current collectors 136, each of which electrically connects the second electrode layer 26 of the solar cell 20 to a negative electrode layer 38 of the secondary cell 30. The gaps between the first current collectors 135 and the second current collectors 136 are filled with an insulating layer 49.

In this embodiment, the positive electrode layer 37 is made of a positive electrode active material and the negative electrode layer 38 is made of a negative electrode active material. Meanwhile, the solid electrolyte 31 is made of a solid electrolyte. As the positive electrode active material, a transition metal oxide including an alkaline metallic element or a transition metal oxide of which a transition metallic element is partially replaced with a different element may be used, for example. Examples of the alkaline metallic elements include lithium (Li) and sodium (Na). Among other things, lithium is particularly preferred. As the transition metallic element, at least one transition metallic element selected from the group consisting of scandium (Sc), manganese (Mn), iron (Fe), cobalt (Co), nickel (Ni), copper (Cu) and yttrium (Y) may be used. Among these transition metallic elements, Mn, Co and Ni are particularly preferred. As the different element, at least one element selected from the group consisting of magnesium (Mg), aluminum (Al), lead (Pb), antimony (Sb) and boron (B) may be used. Among these different elements, Mg and Al are particularly preferred.

Specific examples of such positive electrode active materials include lithium containing transition metal oxides that use lithium as an alkaline metallic element such as $LiCoO_2$, $LiNiO_2$, $LiMn_2O_4$, $LiMnO_2$, $LiNi_{1-y}Co_yO_2$ (where $0<y<1$), $LiNi_{1-y-z}Co_yMn_zO_2$ (where $0<y+z<1$) and $LiFePO_4$. As the positive electrode active material, only one material may be used by itself or two or more kinds of materials may be used in combination.

Any material may be used as the negative electrode active material as long as the material can absorb and emit alkaline metal ions. Examples of such negative electrode active materials include carbon materials, metals, alloys, metal oxides, metal nitrides and carbon and silicon into which an alkaline metal has been absorbed in advance. Examples of carbon materials include natural graphite, artificial graphite, and pitch-based carbon fiber. Specific examples of the metals and alloys include lithium (Li), silicon (Si), tin (Sn), germanium (Ge), indium (In), gallium (Ga), lithium alloys, silicon alloys, and tin alloys. Examples of metal oxides include lithium titanate and an oxide including an element that can be alloyed with lithium. As the negative electrode active material, only one material may be used by itself or two or more kinds of materials may be used in combination.

Any material may be used as the solid electrolyte as long as the material can conduct alkaline metal ions. As such a solid electrolyte, polyethylene oxide (PEO), a so-called "LISICON (lithium superionic conductor)" oxide ion conductor, or a sulfide-based solid electrolyte (thio-LISICON) may be used, for example. Specifically, lithium phosphate, an $Li_2S$—$SiS_2$ based material, or an Li—Ge—P—O—S based material may be used.

Hereinafter, an exemplary method of making a solar secondary cell according to this embodiment will be described with reference to the accompanying drawings.

First of all, it will be described how to form a wiring structure for the solar cell 20.

Figure 13:
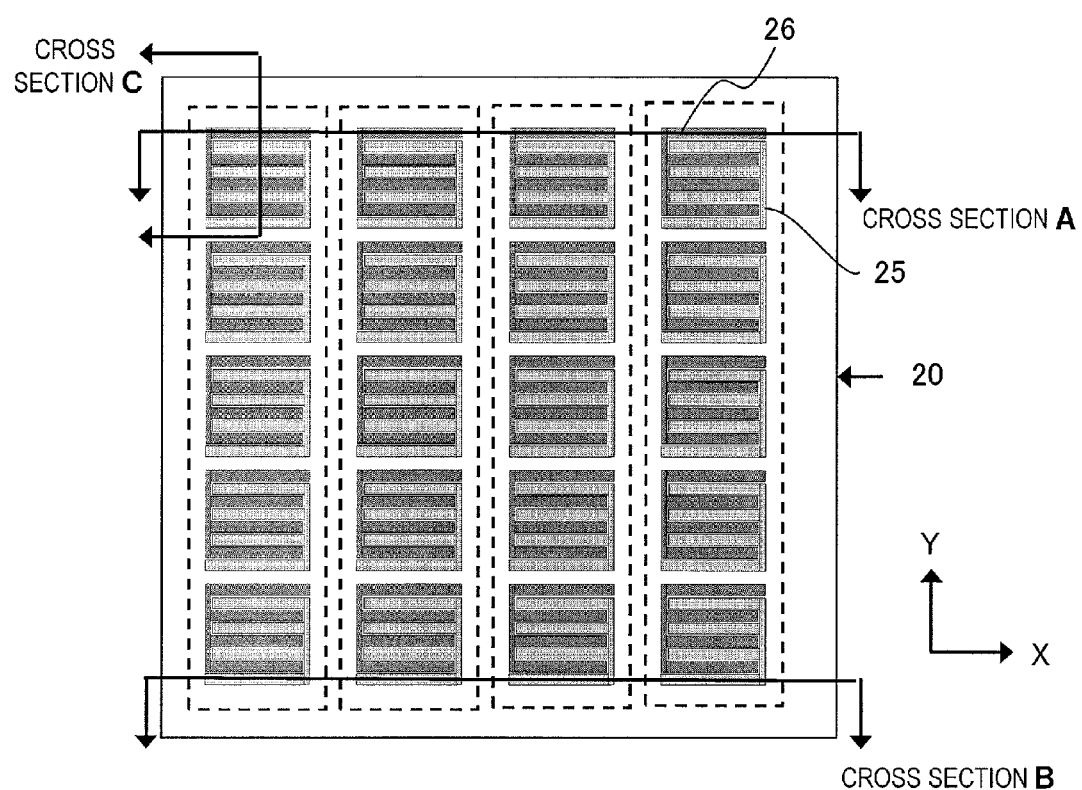
FIG. 13 A plan view illustrating a solar cell according to the third embodiment of the present disclosure.
Figure 14:
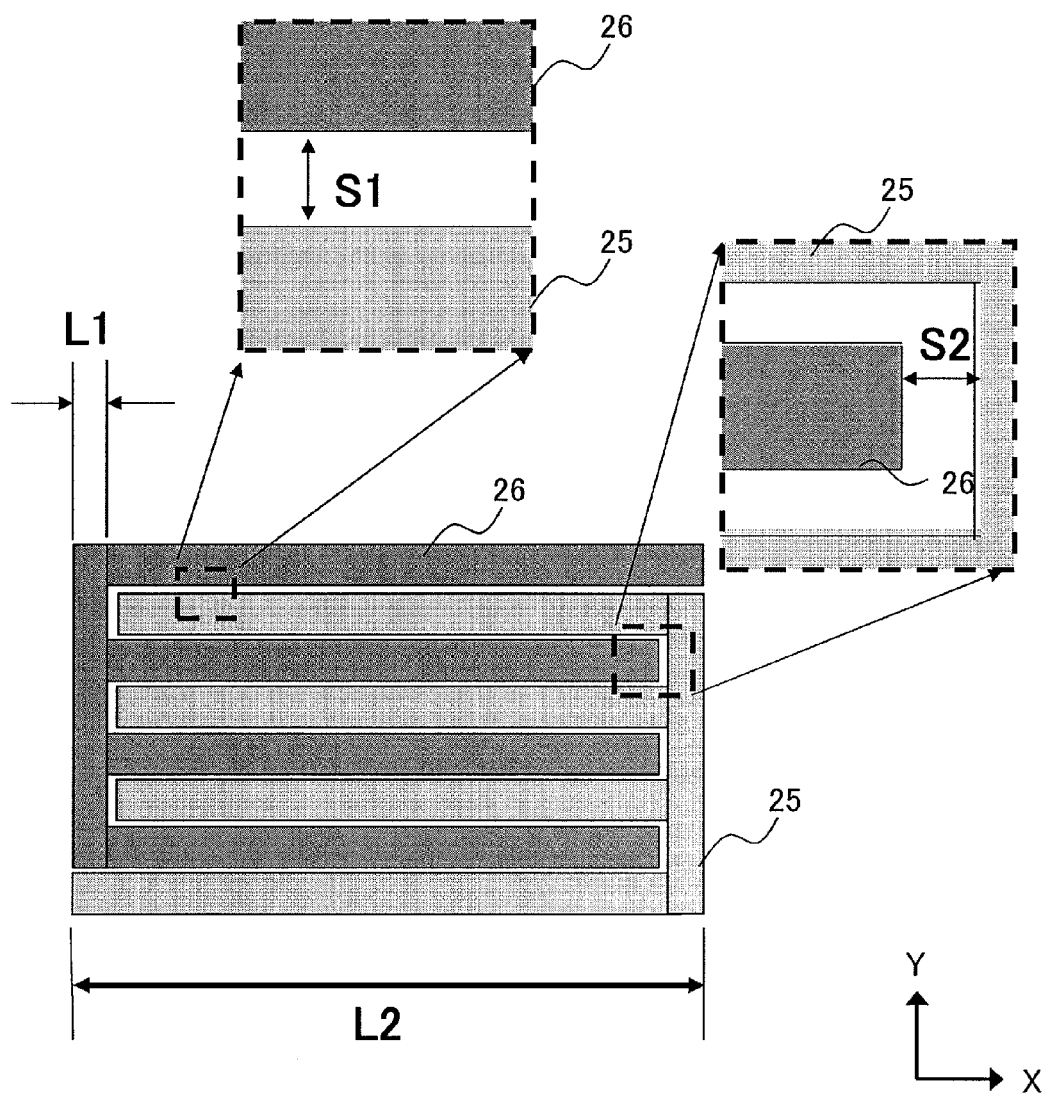
FIG. 14 A partial enlarged view of FIG. 12.

FIG. 13 is a top view of the solar cell 20, and FIG. 14 is a partial enlarged view illustrating the wiring structure of a part of the solar cell 20 (i.e., a single cell thereof). The solar cell section 20 shown in FIG. 13 includes twenty cells which are arranged in five rows and four columns. Five cells that are arranged in line to form a column are connected together in series to form a single set of cells. In FIG. 13, lines to connect those cells together are not illustrated for the sake of simplicity. In FIG. 13, four sets of cells are indicated by the dashed rectangles. In the example illustrated in FIG. 13, these four sets of cells are connected in parallel with each other. If a single cell generates an photovoltage of 0.5 volts, then an photovoltage of 2.5 volts can be obtained from each set of five cells that are connected together in series. The number of cells to be connected together in series in each set of cells may be determined according to the magnitude of photovoltage required.

Next, look at FIG. 14. As shown in FIG. 14, the first and second electrode layers 25 and 26 have been patterned so as to face each other with a narrow gap left between themselves. Specifically, the first and second electrode layers 25 and 26 have four positive electrode fingers and four negative electrode fingers, respectively, and have a so-called "comb" shape. In this example, the positive electrode fingers of the first electrode layer 25 and the negative electrode fingers of the second electrode layer 26 are arranged at equal intervals. In FIG. 14, shown are parameters that define the sizes of respective portions of the first and second electrode layers 25 and 26. Specifically, S1 indicates the width of the gap in an area where the first and second electrode layers 25 and 26 face each other. S2 indicates the width of the gap between a tip of the second electrode layer 26 and the first electrode layer 25. L1 indicates the line width of the first electrode layer 25 (and the second electrode layer 26). And L2 indicates the length of each finger. For example, S1 and S2 may be set to be 10 µm, L1 may be set to be 500 µm, and L2 may be set to be 10 mm. The thickness of the first and second electrode layers 25 and 26 may be set to be 200 nm, for example. It should be noted that the numerical values of these parameters are just an example and may be set to any other appropriate values depending on this cell's use.

Hereinafter, an exemplary process for forming the first and second electrode layers 25 and 26 on the second principal surface 22 of the solar cell 20 will be described with reference to FIGS. 15 through 18. FIGS. 15(a), 16(a), 17(a) and 18(a) are cross-sectional views as viewed on the plane A shown in FIG. 13. Likewise, FIGS. 15(b), 16(b), 17(b) and 18(b) are cross-sectional views as viewed on the plane B shown in FIG. 13. And FIGS. 15(c), 16(c), 17(c) and 18(c) are cross-sectional views as viewed on the plane C shown in FIG. 13. In this case, the planes A and B show cross sections that cross the four columns of cells in the X-axis direction. On the other hand, the plane C shows a cross section that crosses a single cell in the Y-axis direction. It should be noted that the ratio of the lateral sizes of the cross-sectional views as viewed on the planes A and B to that of the cross-sectional views as viewed on the plane C is not to actual scale.

Figure 15:
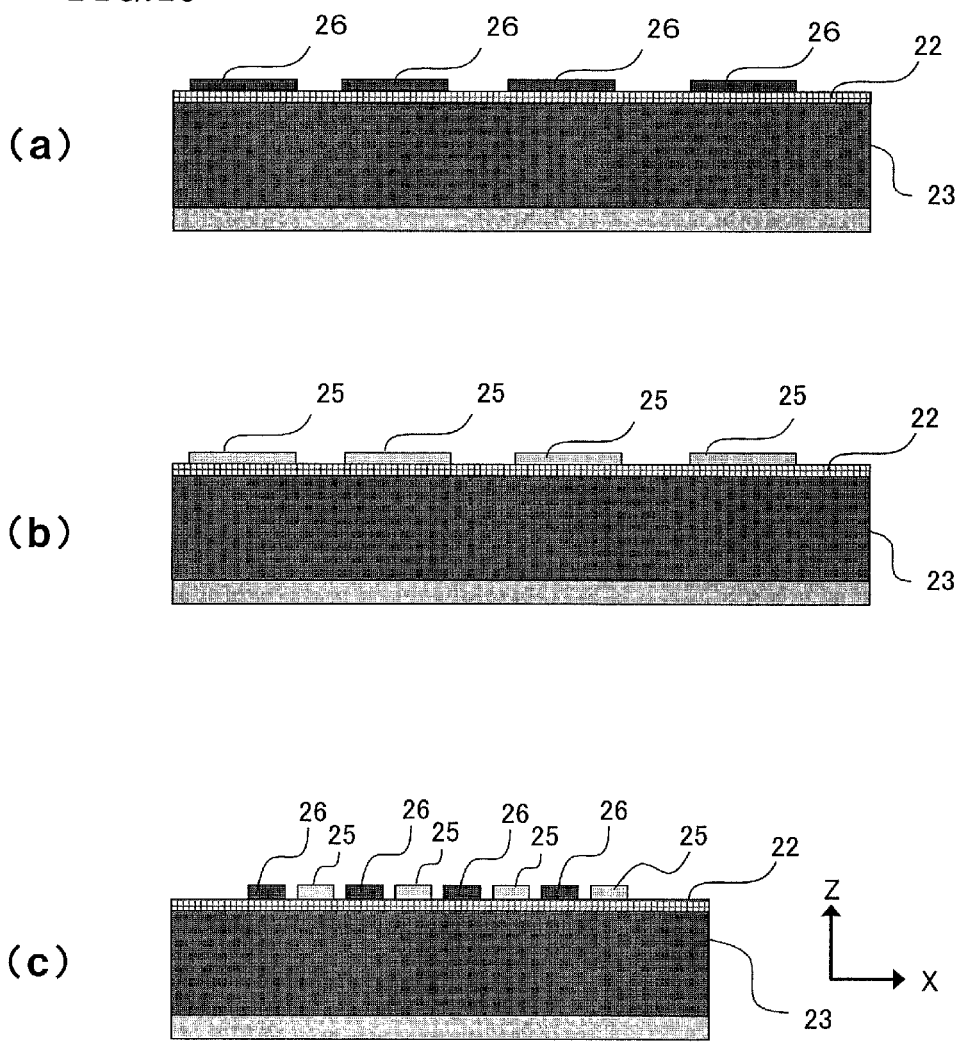
FIGS. 15 (a), (b) and (c) are cross-sectional views as respectively viewed on the planes A, B and C shown in FIG. 13 to illustrate a step of a manufacturing process in progress.

First of all, look at FIG. 15. In this stage, first and second electrode layers 25 and 26 are formed on the semiconductor substrate 23. Even though an $SiO_2$ layer (very thin passivation layer) with a thickness of 1.5 nm is provided in this embodiment on the semiconductor substrate 23, the first and second electrode layers 25 and 26 may directly contact with the semiconductor substrate 23 depending on the configuration of the solar cell 20. Each of the first and second electrode layers 25 and 26 is formed by performing the process steps of depositing a conductive layer and patterning the conductive layer. The process step of patterning the conductive layer may include known photolithographic and etching (or lift-off) process steps. With a resist pattern obtained by performing the photolithographic process step, the first and second electrode layers 25 and 26 can be defined to have predetermined patterns. The thickness of the first and second electrode layers 25 and 26 may be set to be an intended value by adjusting the thickness of a conductive layer being deposited to form the respective electrode layers 25 and 26.

Next, look at FIG. 16. In this stage, an interlayer dielectric film 41 is deposited on the semiconductor substrate 23 to cover the first and second electrode layers 25 and 26. The interlayer dielectric film 41 may be formed by either a thin film deposition technique such as a CVD process or a coating technique. The surface of the interlayer dielectric film 41 has been planarized. The interlayer dielectric film 41 has a thickness of 500 nm to several µm and may have a thickness of 1 µm, for example.

Figure 17:
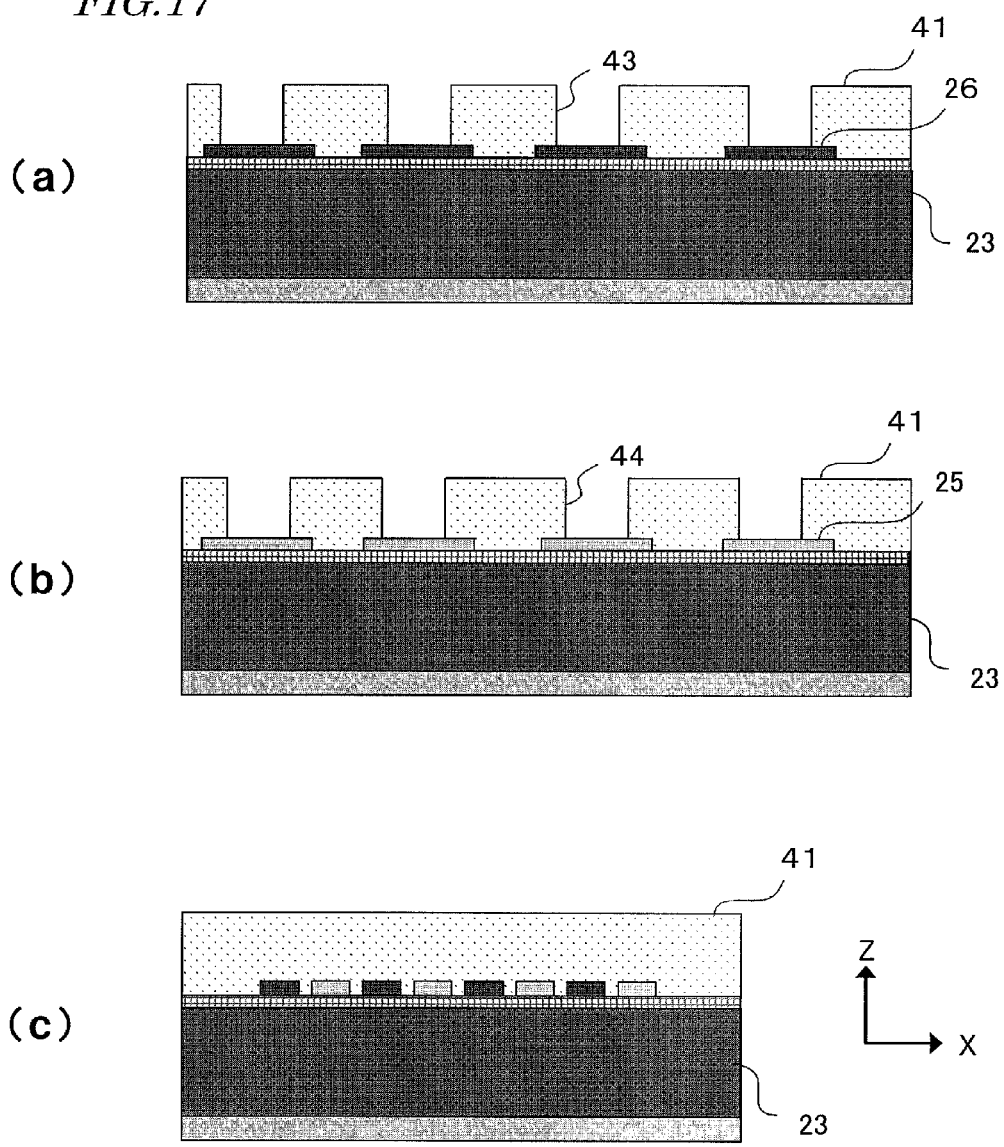
FIGS. 17 (a), (b) and (c) are cross-sectional views as respectively viewed on the planes A, B and C shown in FIG. 13 to illustrate still another step of the manufacturing process in progress.

Next, look at FIG. 17. In this stage, contact holes 43 are made through the interlayer dielectric film 41 to reach the second electrode layer 26 as shown in FIG. 17(a). Also, contact holes 44 are made through the interlayer dielectric film 41 to reach the first electrode layer 25 as shown in FIG. 17(b). These contact holes 43 and 44 are formed over cells which are located at both ends of the sets of cells shown in FIG. 13. More specifically, the contact holes 43 formed over the second electrode layers 26 which are located at the end of the cells that form the first row, while the contact holes 44 are formed over the first electrode layers 25 which are located at the end of the cells that form the fifth row. The rest of the first and second electrode layers 25 and 26 is covered with the interlayer dielectric film 41 as shown in FIG. 17(c).

Figure 18:
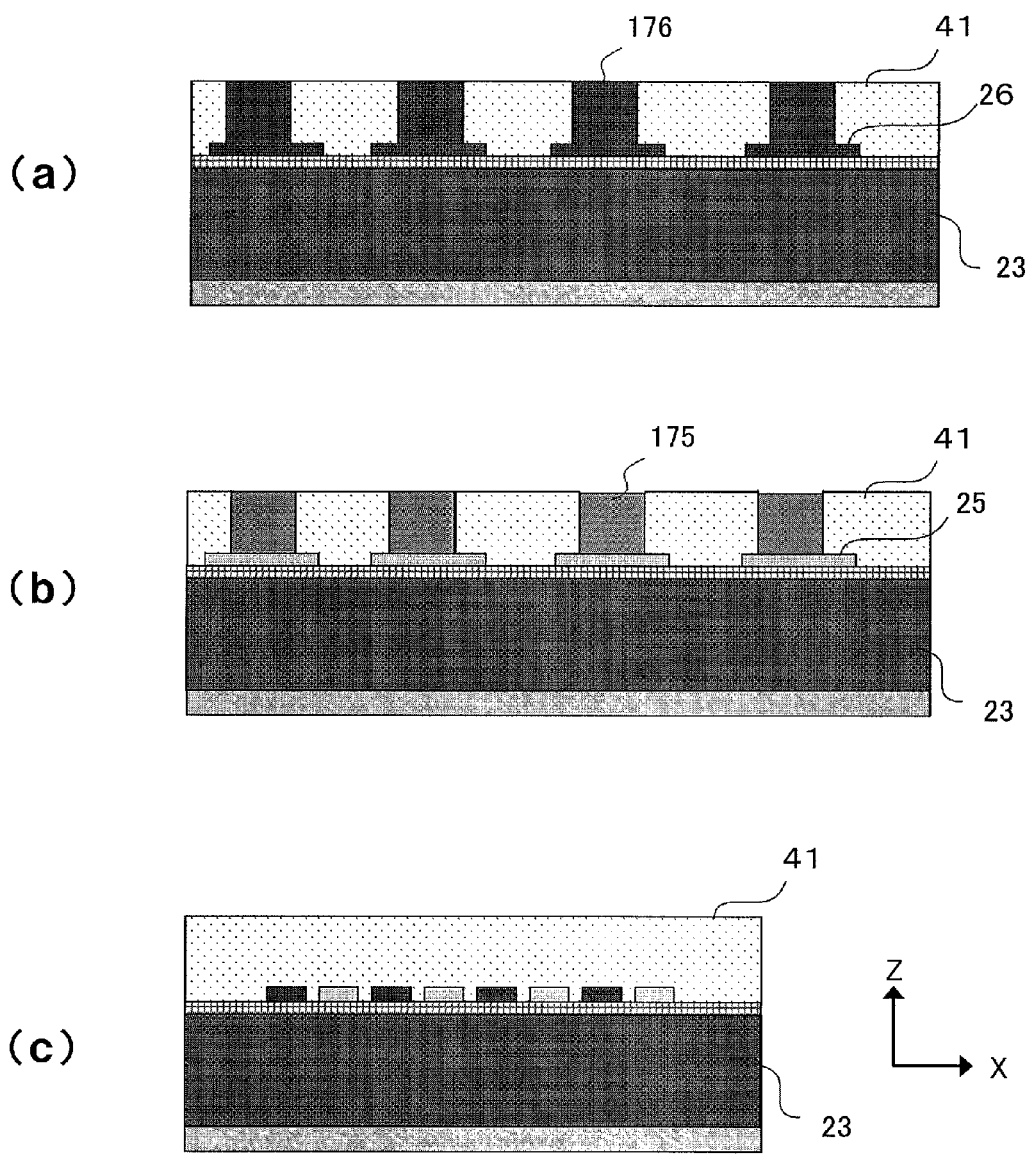
FIGS. 18 (a), (b) and (c) are cross-sectional views as respectively viewed on the planes A, B and C shown in FIG. 13 to illustrate yet another step of the manufacturing process in progress.

Next, look at FIG. 18. In this stage, the contact holes 44 and 43 of the interlayer dielectric film 41 are filled with metal plugs 175 and 176 as shown in FIGS. 18(a) and 18(b). As will be described later, these metal plugs 175 and 176 will be electrically connected to interconnect patterns (including current collectors and lines) to be formed thereon. To be electrically connected to the second electrodes 26 of the solar cell 20, the contact holes 43 may be filled with metal plugs 176 of tungsten, for example. And to be electrically connected to the first electrodes 25, the contact holes 44 may be filled with metal plugs 175 of tungsten, for example. These metal plugs 175 and 176 may be formed by filing the contact holes 44 and 43 with a metal by CVD process and then removing excessive parts of the metal from outside of the contact holes 44 and 43 by CMP process, for example.

By performing these process steps, the second principal surface 22 of the solar cell 20 gets covered with the interlayer dielectric film 41 in which the metal plugs 175 and 176 are locally exposed here and there. After that, an interconnect pattern is formed on the interlayer dielectric film 41 in order to connect a plurality of positive electrode layers 37 and a plurality of negative electrode layers 38 to be included in the secondary cell 30 to the first and second electrode layers 25 and 26 of the solar cell 20.

Figure 19:
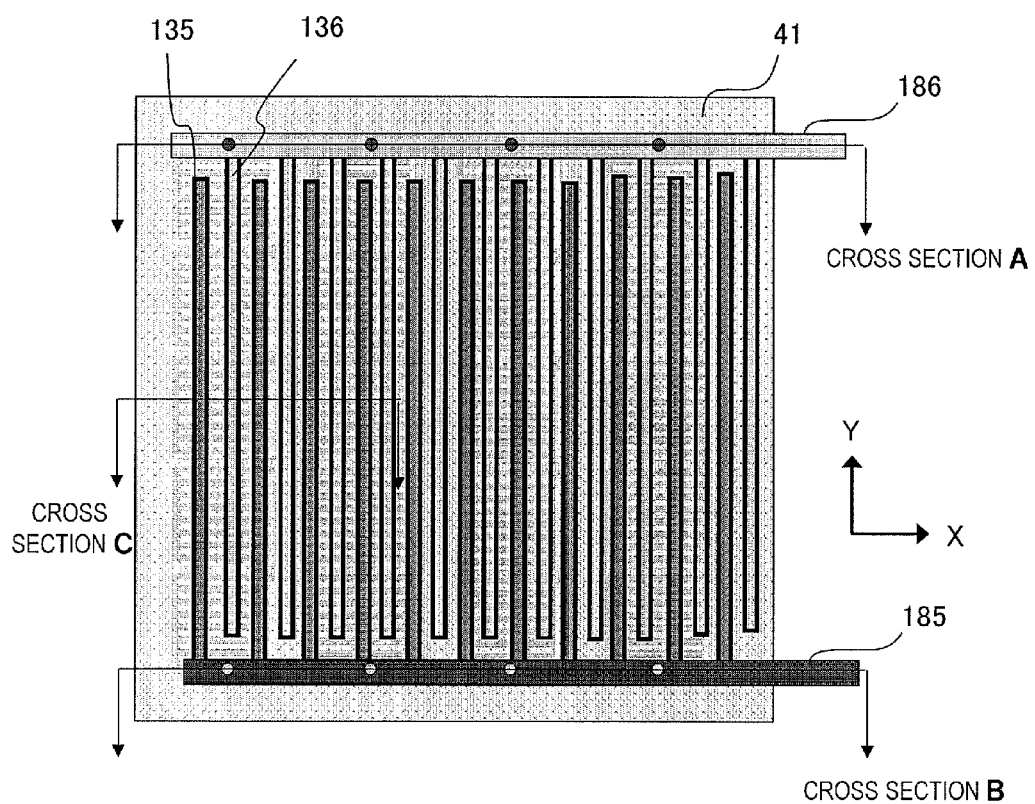
FIG. 19 A plan view illustrating an interconnect pattern on an insulating layer on a solar cell.

The interconnect pattern to be formed on the upper surface of the interlayer dielectric film 41 may have a planar layout such as the one shown in FIG. 19. Since the positive electrode layers 37 and negative electrode layers 38 of the secondary cell 30 are arranged periodically in the X-axis direction in FIG. 19, the corresponding interconnect pattern includes a plurality of first current collectors 135 and a plurality of second current collectors 136 which are also arranged periodically in the X-axis direction as shown in FIG. 19. These current collectors 135 and 136 run in the Y-axis direction in FIG. 19. The first current collectors 135 are connected together via a first line 185 which runs in the X-axis direction in FIG. 19, while the second current collectors 136 are connected together via a second line 186 which also runs in the X-axis direction in FIG. 19. In the area interposed between these first and second lines 185 and 186, the first current collectors 135 and the second current collectors 136 are arranged alternately in the X-axis direction. In this description, the first current collectors 135 and the first line 185 will be sometimes collectively referred to herein as a "first interconnect pattern", and the second current collectors 136 and the second line 186 will be sometimes collectively referred to herein as a "second interconnect pattern".

Hereinafter, an exemplary method for forming the interconnect pattern shown in FIG. 19 will be described with reference to FIGS. 20 through 23.

FIGS. 20(a) and 21(a) are cross-sectional views as viewed on the plane A shown in FIG. 19. Likewise, FIGS. 20(b) and 21(b) are cross-sectional views as viewed on the plane B shown in FIG. 19. And FIGS. 20(c) and 21(c) are cross-sectional views as viewed on the plane C shown in FIG. 19.

Figure 20:
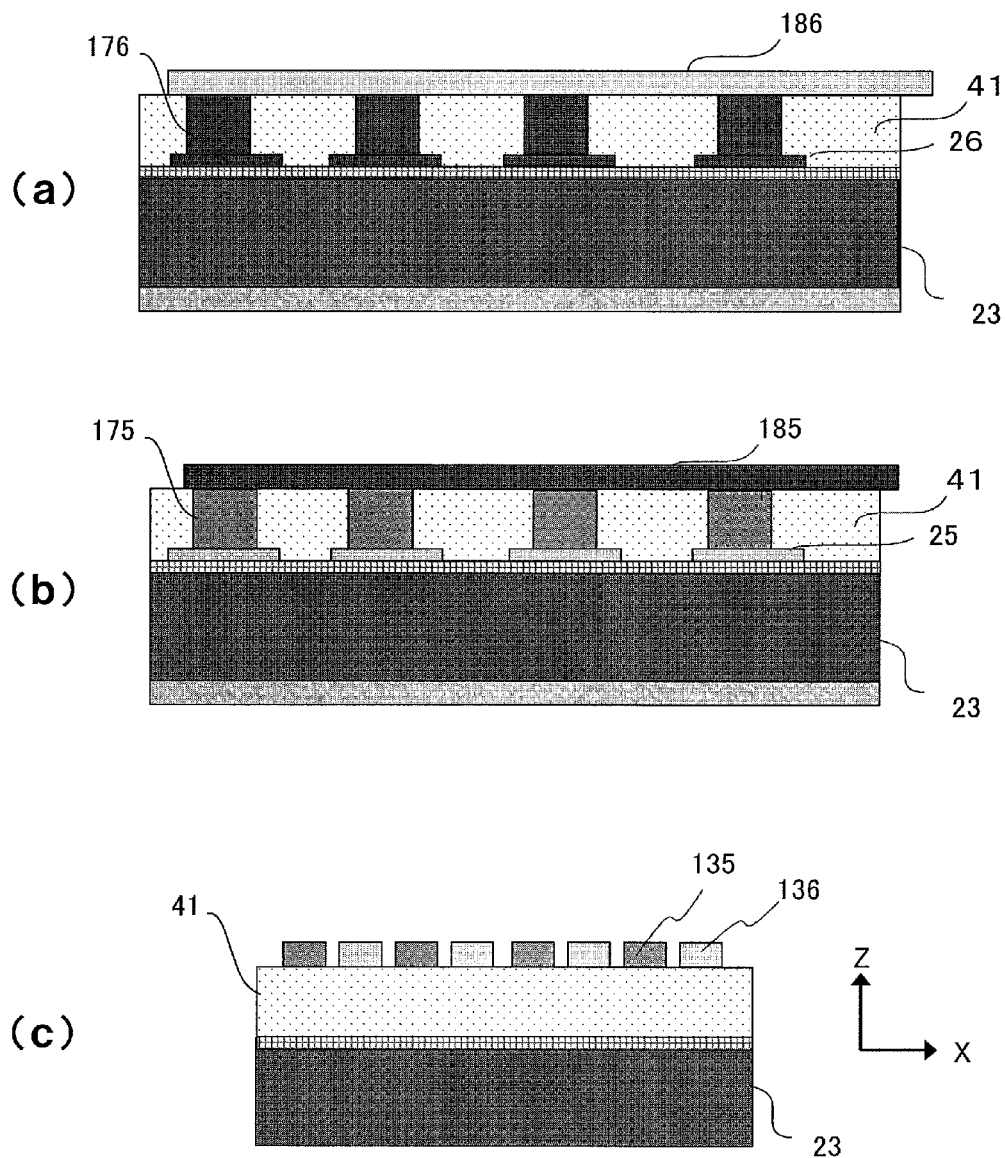
FIGS. 20 (a), (b) and (c) are cross-sectional views as respectively viewed on the planes A, B and C shown in FIG. 19 to illustrate yet another step of the manufacturing process in progress.

First of all, look at FIG. 20. In this stage, the first line 185 and the second line 186 are formed on the interlayer dielectric film 41. As shown in FIG. 20(a), the second line 186 is connected to the metal plugs 176 that are connected to the second electrode layers 26. Likewise, the first line 185 is connected to the metal plugs 175 that are connected to the first electrode layers 25 as shown in FIG. 20(b). Also, the first current collectors 135 and the second current collectors 136 are further formed on the interlayer dielectric film 41 as shown in FIG. 20(c), in which illustration of the first and second electrode layers 25 and 26 is omitted. The first line 185 is connected to the first current collectors 135, while the second line 186 is connected to the second current collectors 136. All of these lines and current collectors have been formed on the same plane. That is why as measured from the surface of the substrate 23 through the interlayer dielectric film 41, the first line 185, second line 186, first current collectors 135 and second current collectors 136 are all located at the same level.

Figure 21:
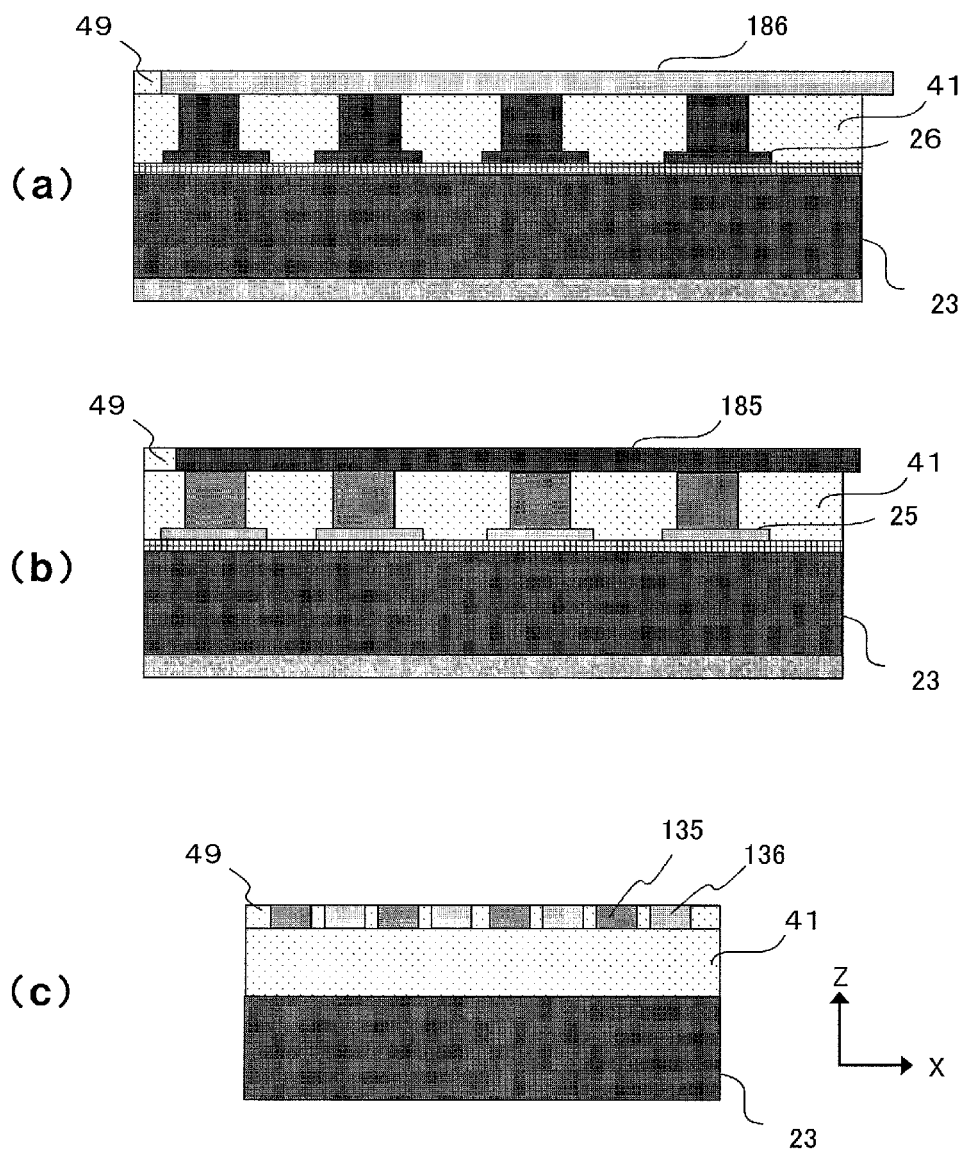
FIGS. 21 (a), (b) and (c) are cross-sectional views as respectively viewed on the planes A, B and C shown in FIG. 19 to illustrate yet another step of the manufacturing process in progress.

Next, look at FIG. 21. In this stage, an insulating layer 49 is formed on the interlayer dielectric film 41 so as to fill the gaps between the first and second lines 185, 186 and the current collectors 135, 136. The insulating layer 49 may be formed by depositing an insulating film over the first and second lines 185, 186 and the current collectors 135, 136 entirely by CVD process and then removing excessive parts of the insulating film (i.e., etching back the insulating film) so as to expose the respective upper surfaces of the first and second lines 185, 186 and current collectors 135, 136. The configuration of the solar cell 20 on the second principal surface 22 at this stage is shown in FIG. 22(a). FIG. 22(b) is a cross-sectional view as viewed on the plane B shown in FIG. 22(a). The first current collectors 135 and second current collectors 136 will be electrically connected to the positive electrode layers 137 and negative electrode layers 138, respectively, by performing the process step to be described later. That is why when the insulating layer 49 is formed by etching back the insulating film, the respective upper surfaces of the first current collectors 135 and second current collectors 136 are not covered with the insulating layer 49 but are exposed.

The interconnect pattern shown in FIG. 22 is divided into a first interconnect pattern, of which the potential is relatively positive electrode, and a second interconnect pattern, of which the potential is relatively negative electrode. The first interconnect pattern has a comb tooth pattern which is defined by the first current collectors 135 and the first line 185. Likewise, the second interconnect pattern also has a comb tooth pattern which is defined by the second current collectors 136 and the second line 186. In this embodiment, the first current collectors 135 and the first line 185 may be (but do not have to be) made of the same material, and the second current collectors 136 and the second line 186 may be (but do not have to be) made of the same material. Alternatively, if copper is used, the first current collectors 135, second current collectors 136, first line 185 and second line 186 can all of made of the same material (copper). Furthermore, although not shown in FIG. 22, in this embodiment, lower line layers (including the first and second electrode layers 25 and 26) are interposed between the principal surface of the substrate 23 and the upper surface (i.e., the first surface) of the interlayer dielectric film 41 and the first and second lines 185 and 186 are connected to their associated lower line layers.

Hereinafter, an exemplary method for making the secondary cell 30 will be described.

First of all, according to this embodiment, a substrate 100, on which a mold release layer 102 has been formed, is provided as shown in FIG. 23(a). The substrate 100 may be (but does not have to be) made of polyimide. If the substrate 100 is made of polyimide, the mold release layer 102 may be formed by subjecting the surface of the polyimide substrate to a mold release process using siloxane. Polyimide may have a thermal resistance of 500° C. or more.

Next, as shown in FIG. 23(b), a positive electrode active material 137, a solid electrolyte 131 and a negative electrode active material 138 are stacked one upon the other to form multiple layers on the mold release layer 102 on the substrate 100. These layers may be deposited by CVD process, sputtering process, laser deposition process, aerosol deposition process, or a combination thereof, for example. However, the number of the layers formed by the positive electrode active material 137, solid electrolyte 131 and negative electrode active material 138 on the substrate 100 does not have to be three as in the example shown in FIG. 23(b). In this embodiment, a multilayer structure 240 consisting of eight layers in total, namely, the positive electrode active material 137, solid electrolyte 131, negative electrode active material 138, solid electrolyte 131, positive electrode active material 137, solid electrolyte 131, negative electrode active material 138, and solid electrolyte 131 is formed as shown in FIG. 23(c). The overall thickness of the multilayer structure 240 is W as shown in FIG. 23(b). W may be set to fall within the range of 4 μm to 100 μm, for example. As each of the eight layers that form the multilayer structure 240 has a thickness of 1 μm in this example, W=8 μm.

The thickness of the layer made of the positive electrode active material 137 may be set to agree with the width of the first current collector 135 (i.e., the size as measured in the X-axis direction shown in FIG. 22). Likewise, the thickness of the layer made of the negative electrode active material 138 may be set to agree with the width of the second current collector 136 (i.e., the size as measured in the X-axis direction shown in FIG. 22). And the thickness of the layer made of the solid electrolyte 131 may be set to agree with the gap between the current collectors 135 and 136. Specifically, the layer of the solid electrolyte 131 may have a thickness of 0.5 μm to 10 μm, e.g., 1 μm in this example. The width (line width) of the current collectors 135, 136 may be set to fall within the range of 0.5 μm to 500 μm, e.g., 1 μm in this example.

After having been formed on the substrate 100, the multilayer structure 240 is sliced into multiple units, each having a width H, as shown in FIG. 23(d). This slicing process step may be performed by cutting the multilayer structure 240 on the cutting faces 140 shown in FIG. 23(d). The cutting process step may be carried out with a laser beam or a dicing saw, for example. The cutting faces 140 shown in FIG. 23(d) intersect with the paper (i.e., the ZX plane) at right angles and are arranged periodically in the X-axis direction at regular intervals H. Even though the cutting faces 140 are shown in FIG. 23(d) as having a very small thickness, the cutting faces 140 may actually have a non-negligible thickness as compared to the width H. For example, if the multilayer structure is sliced with a dicing saw, the cutting edge of the dicing saw may have a thickness of about 100 μm. In that case, if the width H is set to be approximately 100 μm, the thickness of the cutting faces 140 may be approximately as large as the width H of the units.

Now, the next series of process steps to fabricate a secondary cell will be described with reference to FIG. 24.

After the multilayer structure 240 has been sliced into multiple units 230 as shown in FIGS. 24(a) and 24(b), the respective units 230 are rotated 90 degrees and arranged on another substrate 200 as shown in FIGS. 24(c) and 24(d). Those units 230 may be held by an automatic machine (robot, not shown) and may be arranged accurately at intended positions on the substrate 200.

The respective units 230 are arranged so that the stacking direction of the positive electrode active material 137, solid electrolyte 131, negative electrode active material 138, solid electrolyte 131, positive electrode active material 137, solid electrolyte 131, negative electrode active material 138, and solid electrolyte 131 becomes parallel to the upper surface of the substrate 200, and those multiple units 230 that are arranged side by side horizontally are coupled together.

Figure 25A:
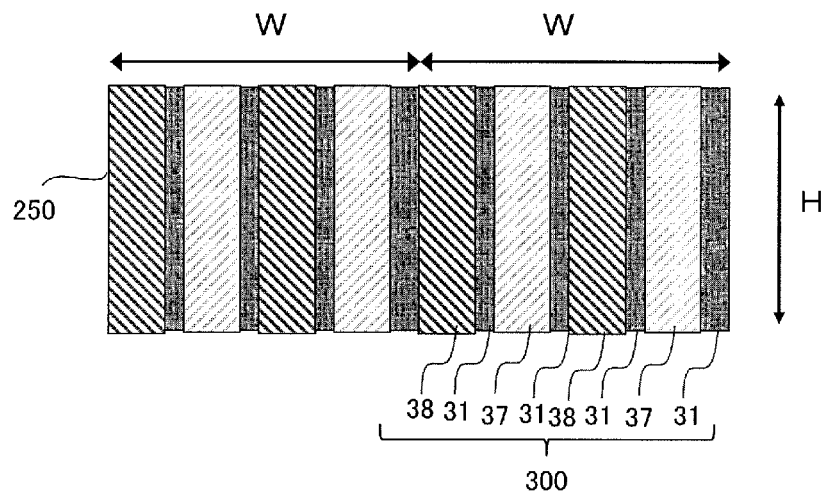
FIG. 25A A cross-sectional view illustrating a portion of a unit integrated body 250.
Figure 25B:
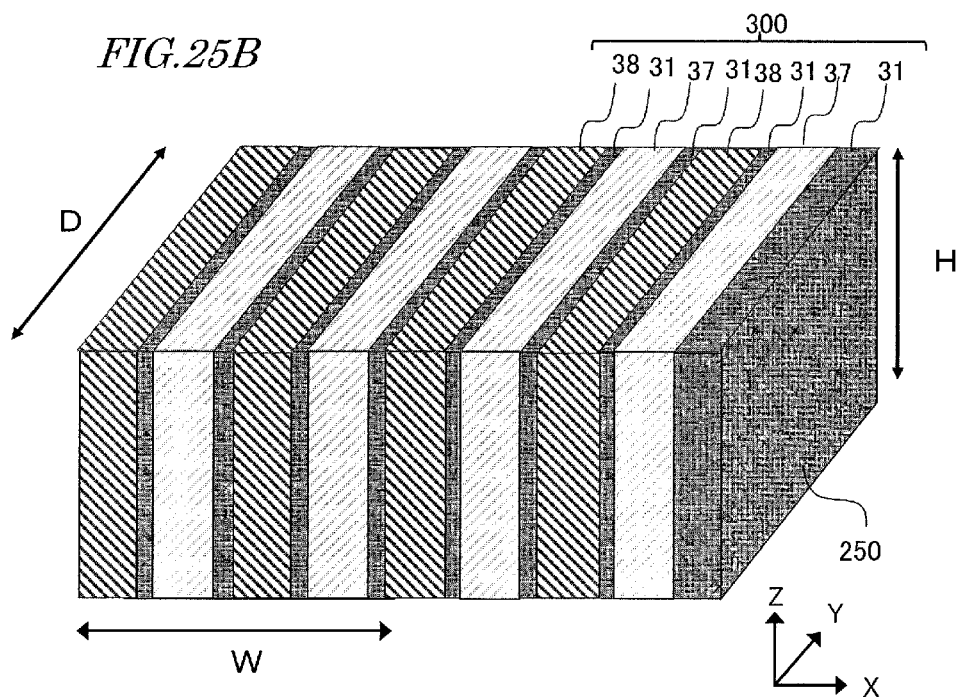
FIG. 25B A perspective view illustrating a portion of the unit integrated body 250.

In the unit integrated body (i.e., a set of multiple units) 250 thus obtained, each of those units 230 corresponds to the "periodic unit structure" of the secondary cell 30. And the positive electrode active material 137, solid electrolyte 131, and negative electrode active material 138 respectively correspond to the positive electrode layer 37, solid electrolyte 31 and negative electrode layer 38 of the periodic unit structure. FIGS. 25A and 25B are respectively a partial cross-sectional view and a partial perspective view of the unit integrated body 250. In FIG. 25B, D indicates the size of the multilayer structure 240 or the unit 230 as measured in the "depth direction (Y-axis direction)" in FIGS. 24 and 25A. D may be set to fall within the range of 10 μm to 10 mm, for example. In this example, D=500 μm and H=500 μm. Also, in this example, W=8 μm as described above, and the solid electrolyte 31, positive electrode layer 37 and negative electrode layer 38 each have a thickness (i.e., a size as measured in the X-axis direction) of 1 μm.

In FIG. 25A, the substrate 200 that supports the unit integrated body 250 is not illustrated. The unit integrated body 250 does not have to be supported by the substrate 200 but may also be temporarily held with another jig. Or in the unit integrated body 250, those units 230 may also be coupled together.

In this embodiment, each unit 230 may include any arbitrary number of positive electrode layers 37 or negative electrode layer 38. Even though each unit 230 includes two positive electrode layers 37 and two negative electrode layers 38 in the example illustrated in FIG. 24, each unit 230 may include a single positive electrode layer 37 and a single negative electrode layer 38 as well. Alternatively, each unit 230 may include three or more positive electrode layers 37 and three or more negative electrode layers 38 as well. Furthermore, the number of positive electrode layers 37 included in each unit 230 does not have to be the same as the number of negative electrode layers 38 included. For example, one unit 230 may include three positive electrode layers 37 and two negative electrode layers 38, but another unit 230 adjacent to the former unit 230 may include four positive electrode layers 37 and five negative electrode layers 38.

Figure 26:
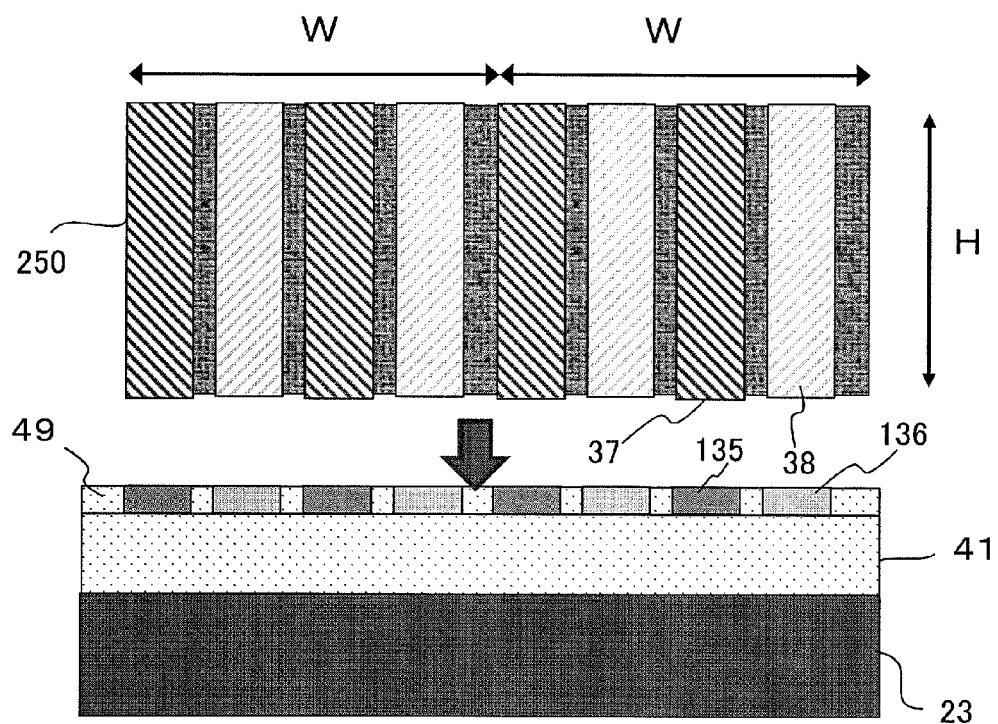
FIG. 26 A cross-sectional view illustrating how the unit integrated body 250 is arranged with respect to current collectors 135 and 136.
Figure 27:
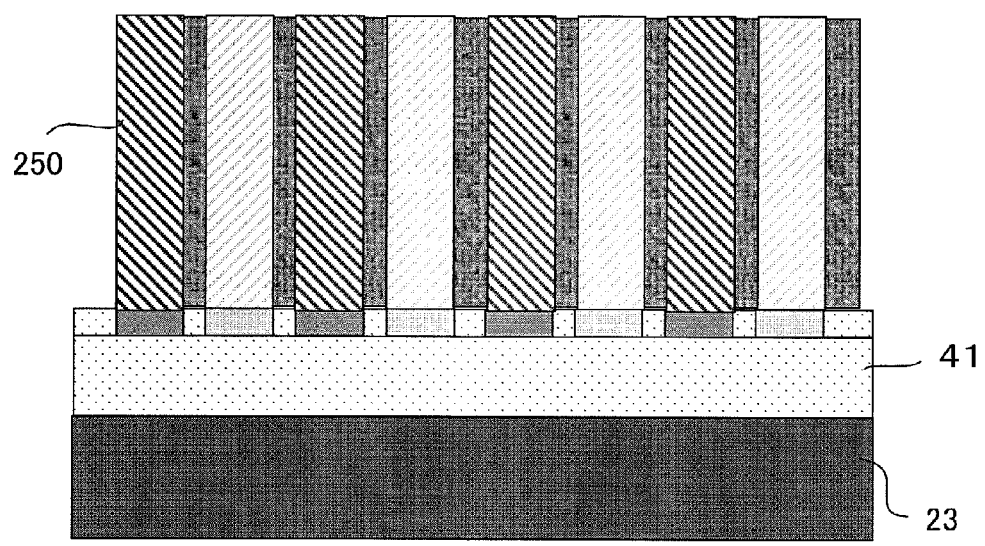
FIG. 27 A cross-sectional view illustrating how the unit integrated body 250 is connected to the current collectors 135 and 136.

Next, the unit integrated body 250 is mounted on the solar cell 20 on which the interconnect pattern shown in FIG. 22 has been formed. Specifically, as shown in FIGS. 26 and 27, the positive electrode layers 37 and negative electrode layers 38 of the unit integrated body 250 are electrically connected to the first and second current collectors 135 and 136, respectively. In this case, instead of mounting the unit integrated body 250 on the solar cell 20, the respective units 230 shown in FIG. 24(c) may be directly arranged on the solar cell 20.

As described above, the first and second current collectors 135 and 136 of this embodiment are alternately arranged in a predetermined direction on the surface of an electrical insulator (i.e., the interlayer dielectric film 41). The first current collectors 135 are arranged so as to be aligned with the positive electrode layers 37 of the unit integrated body 250. And the second current collectors 136 are arranged so as to be aligned with the negative electrode layers 38 of the unit integrated body 250. Such alignment can get done by determining the thicknesses of the respective layers that form the multilayer structure 240 shown in FIG. 23(c) according to the planar layout design of the first and second current collectors 135 and 136. Alternatively, the planar layout of the first and second current collectors 135 and 136 may also be designed according to the thicknesses of the respective layers that form the multilayer structure 240.

According to this embodiment, the ratio of the height of the positive electrode and negative electrode layers 37, 38 (i.e., their size H as measured in the Z-axis direction) to their thickness (i.e., their size as measured in the X-axis direction) can be set to be a relatively large value as shown in FIG. 26, for example. In this description, the ratio of the height of the positive electrode and negative electrode layers 37, 38 (i.e., their size H as measured in the Z-axis direction) to their thickness (i.e., their size as measured in the X-axis direction) is defined herein to be the "aspect ratio" of the electrode layers. According to this embodiment, the aspect ratio of the electrode layers can be set to fall within the range of 100 to 1000.

In the same way, the ratio of the width of the positive electrode and negative electrode layers 37, 38 (i.e., their size D as measured in the Y-axis direction) to their thickness (i.e., their size as measured in the X-axis direction) can also be set to be a relatively large value. In this description, the ratio of the depth of the positive electrode and negative electrode layers 37, 38 (i.e., their size D as measured in the Y-axis direction) to their thickness (i.e., their size as measured in the X-axis direction) is defined herein to be the "depth aspect ratio" of the electrode layers. According to this embodiment, the depth aspect ratio of the electrode layers can be set to fall within the range of 100 to 1000.

Although not shown, another conductive layer may be provided between the positive electrode and negative electrode layers 37, 38 and the first and second current collectors 135, 136. Such a conductive layer may be an anisotropic conductive adhesive layer, which can perform both the function of electrically connecting them together and the function of bonding them together. Optionally, in order to fix the unit integrated body 250 to the solar cell 20, the unit integrated body 250 may be bonded to the solar cell 20 in at least one portion, suitably in multiple portions.

Figure 28:
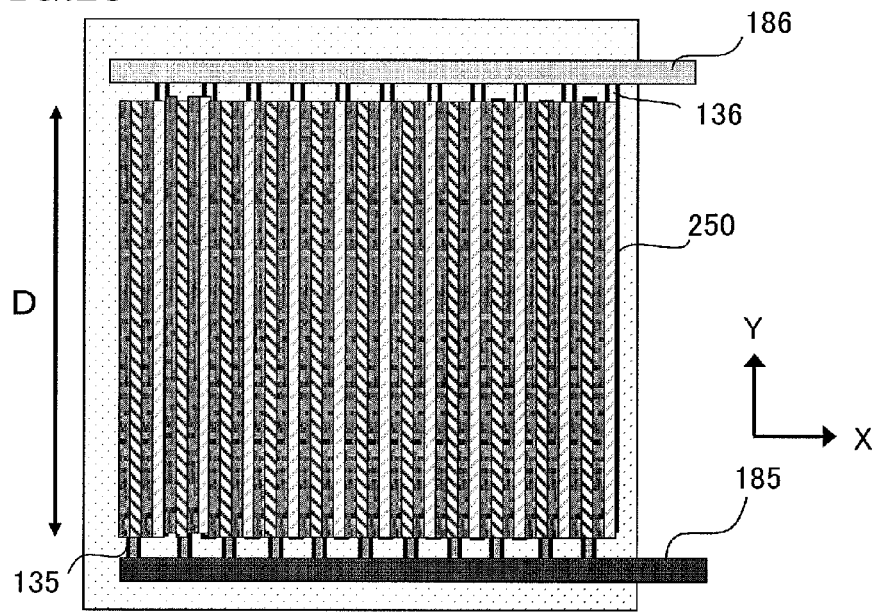
FIG. 28 A plan view illustrating a state where the unit integrated body 250 has been mounted on the solar cell.

FIG. 28 is a top view illustrating a state where the unit integrated body 250 has been mounted on the solar cell. As can be seen from FIG. 28, the unit integrated body 250 does not overlap with the first or second line 185, 186 but is arranged over the first and second current collectors 135 and 136 which run between the first and second lines 185 and 186. That is to say, the size D of the unit integrated body 250 as measured in the Y-axis direction is set according to this embodiment to be shorter than the interval between the first and second lines 185 and 186. In other words, the first and second lines 185 and 186 run in a predetermined direction so as to define a space between themselves, and the positive electrode and negative electrode layers 37 and 38 included in the unit integrated body 250 are located in the space interposed between the first and second lines 185 and 186 when viewed along a normal to the substrate.

Figure 29:
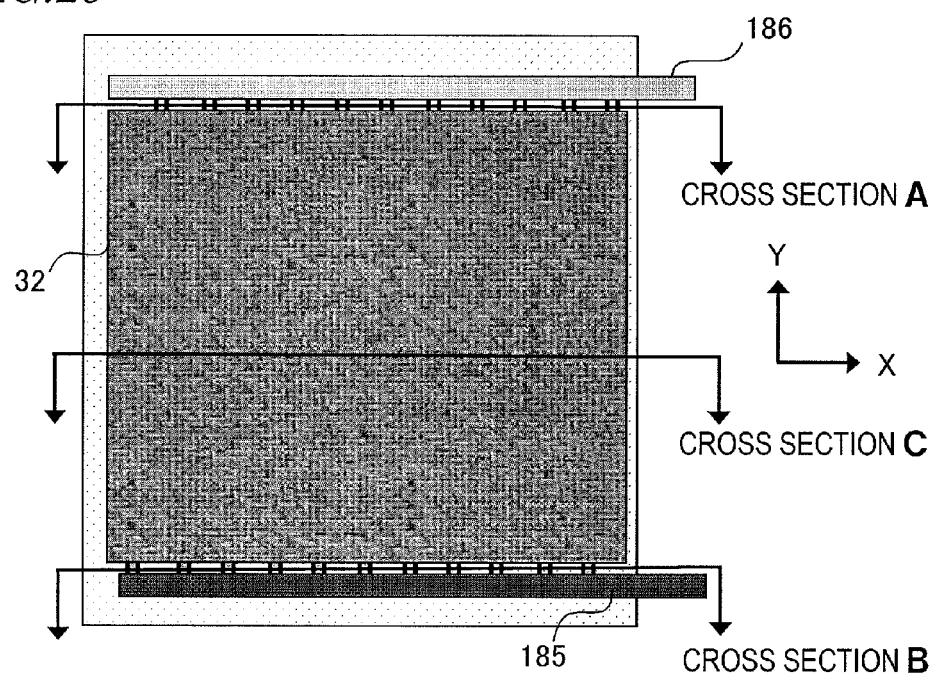
FIG. 29 A plan view illustrating a secondary cell in which a solid electrolyte has been deposited on the unit integrated body.
Figure 30:
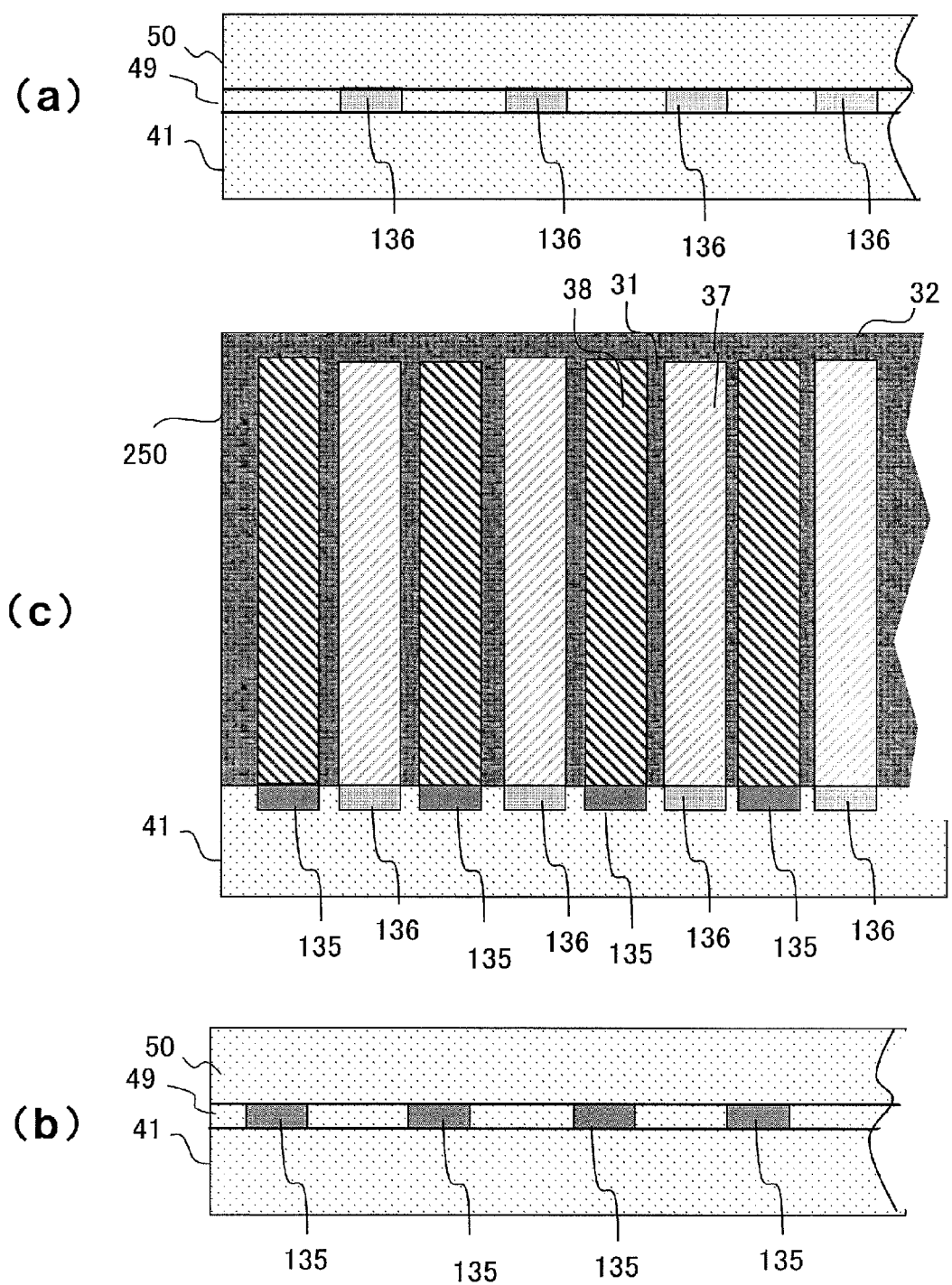
FIGS. 30 (a), (b) and (c) are partial cross-sectional views as viewed on the planes A, B, and C, respectively, shown in FIG. 29.

Next, in this embodiment, a solid electrolytic layer 32 is stacked on the unit integrated body 250 as shown in FIG. 29. Optionally, instead of covering the upper surface of the unit integrated body 250 with the solid electrolytic layer 32 in this manner, the unit integrated body 250 may also be covered with an insulating layer. FIGS. 30(a), 30(b) and 30(c) are partial cross-sectional views as viewed on the planes A, B, and C, respectively, shown in FIG. 29. In these cross-sectional views, illustration of the solar cell 20 is omitted for the sake of simplicity. As shown in FIGS. 30(a) and 30(b), in the area where the unit integrated body 250 is not present, the current collectors 135 and 136 are covered with an insulating layer 50, so are the first and second lines 185 and 186. Although not shown in FIG. 30(*c*), the upper surface of the unit integrated body 250 may also be covered with the insulating layer 50.

In this embodiment, the first and second lines 185, 186 and the first and second current collectors 135, 136 are all located on the same interlayer dielectric film 41. In other words, they have been formed on the same plane. Also, in this embodiment, the electrode layers 25 and 26 of the solar cell 20 are located under the interlayer dielectric film 41.

According to this embodiment, as in a capacitor for a highly integrated DRAM (dynamic random access memory), a large number of positive electrode layers 37 and negative electrode layers 38 can be densely integrated together within a limited area on the substrate. These positive electrode layers 37 and negative electrode layers 38 have a configuration in which a lot of thin flat plates are densely put together to stand side by side. Even though each of those positive electrode layers 37 and negative electrode layers 38 is a small one, those positive electrode and negative electrode layers 37, 38 can be integrated together as densely as in a capacitor for a DRAM. As a result, the capacity density can be increased. The configuration of the secondary cell 30 according to this embodiment is suitable for a device that needs a relatively small amount of current for a long time.

If one set consists of "positive electrode, electrolytic, negative electrode and electrolytic layers", then 100 or more sets of "positive electrode, electrolytic, negative electrode and electrolytic layers" can be integrated together on the same substrate. According to this embodiment, a single secondary cell 30 can be made by covering the square upper surface (with a length of 2.5 cm×a width of 2.5 cm and an area of 6.25 cm$^2$) of a substrate with 5000 sets of "positive electrode, electrolytic, negative electrode and electrolytic layers". The capacity density of such a secondary cell 30 rises proportionally to the height H of the unit integrated body 250. If a single secondary cell 30 is made up of 5000 units 230 using a material with a density of 0.065 mAh/cm$^2$ and if the height H of the unit integrated body 250 is set to be 1 mm, a capacity density of approximately 10 mAh/cm$^2$ can be achieved.

Embodiment 4

The multilayer structure 240 according to the present disclosure does not have to have the configuration shown in FIG. 23. FIG. 31(*a*) illustrates another exemplary configuration for the multilayer structure 240. Specifically, the multilayer structure 240 shown in FIG. 31(*a*) includes electrolytic walls 245 which are vertical to the substrate 100. The eight layers of the positive electrode active material 137 through the solid electrolyte 131 are stacked as in the multilayer structure 240 shown in FIG. 23.

After having been sliced, the solid electrolytic walls 245 shown in FIG. 31(*a*) will form the upper surface of the unit integrated body 250 as shown in FIG. 31(*b*).

Such solid electrolytic walls 245 may be obtained by cutting a plurality of through grooves that run parallel to each other through the eight-layer multilayer structure 240 that has been formed as shown in FIG. 23 and by filling those through grooves with a solid electrolyte. After that, when sliced, the multilayer structure 240 needs to be cut across the side surfaces of the solid electrolytic walls 245 as already described for the embodiments.

Embodiment 5

FIG. 32(*a*) illustrates still another exemplary configuration for the multilayer structure 240. In the multilayer structure 240 shown in FIG. 32(*a*), a metal layer 139 is embedded at the middle of the positive electrode active material 137 and at the middle of the negative electrode active material 138. According to this embodiment, multiple units 230 are made of such multilayer structures 240, thereby forming the unit integrated body 250 shown in FIG. 32(*b*).

In the unit integrated body 250 shown in FIG. 32(*b*), each of the positive electrode and negative electrode layers 37 and 38 includes the metal layer 139, which makes appropriate electrical contact with its associated current collector 135, 136. As a result, the electrical resistance of each of the positive electrode and negative electrode layers 137 and 138 can be reduced.

In this embodiment, to obtain the multilayer structure 240 shown in FIG. 32(*a*), a layer of some metal (such as aluminum) is deposited by sputtering, for example, at the middle of the positive electrode active material 137 or the negative electrode active material 138 in the process step of depositing the positive electrode active material 137 or the negative electrode active material 138. Aluminum does not form an alloy with a metallic ion species (such as Li) of the secondary cell.

Embodiment 6

According to the present disclosure, the secondary cell 30 does not have to be made by the method described above. Optionally, the secondary cell of the present disclosure may also be made by a manufacturing process which is generally used to fabricate a semiconductor integrated circuit device.

First of all, a solar cell, on which the interconnect pattern shown in FIG. 22 has been formed, is provided by the same method as what has been described above.

Figure 33:
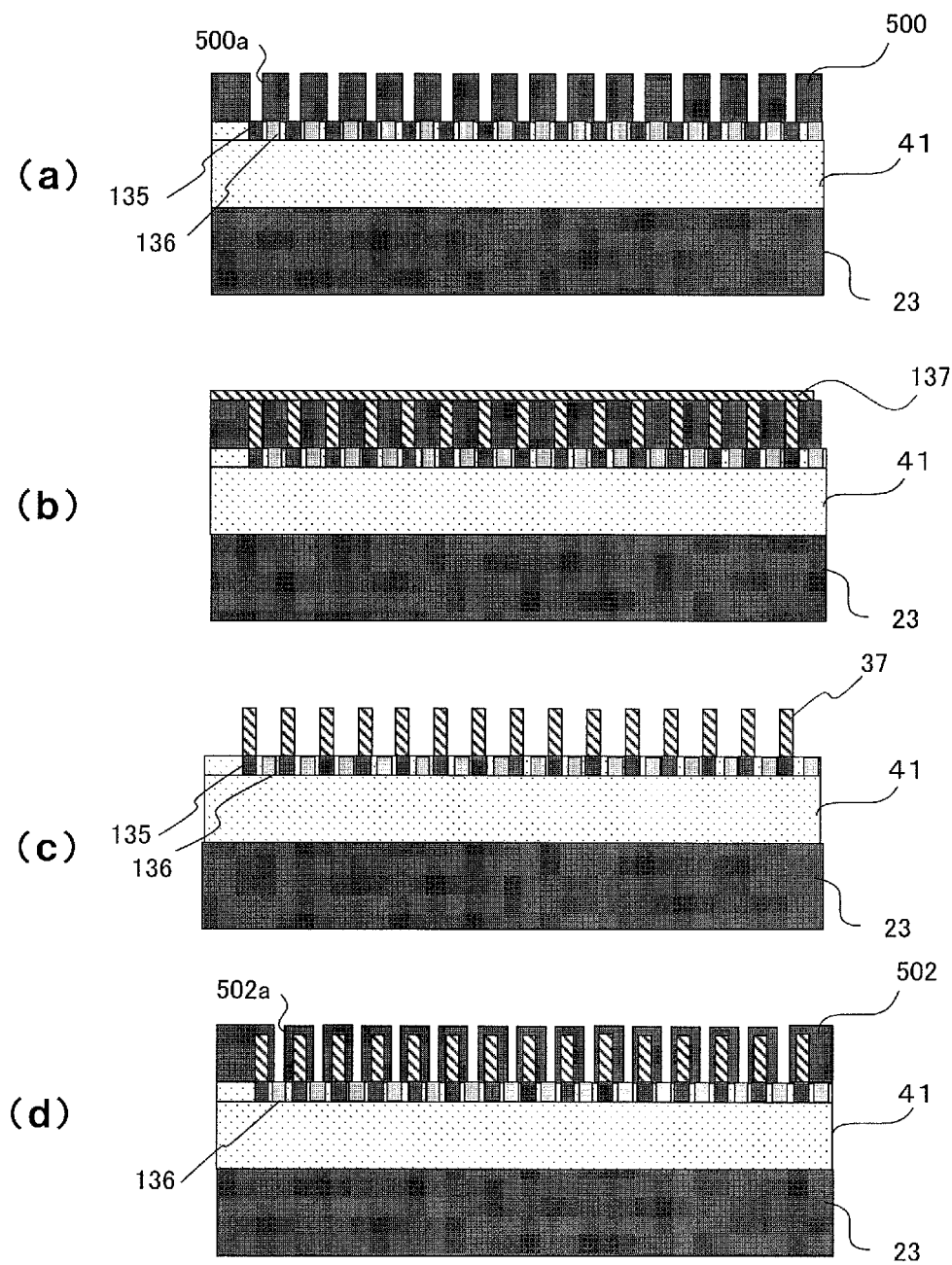
FIGS. 33 (a), (b), (c) and (d) are cross-sectional views illustrating another series of process steps to fabricate a solar secondary cell according to a sixth embodiment of the present disclosure.

Next, as shown in FIG. 33(*a*), the current collectors 135 and 136 on the substrate 23 are selectively covered with a resist mask 500, which has openings 500*a* that expose the first current collectors 135. The planar layout of the openings 500*a* corresponds to that of the first current collectors 135 shown in FIG. 22. Specifically, the resist mask 500 has a lot of openings 500*a* which are arranged periodically so as to form a striped pattern. The positions and shapes of those openings 500*a* define the positions and shapes of respective positive electrode layers 37 to form. The resist mask 500 may be formed to have an arbitrary planar shape by performing a known photolithographic process. The thickness of the resist mask 500 (i.e., the depth of the openings 500*a*) corresponds to the height of the positive electrode layers 37 to form.

Subsequently, as shown in FIG. 33(*b*), a positive electrode active material 137 is deposited on the resist mask 500 so as to fill the openings 500*a* of the resist mask 500. The positive electrode active material 137 may be deposited by sputtering, for example.

Then, as shown in FIG. 33(*c*), the resist mask 500 is removed. In this process step, as the excessive positive electrode active material 137 on the resist mask 500 is also removed by a lift-off process, only the positive electrode active material 137 that has filled the openings 500*a* of the resist mask 500 is left to form positive electrode layers 37.

Thereafter, as shown in FIG. 33(d), another resist mask 502 which covers the positive electrode layers 37 but which has openings 502a that expose the second current collectors 136 is made. The planar layout of the openings 502a corresponds to that of the second current collectors 136 shown in FIG. 22. Specifically, the resist mask 502 has a lot of openings 502a which are arranged periodically so as to form a striped pattern. The positions and shapes of those openings 502a define the positions and shapes of respective negative electrode layers 38 to form. The resist mask 502 may be formed to have an arbitrary planar shape by performing a known photolithographic process. The thickness of the resist mask 502 (i.e., the depth of the openings 502a) corresponds to the height of the negative electrode layers 38 to form.

Subsequently, as shown in FIG. 34(a), a negative electrode active material 138 is deposited on the resist mask 502 so as to fill the openings 502a of the resist mask 502. The negative electrode active material 138 may be deposited by sputtering, for example.

Then, as shown in FIG. 34(b), the resist mask 502 is removed. In this process step, as the excessive negative electrode active material 138 on the resist mask 502 is also removed by a lift-off process, only the negative electrode active material 138 that has filled the openings 502a of the resist mask 502 is left to form negative electrode layers 38, which become larger (or taller) than the positive electrode layers 37.

Once the positive electrode layers 37 and negative electrode layers 38 get exposed, a solid electrolyte 131 is deposited over the substrate 23 by sputtering as shown in FIG. 34(c). In this process step, the gaps between the positive electrode layers 37 and the negative electrode layers 38 are filled with the electrolyte. In addition, an electrolytic layer 31 made of the solid electrolyte 131 is also formed on the positive electrode layers 37 and the negative electrode layers 38.

Although the positive electrode layers 37 are supposed to be formed earlier in this embodiment, the negative electrode layers 38 may be formed earlier instead. In that case, the positive electrode layers 37 to be formed later will be taller. That is to say, either the positive electrode layers 37 or the negative electrode layers 38 which should be taller than the other type may be formed later than the other type.

Embodiment 7

According to the present disclosure, the positive electrode layers 37 and negative electrode layers 38 have only to project away from an insulating layer on which interconnect patterns have been formed, and do not have to project perpendicularly from the insulating layer.

Figure 35:
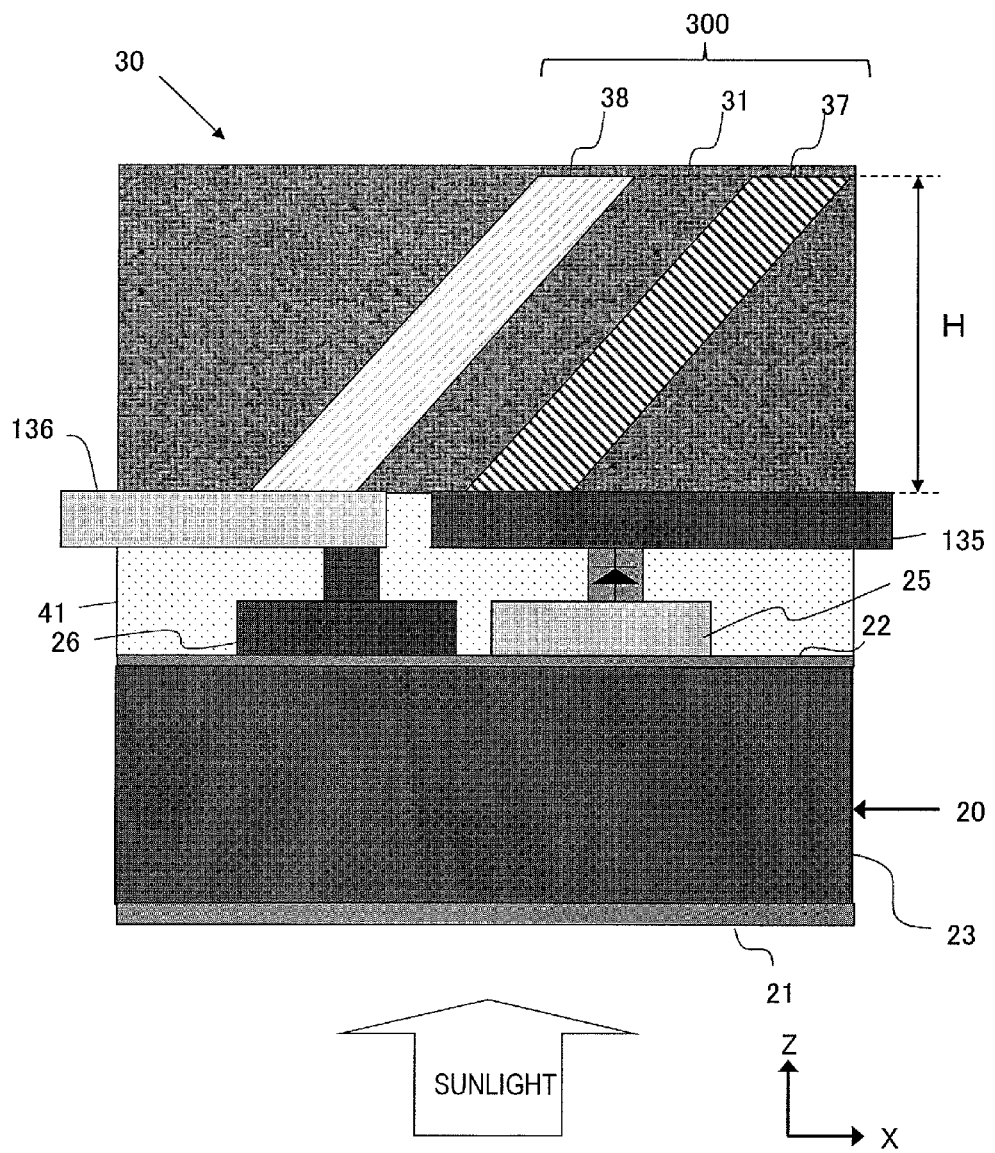
FIG. 35 A plan view illustrating a solar cell according to a seventh embodiment of the present disclosure.

As shown in FIG. 35, in a solar secondary cell according to this embodiment, the positive electrode layers 37 and negative electrode layers 38 are tilted.

Figure 36:
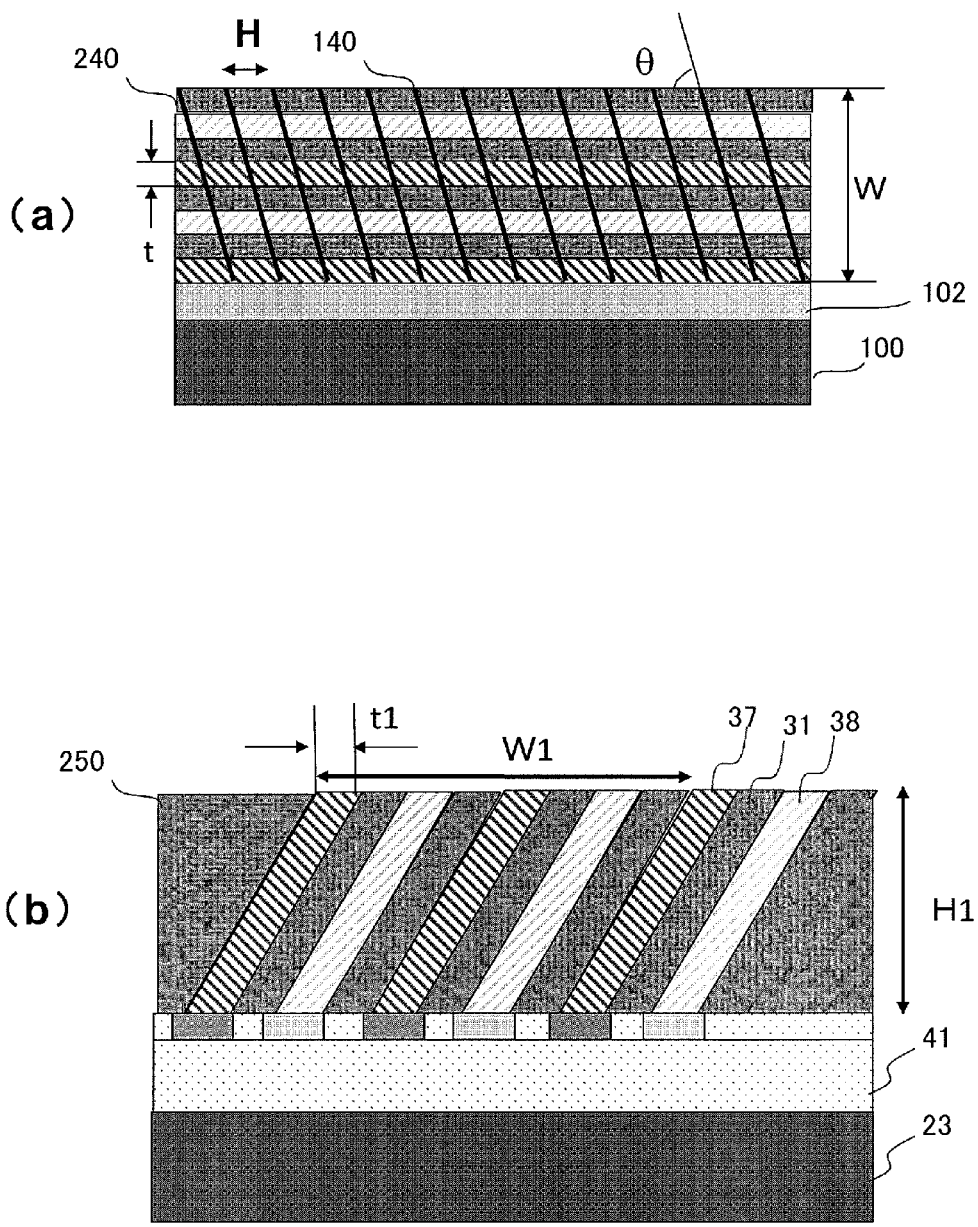
FIG. 36 (a) is a cross-sectional view illustrating an exemplary configuration for a multilayer structure 240 according to the seventh embodiment and (b) is a cross-sectional view illustrating a configuration for a unit integrated body 250 that has been formed out of the multilayer structure 240.

Now look at FIG. 36 next. FIG. 36(a) illustrates the cut faces 140 of the multilayer structure 240, which itself has the same configuration as what is shown in FIG. 23(c). In this embodiment, this multilayer structure 240 is not cut perpendicularly to the principal surface of the substrate 100 but is cut at an angle θ which is not equal to 90 degrees. Those units obtained by cutting may be positioned and arranged on the interconnect patterns just as already described for the embodiments.

According to this method, a secondary cell section which has a structure in which the positive electrode layers 37 and negative electrode layers 38 run obliquely can be obtained.

The thickness t of each of these layers that form this multilayer structure and the thickness t1 of each of multiple layers that form the unit integrated body 250 satisfy the relation t1=t×1/cos θ. The widths W1 and W shown in FIG. 36 satisfy the relation W1=W×1/cos θ. And the heights H1 and H shown in FIG. 36 satisfy the relation H1=H×sin θ.

Embodiment 8

Each of the embodiments described above is a solar secondary cell in which the solar cell 20 and the secondary cell 30 are combined together. However, a secondary cell according to the present disclosure can also be used independently of the solar cell 20.

Figure 37:
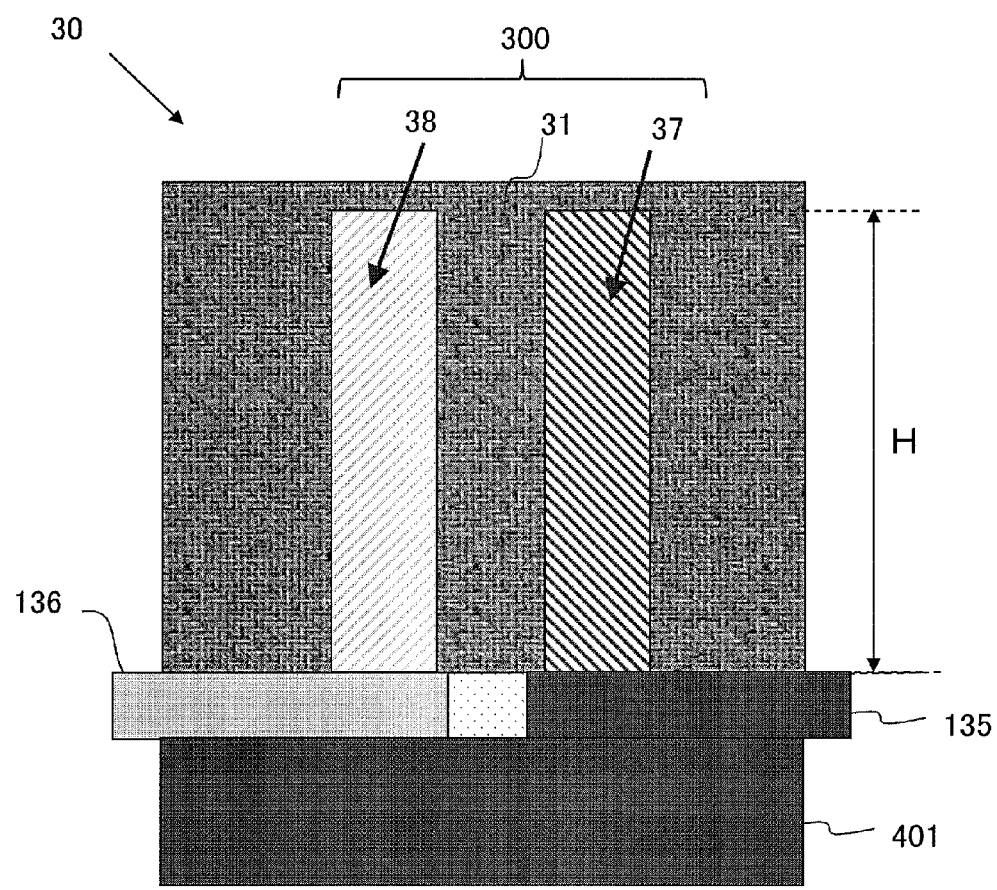
FIG. 37 A cross-sectional view illustrating the configuration of a secondary cell according to an eighth embodiment of the present disclosure.

FIG. 37 is a schematic cross-sectional view illustrating the configuration of a secondary cell 30 according to this embodiment in a simplified form.

On an insulating substrate 401, arranged are a first current collector layer 135 and a second current collector layer 136, on which located are a positive electrode layer 37 and a negative electrode layer 38, respectively. The positive electrode layer 37 and the negative electrode layer 38 face each other with a solid electrolyte 31 interposed between them. These members may be encapsulated with a resin (not shown). Alternatively, they may also be encapsulated with a glass material, for example, instead of the resin.

The positive electrode layer 37, negative electrode layer 38 and solid electrolyte 31 have the same configurations as their counterparts 37, 38 and 31 included in the secondary cell according to any of the embodiments described above.

The positive electrode layer 37, negative electrode layer 38 and solid electrolyte 31 are stacked in a direction which is parallel to the principal surface of the substrate 401. The substrate 401 does not have to be made of an insulating material in its entirety. Alternatively, the substrate 401 may have a structure including a substrate made of either a conductive material or a semiconductor material and an insulating layer deposited on the principal surface of that substrate. For example, a silicon dioxide film may be deposited on an n-type silicon substrate and an interconnect pattern including the current collectors 135 and 136 may be formed on the silicon dioxide film. Or the silicon substrate may be replaced with a substrate of a wide bandgap semiconductor such as silicon carbide (SiC) or gallium nitride (GaN). On each of these substrates, an integrated circuit and/or power elements (not shown) may be formed.

Figure 38:
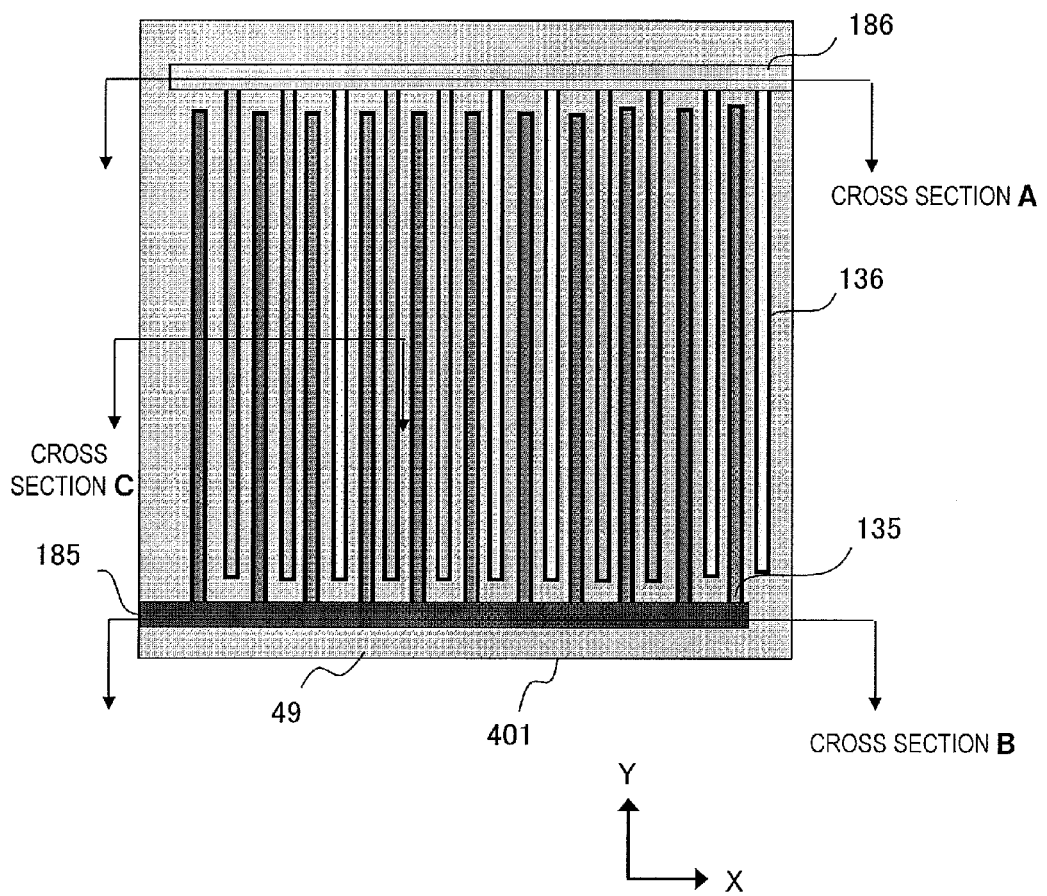
FIG. 38 A plan view illustrating an interconnect pattern arranged on the substrate 401.
Figure 39:
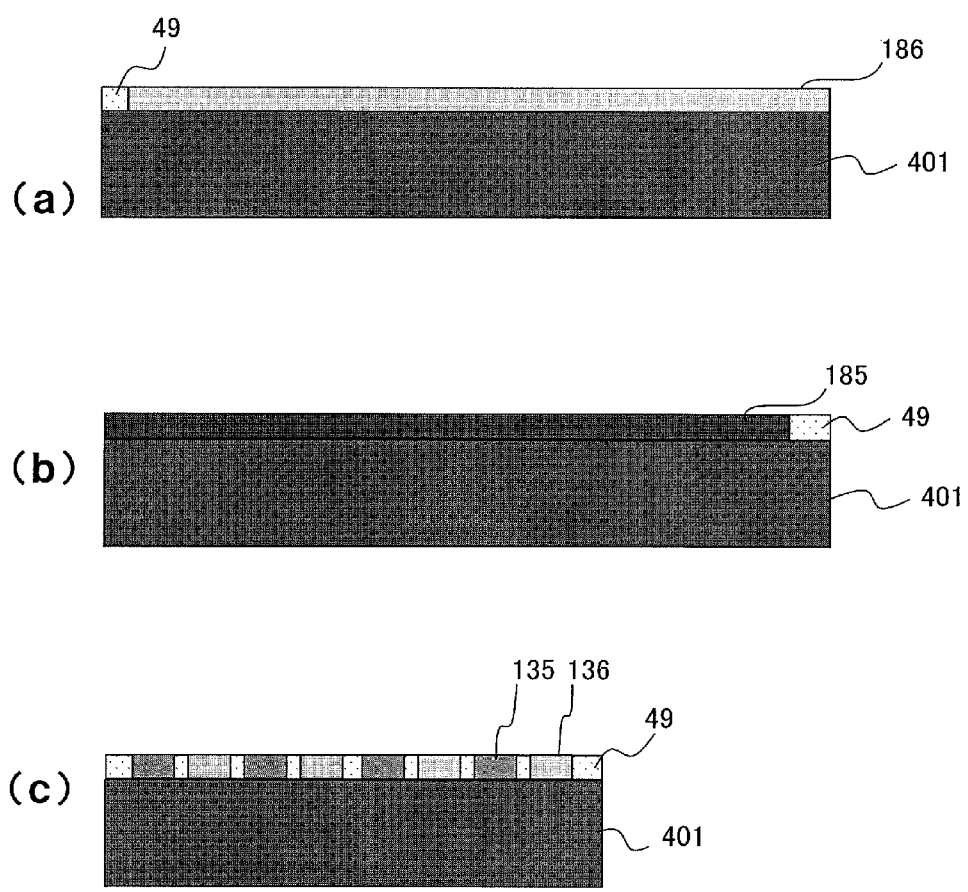
FIGS. 39 (a), (b) and (c) are cross-sectional views as respectively viewed on the planes A, B and C shown in FIG. 38.

FIG. 38 is a plan view illustrating an interconnect pattern for the secondary cell according to this embodiment. In FIG. 38, illustrated are a plurality of first current collectors 135 and a plurality of second current collectors 136, which run in the Y-axis direction and which are arranged periodically in the X-axis direction, and first and second lines 185 and 186 which run in the X-axis direction. FIGS. 39(a), 39(b) and 39(c) are partial cross-sectional views as viewed on the planes A, B and C shown in FIG. 38. Illustration of the unit integrated body is omitted for the sake of simplicity.

As shown in FIG. 38, the first current collectors 135 are connected together via the first line 185, and the second current collectors 136 are connected together via the second line 186. The first and second lines 185 and 186 according to this embodiment function as so-called "extended lines". The gaps between the first current collectors 135, first line 185, second current collectors 136 and second line 186 are filled with an insulating layer 49.

The first current collectors 135 and first line 185 may be made of the same material such as aluminum (or an aluminum alloy). Likewise, the second current collectors 136 and second line 186 may be made of the same material such as nickel (or a nickel alloy). As such an interconnect pattern material, any suitable conductive material may be selected appropriately according to the materials of the positive electrode layers 37 and the negative electrode layers 38.

Figure 40:
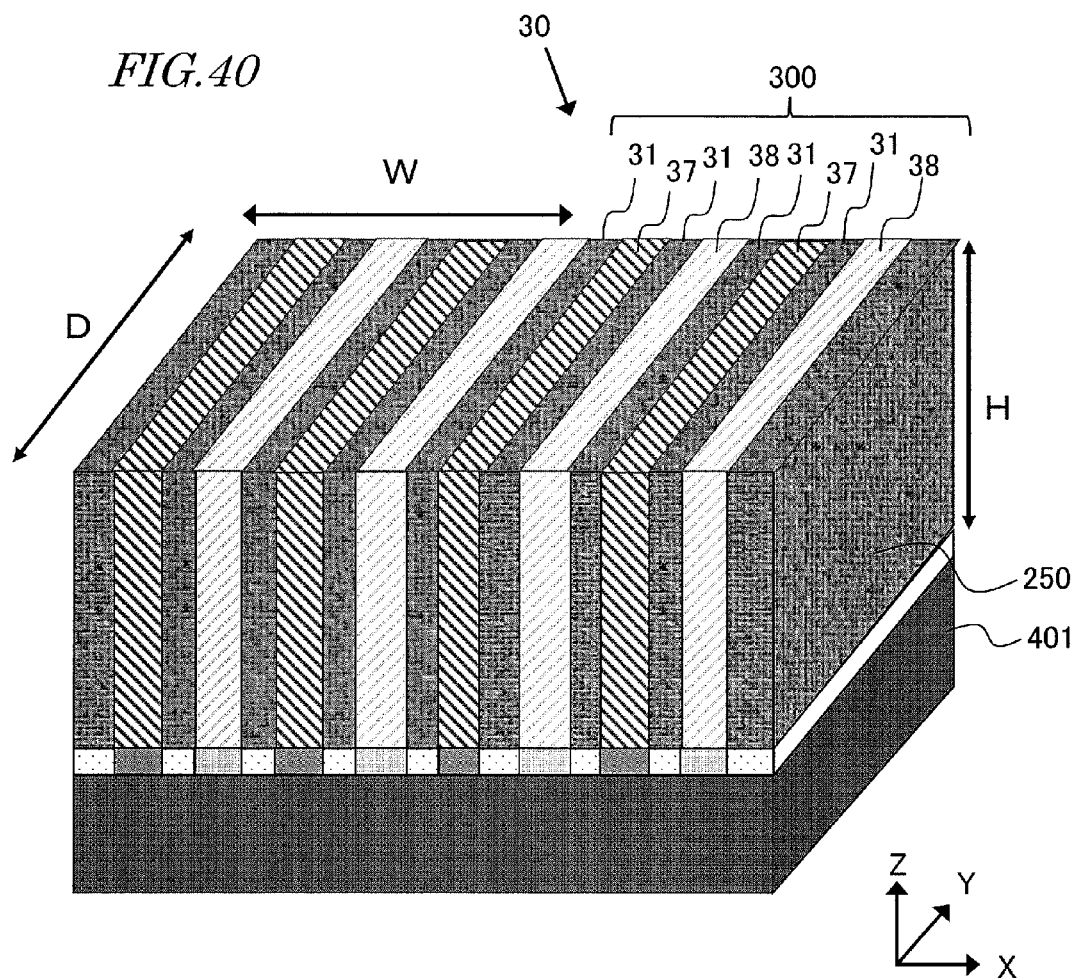
FIG. 40 A perspective view illustrating a configuration for a secondary cell according to the eighth embodiment of the present disclosure.

By mounting any of various unit integrated bodies 250 described above on the substrate 401 on which such an interconnect pattern has been formed, a secondary cell 30 with the configuration shown in FIG. 40 can be obtained. The secondary cell 30 thus obtained comes to have a configuration in which each positive electrode layer 37 is sandwiched between two solid electrolytes 31, each negative electrode layer 38 is also sandwiched between two solid electrolytes 31, the positive electrode layers 37 are electrically connected to the first current collectors 135 located under themselves, and the negative electrode layers 38 are electrically connected to the second current collectors 136 located under themselves.

Figure 34:
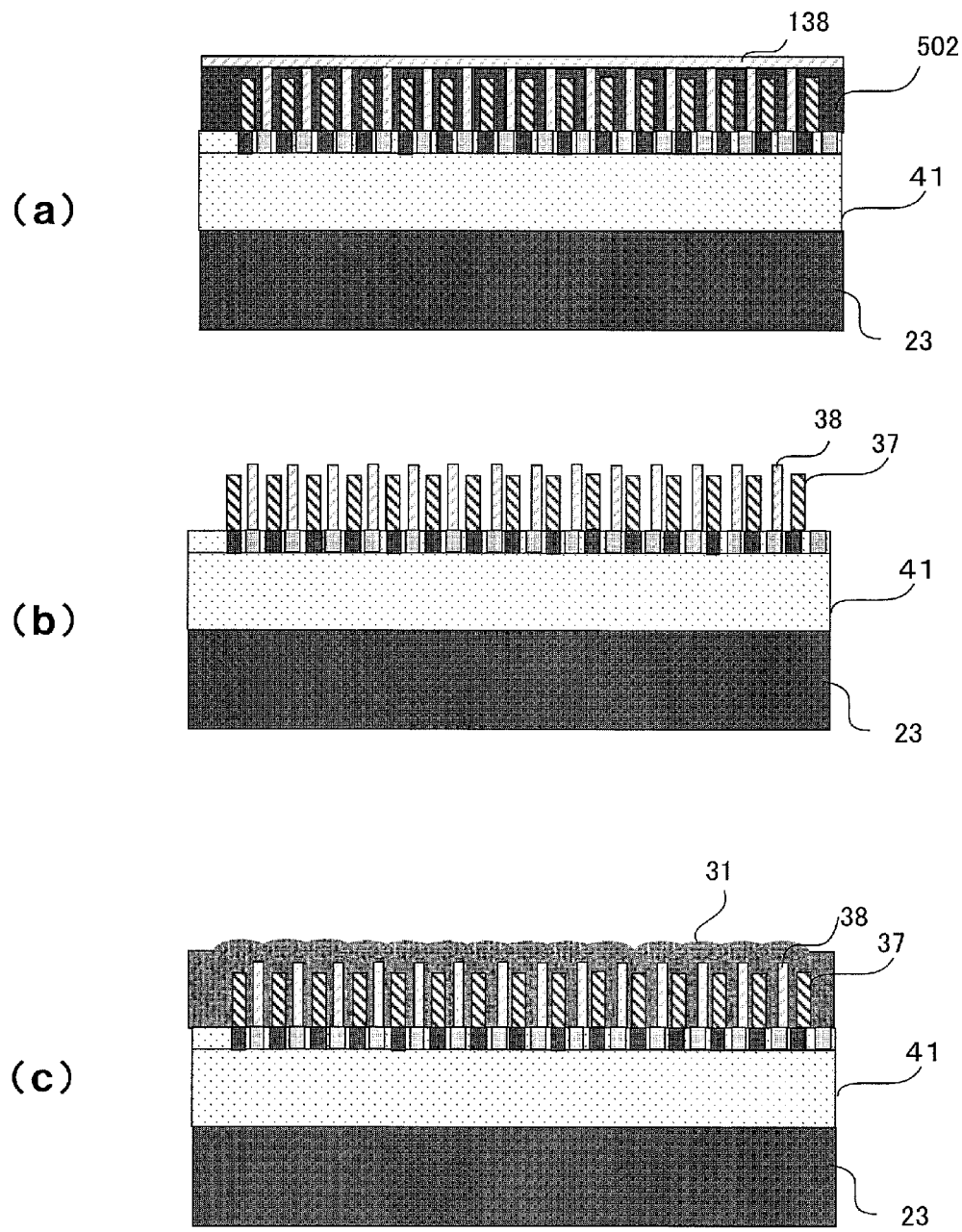
FIGS. 34 (a), (b), and (c) are cross-sectional views illustrating the next series of process steps to fabricate a solar secondary cell according to the sixth embodiment of the present disclosure.

Also, the positive electrode layers 37, negative electrode layers 38 and solid electrolytic layers 31 shown in FIG. 40 can be formed on the substrate 401 by the manufacturing process that has been described with reference to FIGS. 33 through 34.

The secondary cell 30 of this embodiment may have the same configuration as the secondary cell 30 of the solar secondary cell described above.

It should be noted that the substrate 401 itself does not have to have rigidity and strength that are high enough to make the substrate 401 stand by itself. If another member that supports the unit integrated body 250 is arranged either on the other side of the unit integrated body 250 opposite from the substrate 401 or on a side surface of the unit integrated body 250, the electrical insulator that supports the interconnect pattern does not have to be such a substrate with high strength and rigidity but may also be a relatively thin insulating film or insulating layer as well.

Embodiment 9

Figure 41:
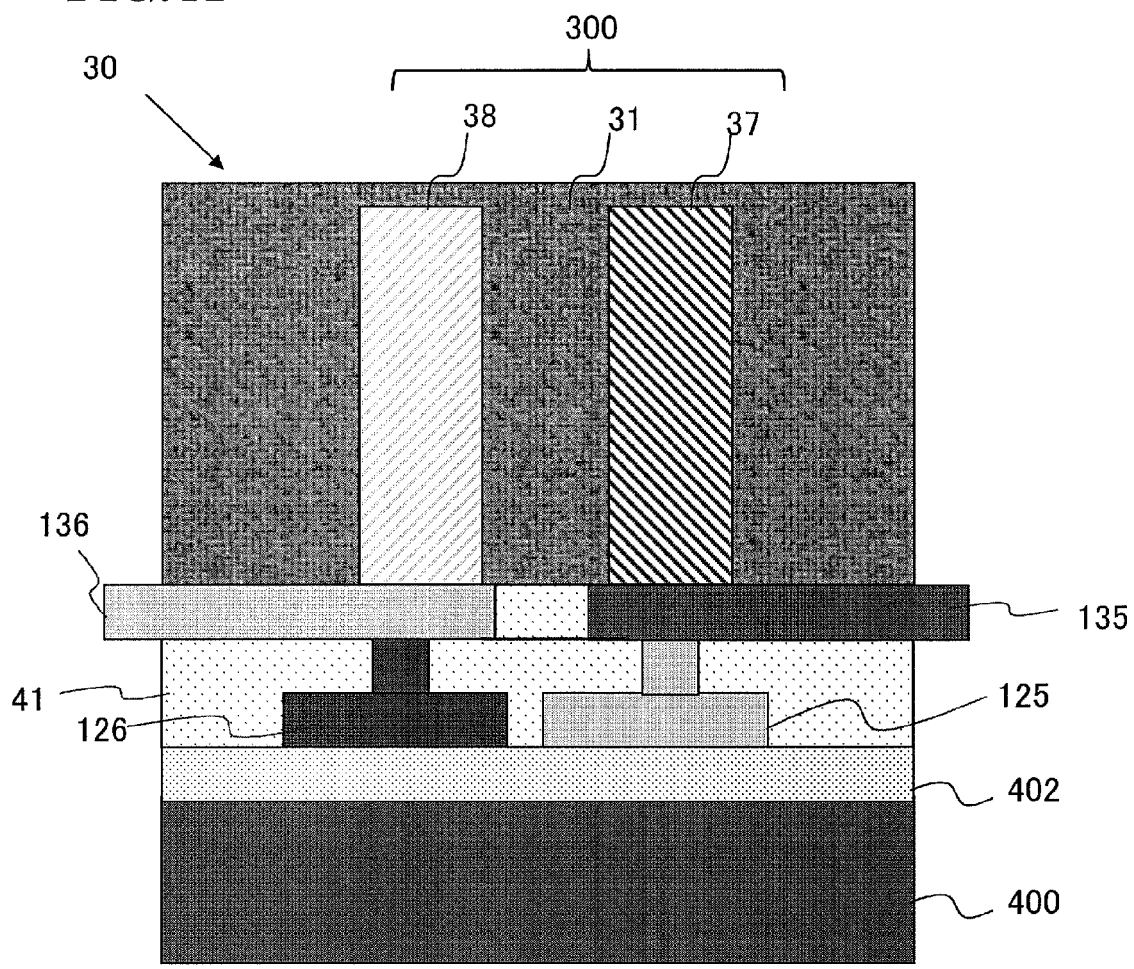
FIG. 41 A cross-sectional view illustrating a configuration for a secondary cell according to a ninth embodiment of the present disclosure.

FIG. 41 illustrates an exemplary configuration including lines 125 and 126 which are located under the first current collectors 135 and second current collectors 136 (such lines will be referred to herein as "lower lines"). A secondary cell 30 according to this embodiment includes, as a substrate structure with the lower lines 125 and 126, a semiconductor substrate 400 and an insulating layer 402 which covers the principal surface of the semiconductor substrate 400. As described above, the semiconductor substrate 400 with the insulating layer 402 may be replaced with an insulating substrate. If such a semiconductor substrate 400 is used, however, a controller and other electric circuits that need to be provided to make the secondary cell 300 operate properly can be integrated together on the semiconductor substrate 400. If such electric circuits are formed on the semiconductor substrate 400, some of those electric circuits may be connected to the lines 125 and 126.

Figure 42:
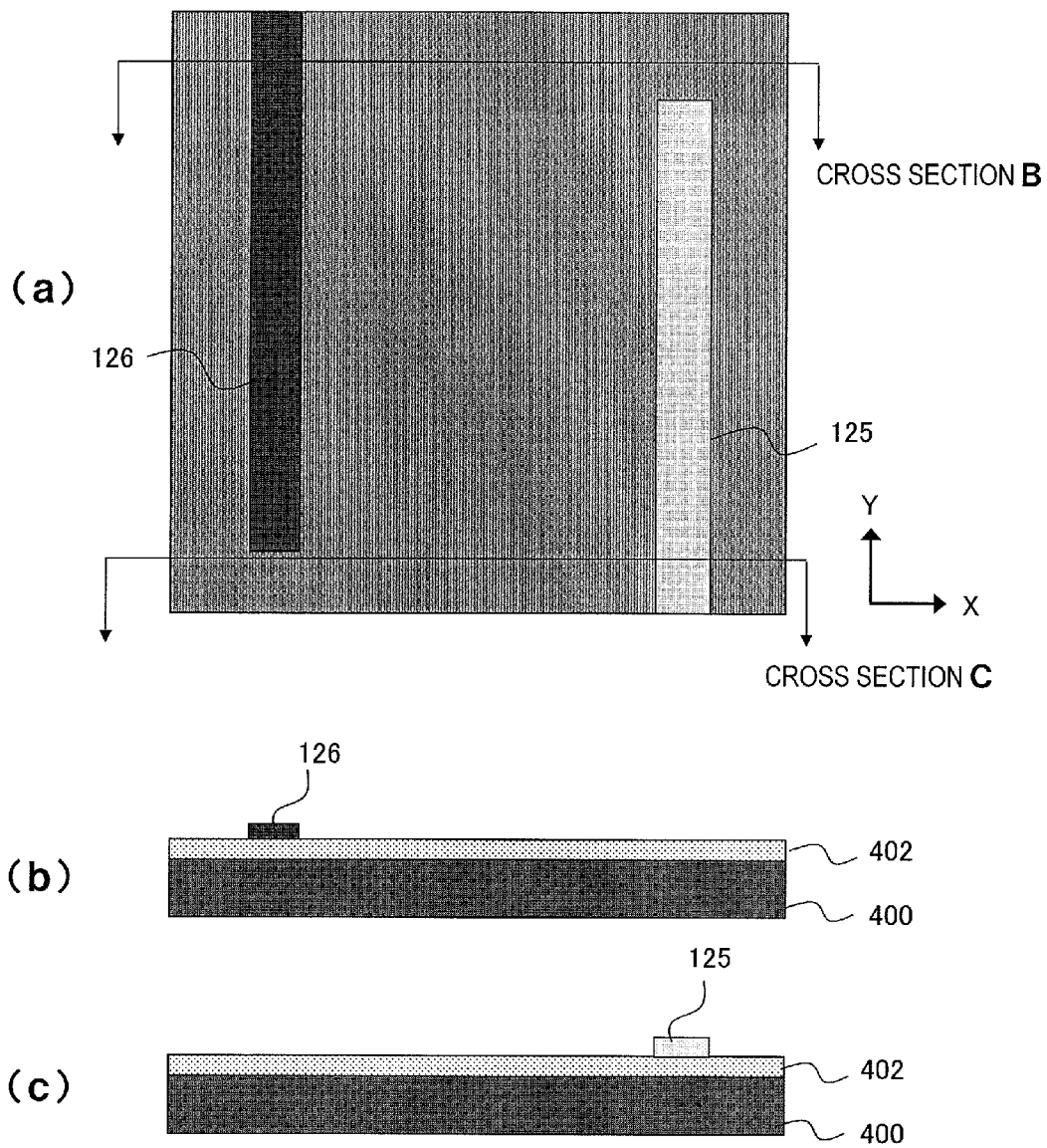
FIG. 42 (a) is a top view of a secondary cell being fabricated and (b) and (c) are cross-sectional views as respectively viewed on the planes B and C shown in (a).

Hereinafter, an exemplary method of making such a secondary cell 30 will be described with reference to FIGS. 42 through 45. FIG. 42(*a*) is a plan view illustrating a process step. FIGS. 42(*b*) and 42(*c*) are cross-sectional views as respectively viewed on the planes B and C shown in FIG. 42(*a*). The same statement will apply to FIGS. 43 through 45, too.

First of all, look at FIGS. 42(*a*), 42(*b*) and 42(*c*). In this stage, an insulating layer 402 of silicon dioxide, for example, is formed on a semiconductor substrate 400 of single crystal silicon, for example. Such an insulating layer 402 may be formed by thermal oxidation process, CVD process, or sputtering process. Next, a first lower line (positive electrode line) 125 and a second lower line (negative electrode line) 126 are formed on the insulating layer 402. These lower lines 125 and 126 perform the function of carrying electric charges to the positive electrode layers 37 and negative electrode layers 38 of the secondary cell 30.

Figure 43:
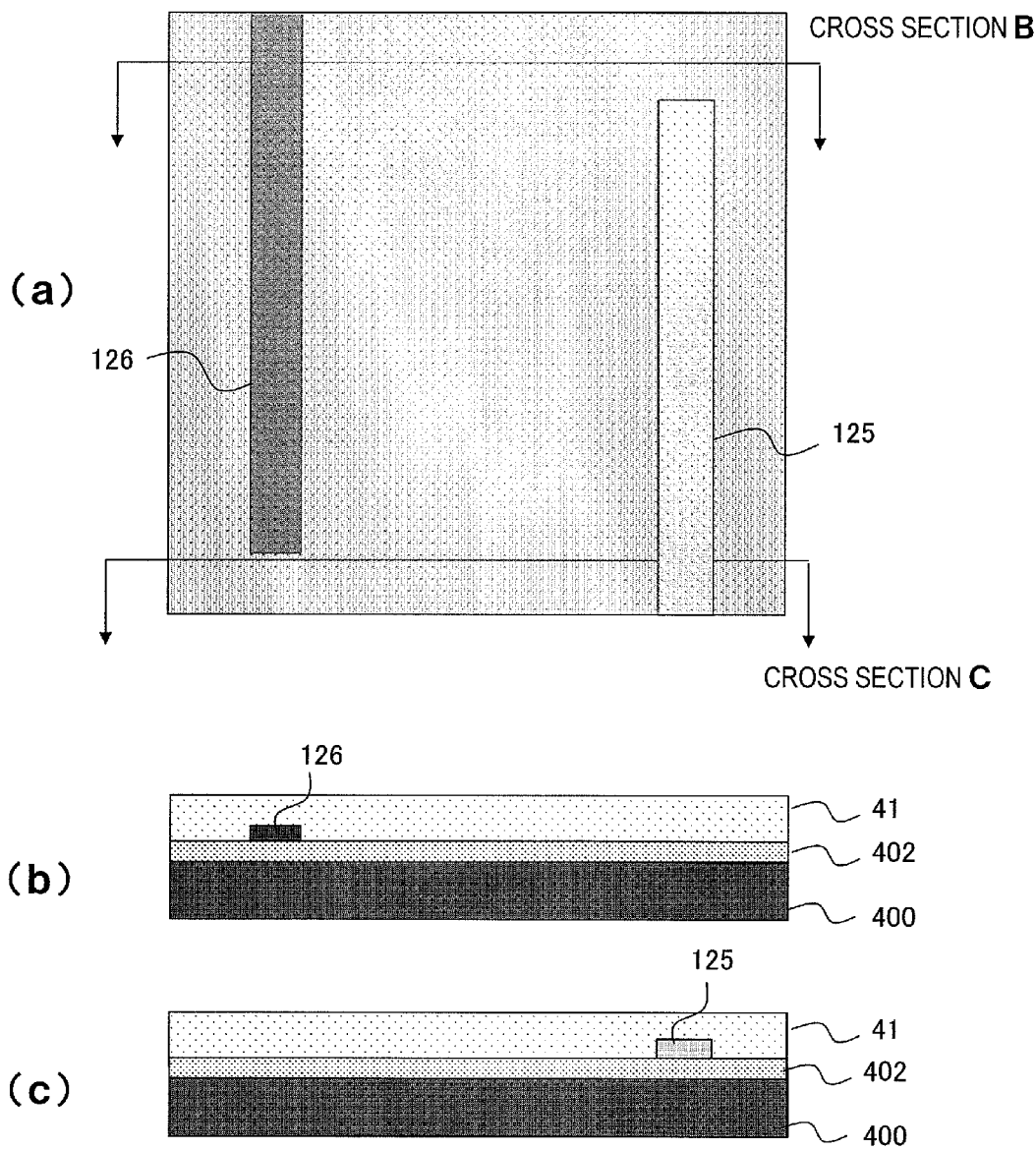
FIG. 43 (a) is a top view of a lower line structure being fabricated and (b) and (c) are cross-sectional views as respectively viewed on the planes B and C shown in (a).
Figure 44:
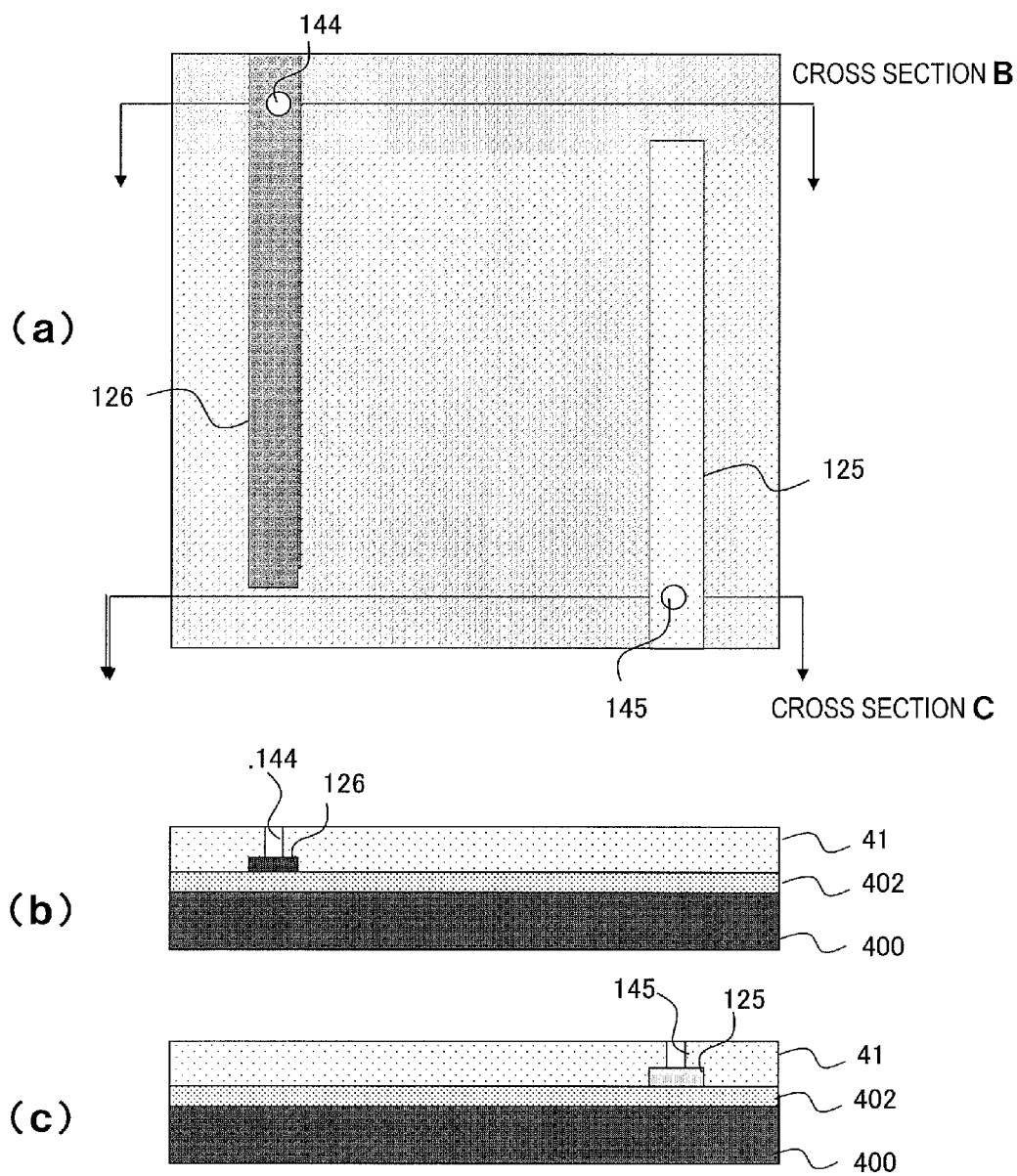
FIG. 44 (a) is a top view of a lower line structure being fabricated and (b) and (c) are cross-sectional views as respectively viewed on the planes B and C shown in (a).

Next, look at FIGS. 43(*a*), 43(*b*) and 43(*c*). In this stage, an interlayer dielectric film 41 is deposited over the first and second lower lines 125 and 126. Thereafter, as shown in FIGS. 44(*a*), 44(*b*) and 44(*c*), contact holes 144 and 145 are made through the interlayer dielectric film 41 to reach the first and second lower lines 125 and 126, respectively.

Figure 45:
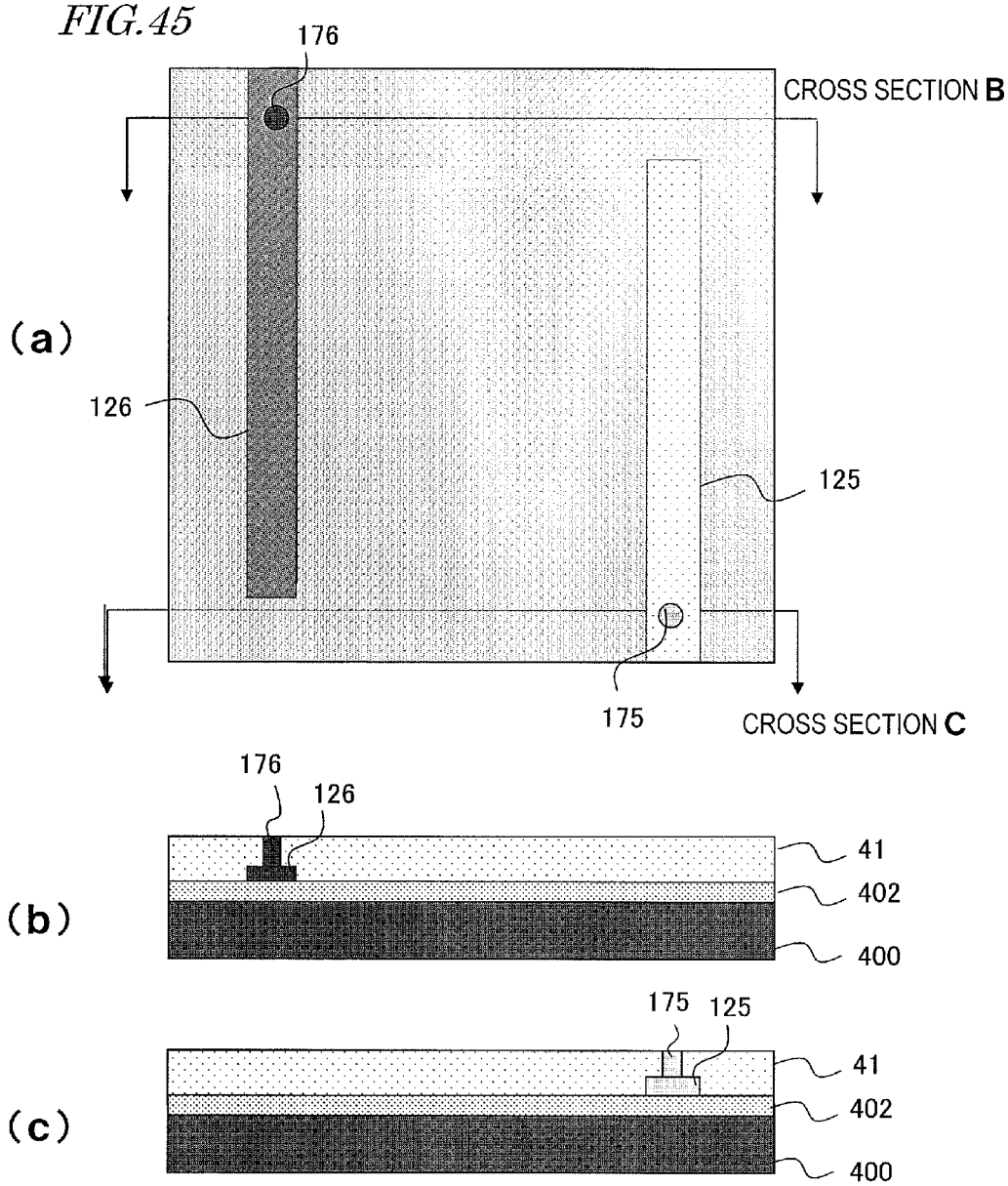
FIG. 45 (a) is a top view of a lower line structure being fabricated and (b) and (c) are cross-sectional views as respectively viewed on the planes B and C shown in (a).
Figure 46:
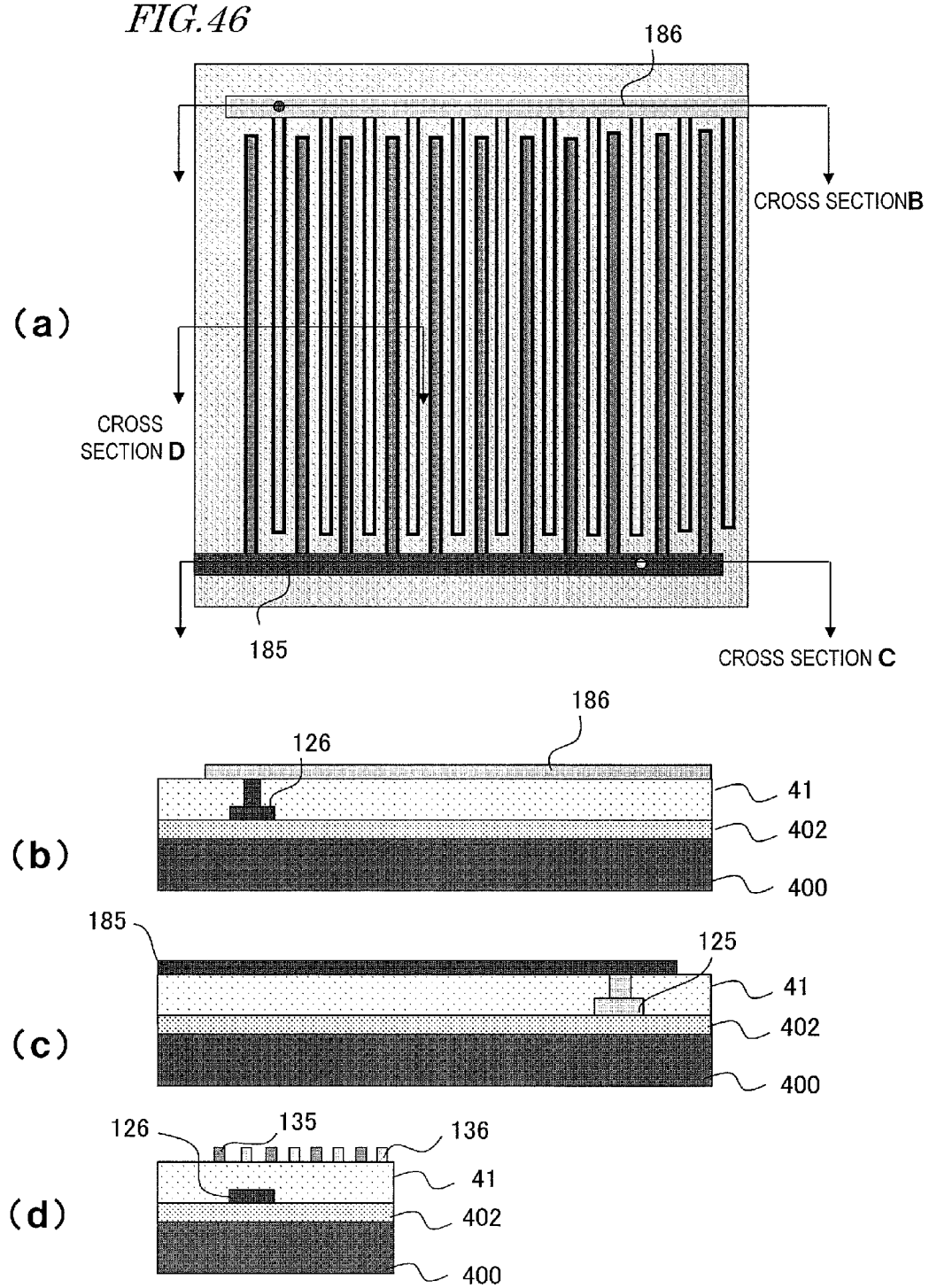
FIG. 46 (a) is a top view of a lower line structure being fabricated and (b), (c) and (d) are cross-sectional views as respectively viewed on the planes B, C and D shown in (a).

Subsequently, as shown in FIGS. 45(*a*), 45(*b*) and 45(*c*), the contact holes 144 and 145 are filled with a metal. Thereafter, as shown in FIG. 46, first current collectors 135, a first line 185, second current collectors 136 and a second line 186 are formed on the interlayer dielectric film 141. The first and second lines 185 and 186 are electrically connected to the first and second lower lines 125 and 126, respectively, via the metal contacts. FIG. 46(*d*) is a cross-sectional view as viewed on the plane D shown in FIG. 46(*a*). As shown in FIG. 46(*d*), the second lower line 126 is located under the first and second current collectors 135 and 136.

Figure 47:
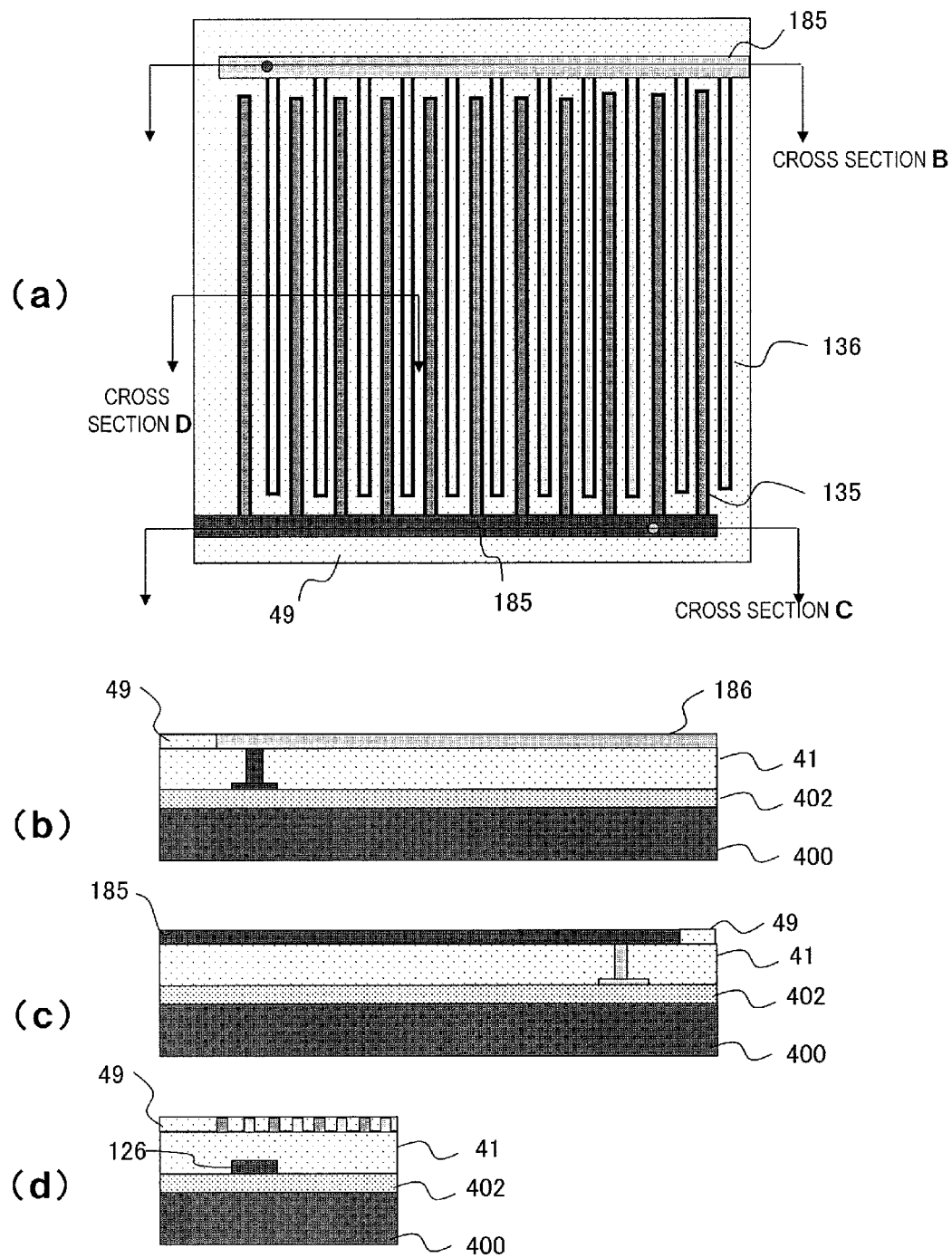
FIG. 47 (a) is a top view of a lower line structure being fabricated and (b), (c) and (d) are cross-sectional views as respectively viewed on the planes B, C and D shown in (a).
Figure 48:
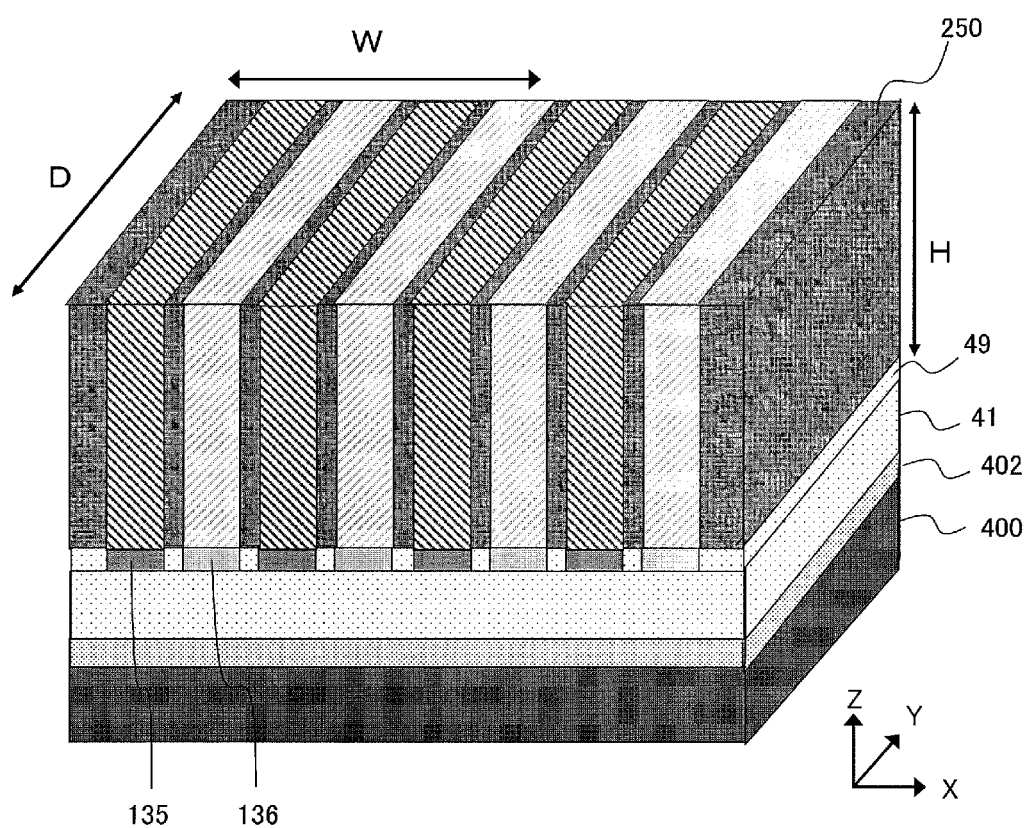
FIG. 48 A perspective view illustrating a configuration for a secondary cell according to a ninth embodiment of the present disclosure.

Then, the gaps between the first current collectors 135, first line 185, second current collectors 136 and second line 186 are filled with an insulating layer 49 as shown in FIG. 47, and then the structure thus obtained is combined with a unit integrated body 250, thereby completing the secondary cell shown in FIG. 48.

In this embodiment, the first and second lower lines 125 and 126 are arranged on the substrate 400 as shown in FIG. 42. However, not only these lines 125 and 126 but also other additional lines or circuits may be arranged on the substrate 400 as well. For example, a diode may be inserted in series to the middle of at least one of the first and second lower lines 125 and 126.

Embodiment 10

Figure 49:
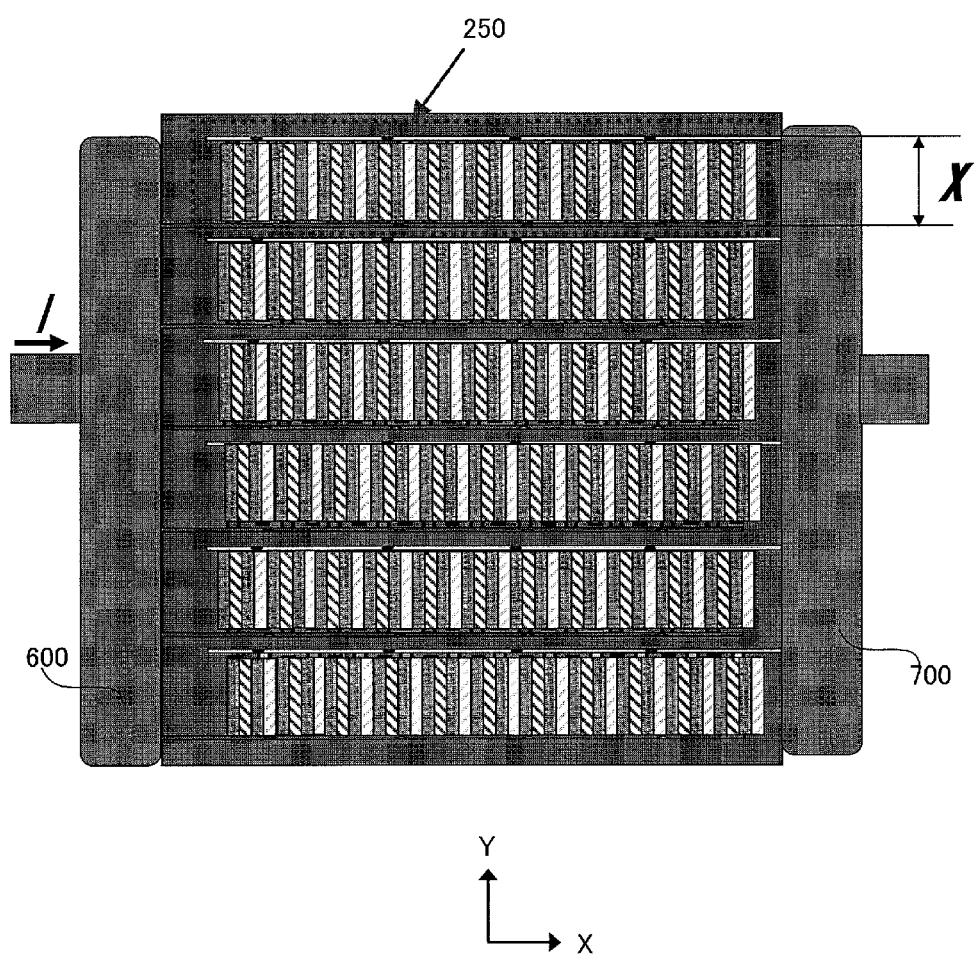
FIG. 49 A plan view illustrating a configuration for a secondary cell according to a tenth embodiment of the present disclosure.

FIG. 49 is a plan view illustrating an exemplary secondary cell in which a plurality of unit integrated bodies 250 are arranged on the same substrate. In FIG. 49, illustration of the top electrolytic layer is omitted.

If one set consists of "positive electrode, electrolytic, negative electrode and electrolytic layers" or "negative electrode, electrolytic, positive electrode and electrolytic layers", then 10000 or more sets are integrated together in a single unit integrated body 250 (surrounded with the dotted rectangle) in the secondary cell according to this embodiment. In FIG. 49, only six sets are illustrated vertically. Actually, however, 100 unit integrated bodies 250 are arranged. In that case, the width X of each unit integrated body 250 may be set to be several hundred μm, for example. If an amount of current I is supplied to this secondary cell, then an amount of current I/100 flows through each unit integrated body 250. If the width X is set to be several ten μm, for example, 500 or more sets (e.g., 10000 sets) of electrode pairs can be arranged on the same substrate.

Each of the multiple unit integrated bodies 250 is connected to the first and second lines 185 and 186. The first line 185 is extended to the left-hand side of FIG. 49 and connected to a positive electrode aggregate electrode 600. On the other hand, the second line 186 is extended to the right-hand side of FIG. 49 and connected to a negative electrode aggregate electrode 700.

In this embodiment, when viewed perpendicularly to the substrate, the positive electrode layer 37 and negative electrode layer 38 may have sizes of 0.5 µm×100 µm, for example.

Figure 50:
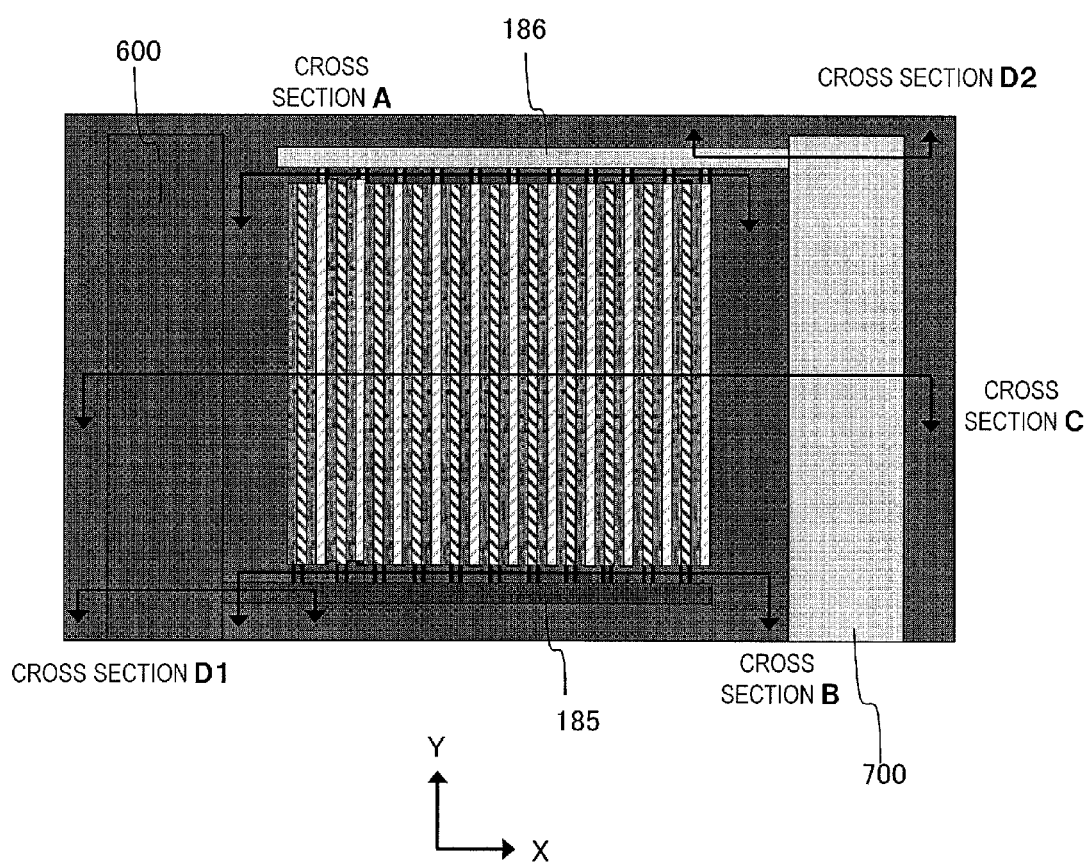
FIG. 50 A plan view illustrating an overall configuration for a secondary cell according to the tenth embodiment of the present disclosure.

FIG. 50 is a plan view illustrating a single unit integrated body 250 on a larger scale. As shown in FIG. 50, the configuration of the unit integrated body 250 including "positive electrode, electrolytic, negative electrode and electrolytic layers" may be the same as that of any of the embodiments described above.

Figure 51:
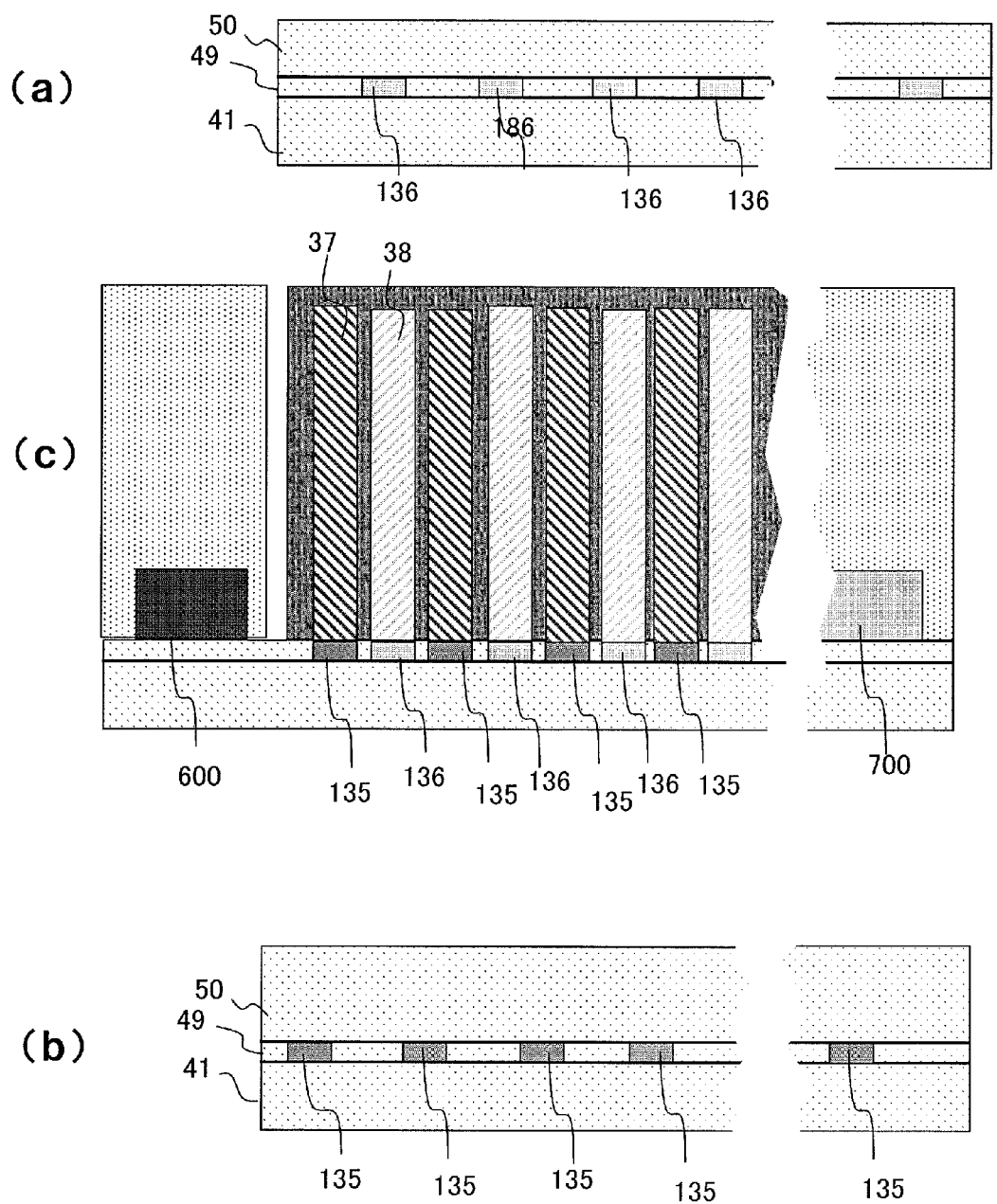
FIGS. 51 (a), (b) and (c) are partial cross-sectional views as viewed on the planes A, B, and C, respectively, shown in FIG. 50.

FIGS. 51(*a*), 51(*b*) and 51(*c*) are cross-sectional views as respectively viewed on the planes A, B and C shown in FIG. 50. As shown in FIG. 51(*c*), positive electrode and negative electrode current collector layers 135 and 136 have been formed under the positive electrode and negative electrode layers 37 and 38, respectively. Positive electrode and negative electrode aggregate electrodes 600 and 700 have been formed on the insulating film at both ends of the integrated body. Positive electrode and negative electrode extended lines are connected to the positive electrode and negative electrode aggregate electrodes, respectively. And these aggregate electrodes 600 and 700 are covered with an insulating layer.

FIGS. 52(*d*1) and 52(*d*2) are cross-sectional views showing a relation between the aggregate electrode 600 and the first line 185 and a relation between the aggregate electrode 700 and the second line 186, respectively. The surface of the aggregate electrodes 600 and 700 is covered with an insulating layer as described above. But the bottom of the aggregate electrodes 600 and 700 is in contact with the first and second lines 185 and 186 that function as extended lines.

Figure 53:
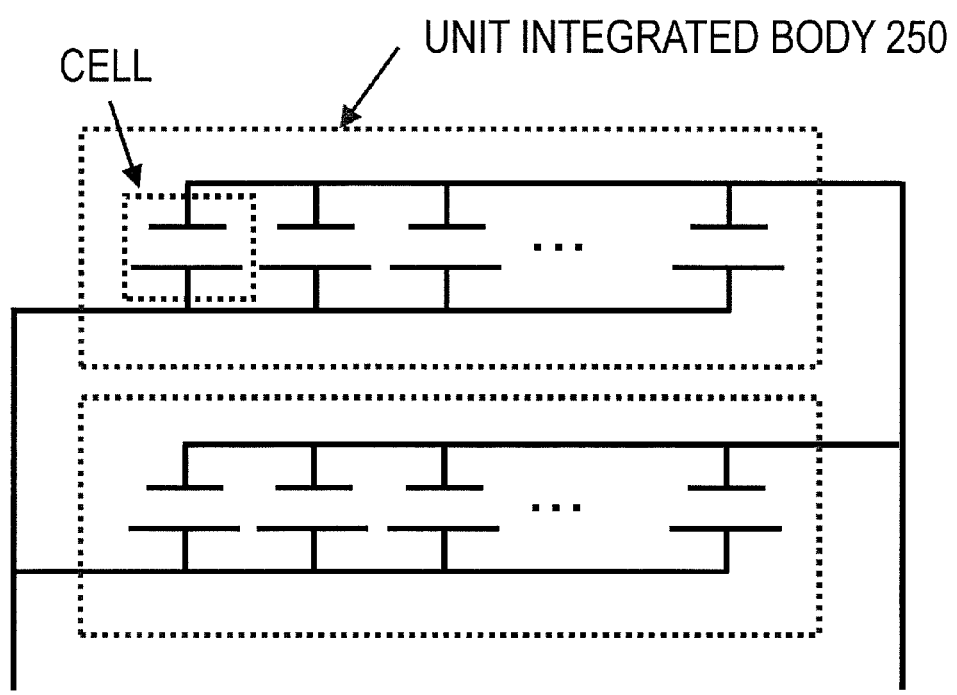
FIG. 53 An equivalent circuit diagram of the secondary cell shown in FIG. 50.

FIG. 53 is a circuit diagram of a secondary cell according to this embodiment.

Embodiment 11

Figure 54:
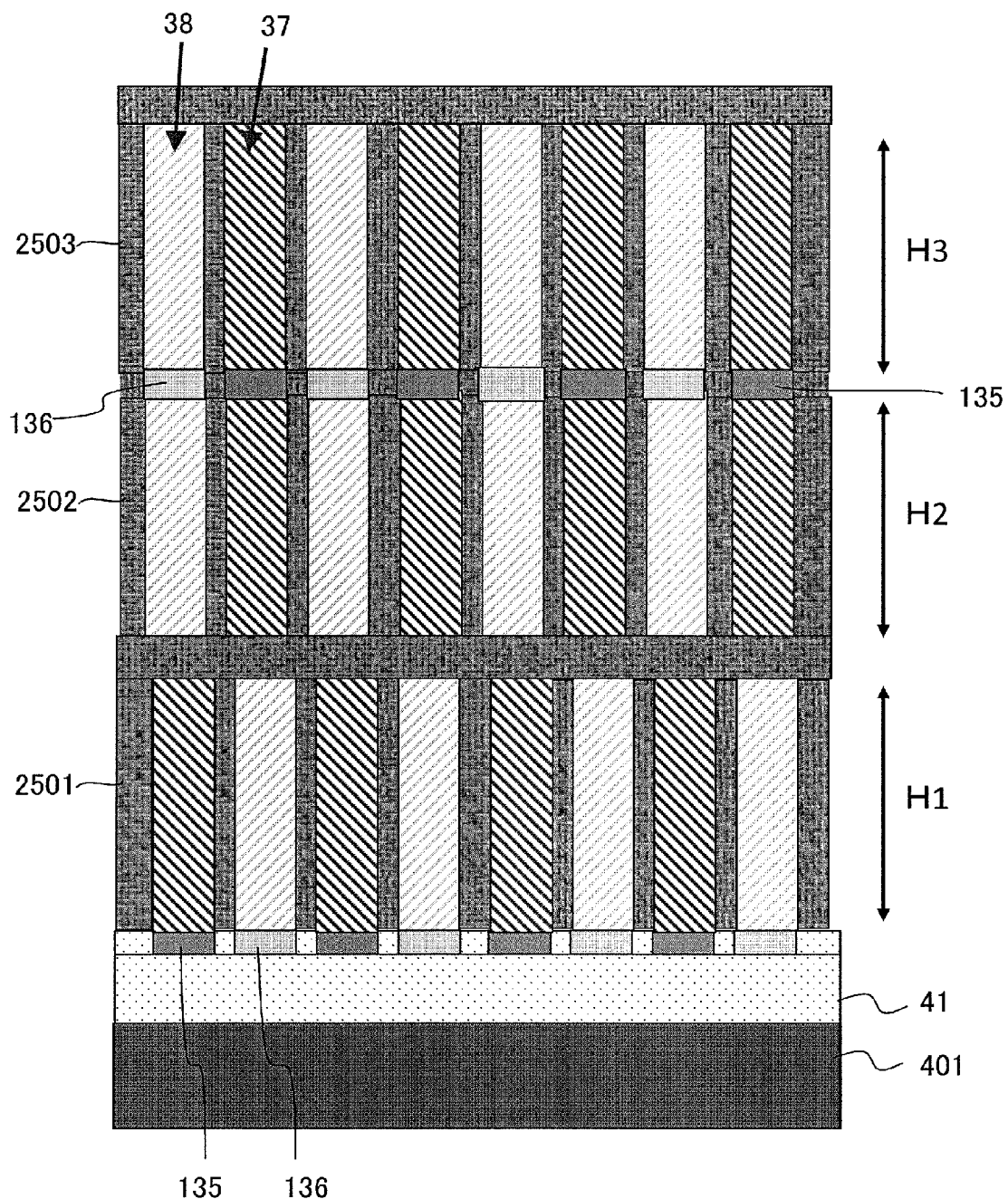
FIG. 54 A cross-sectional view illustrating an exemplary configuration for a secondary cell according to an eleventh embodiment of the present disclosure.

FIG. 54 schematically illustrates an exemplary cross-sectional structure for a secondary cell with a configuration in which multiple unit integrated bodies 2501, 2502 and 2503 are stacked one upon the other. By adopting such a configuration, the capacity of a secondary cell can be further increased. The number of the unit integrated bodies stacked may be determined according to the capacity required. The heights of these unit integrated bodies 2501, 2502 and 2503 are H1, H2 and H3, respectively, which do not have to be equal to each other. However, the respective positive electrode layers 37 of these unit integrated bodies 2501, 2502 and 2503 stacked need to be electrically connected together appropriately, so are their negative electrode layers 38. Even though a solid electrolyte is arranged between the vertically adjacent unit integrated bodies 2501 and 2502, no solid electrolytic layer is arranged between the respective electrodes (i.e., between the positive electrodes and between the negative electrodes) of the vertically adjacent unit integrated bodies 2502 and 2503. But current collectors 136 and 137 may be arranged there instead.

INDUSTRIAL APPLICABILITY

According to the present disclosure, a solar secondary cell as a combination of a solar cell and a secondary cell can be provided in a reduced size and can be fabricated more easily by a simplified process, too. Such a solar secondary cell can be used effectively as a photoelectric transducer.

REFERENCE SIGNS LIST 20 solar cell
21 first principal surface
22 second principal surface
23 semiconductor substrate
25, 25A, 25B, 25C first positive electrode terminal
26, 26A, 26B, 26C first negative electrode terminal
30 secondary cell (first secondary cell)
31, 51 electrolytic layer
33 counter surface
34 end face
35 second positive electrode terminal
36 second negative electrode terminal
37, 57, 371, 372, 373 positive electrode layer
38, 58, 381, 382, 383 negative electrode layer
40 interconnecting portion
41 interlayer dielectric film
42A, 42B series connecting portion
45 positive electrode connecting portion
46 negative electrode connecting portion
48 rectifying portion
50 second secondary cell
55 parallel connecting portion
75 positive electrode connecting portion
76 negative electrode connecting portion
80 series solar cell section
81A, 81B proximate portion
90 solar secondary cell module

The invention claimed is:

1. A secondary cell comprising:
an insulator with a first surface;
first and second interconnect patterns that are arranged on the first surface of the insulator; and
a plurality of periodic unit structures that are arranged in a first direction along the first surface, each of the plurality of periodic unit structures comprising:
a first electrode which projects away from the first surface and which is configured to either absorb or emit ions;
a second electrode which projects away from the first surface and which is configured to either absorb or emit the ions; and
a solid electrolyte which is interposed between the first and second electrodes and which conducts the ions,
the secondary cell comprising a structure in which the first electrode, the solid electrolyte and the second electrode are arranged in the first direction, and the first and second electrodes are electrically connected to the first and second interconnect patterns, respectively,
wherein each of the first and second electrodes has a flat plate shape, and the first and second electrodes stand vertically to the first surface of the insulator such that the first and second electrodes extend longer vertically to the first surface than laterally to the first surface when viewed along a direction perpendicular to the normal of the first surface and the first direction.

2. The secondary cell of claim 1, wherein the ratio of a size of the first and second electrodes as measured perpendicularly to the first surface to another size of the first and second electrodes as measured parallel to the first surface falls within the range of 100 to 1000.

3. The secondary cell of claim 1, wherein the number of the periodic unit structures is ten or more.

4. The secondary cell of claim 1, further comprising a substrate,
wherein the insulator is an insulating layer provided on the substrate.

5. The secondary cell of claim 1, wherein the insulator is an insulating film which has been formed over the plurality of periodic unit structures arranged so as to cover the interconnect patterns.

6. The secondary cell of claim 1, wherein each of the plurality of periodic unit structures includes a first layer which makes the first electrode, a second layer which is made of the solid electrolyte, and a third layer which makes the second electrode.

7. The secondary cell of claim 1, wherein the first interconnect pattern includes a plurality of first charge collectors, each of which is electrically in contact with the first electrode included in an associated one of the periodic unit structures, and wherein the second interconnect pattern includes a plurality of second charge collectors, each of which is electrically in contact with the second electrode included in an associated one of the periodic unit structures.

8. The secondary cell of claim 7, wherein the first and second electrodes include a metallic member which contacts with the first interconnect pattern and a metallic member which contacts with the second interconnect pattern, respectively.

9. The secondary cell of claim 7, wherein the plurality of first charge collectors and the plurality of second charge collectors are arranged alternately in the first direction, and wherein the first charge collectors are arranged so as to be aligned with the first electrodes, and wherein the second charge collectors are arranged so as to be aligned with the second electrodes.

10. The secondary cell of claim 7, wherein the first interconnect pattern includes a first line which electrically connects the plurality of first charge collectors together, and wherein the second interconnect pattern includes a second line which electrically connects the plurality of second charge collectors together.

11. The secondary cell of claim 10, wherein the first and second lines run in the first direction so as to define a space between themselves, and wherein when viewed along a normal to the first surface, the first and second electrodes included in each said periodic unit structure are located in the space between the first and second lines.

12. The secondary cell of claim 11, wherein when viewed along a normal to the first surface, the plurality of first charge collectors is extended from the first line to run in such a direction as to intersect with the first line and the plurality of second charge collectors is extended from the second line to run in such a direction as to intersect with the second line.

13. The secondary cell of claim 12, wherein the first interconnect pattern has a comb tooth pattern which is defined by the plurality of first charge collectors and the first line, and wherein the second interconnect pattern has a comb tooth pattern which is defined by the plurality of second charge collectors and the second line, and wherein the first and second interconnect patterns are configured so that the first and second charge collectors are arranged alternately.

14. The secondary cell of claim 4, wherein the distance from the principal surface of the substrate to the plurality of first charge collectors is equal to the distance from the principal surface to the first line, and the distance from the principal surface of the substrate to the plurality of second charge collectors is equal to the distance from the principal surface to the second line.

15. The secondary cell of claim 14, wherein the plurality of first charge collectors and the first line are made of the same material, and the plurality of second charge collectors and the second line are made of the same material.

16. The secondary cell of claim 15, comprising a lower line layer which is arranged between the principal surface of the substrate and the first surface of the insulating layer, wherein the first and second lines are connected to the lower line layer.

17. The secondary cell of claim 1, wherein a number of sets, in each of which the plurality of periodic unit structures are arranged in series, are arranged in parallel with each other.

18. The secondary cell of claim 1, wherein in the plurality of periodic unit structures, a layer of a solid electrolyte is further arranged opposite from the first and second interconnect patterns.

* * * * *